(12) United States Patent
Yamazaki et al.

(10) Patent No.: US 11,817,507 B2
(45) Date of Patent: Nov. 14, 2023

(54) SEMICONDUCTOR DEVICE AND METHOD FOR MANUFACTURING THE SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Tsutomu Murakawa, Kanagawa (JP); Hiroki Komagata, Kanagawa (JP); Katsuaki Tochibayashi, Kanagawa (JP); Kentaro Sugaya, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/667,655

(22) Filed: Feb. 9, 2022

(65) Prior Publication Data

US 2022/0271169 A1 Aug. 25, 2022

Related U.S. Application Data

(63) Continuation of application No. 16/766,425, filed as application No. PCT/IB2018/059379 on Nov. 28, 2018, now Pat. No. 11,257,959.

(30) Foreign Application Priority Data

Dec. 6, 2017 (JP) .............................. 2017-234007
Mar. 6, 2018 (JP) .............................. 2018-039420

(51) Int. Cl.
*H01L 29/786* (2006.01)

(52) U.S. Cl.
CPC .............................. *H01L 29/7869* (2013.01)

(58) Field of Classification Search
CPC .................................................. H01L 29/7869
(Continued)

(56) References Cited

U.S. PATENT DOCUMENTS 8,809,854 B2 8/2014 Isobe et al.
9,082,857 B2 7/2015 Yamazaki et al.
(Continued)

FOREIGN PATENT DOCUMENTS

DE 102014208859 11/2014
JP 2012-235106 A 11/2012
(Continued)

OTHER PUBLICATIONS

International Search Report (Application No. PCT/IB2018/059379) dated Mar. 5, 2019.
(Continued)

*Primary Examiner* — Monica D Harrison
(74) *Attorney, Agent, or Firm* — Fish & Richardson P.C.

(57) ABSTRACT

A semiconductor device having a high on-state current is provided.
The semiconductor device includes a first oxide; a first conductor and a second conductor provided over the first oxide to be separated from each other; and a second oxide provided over the first oxide and between the first conductor and the second conductor. Each of the first oxide and the second oxide has crystallinity, the first oxide includes a region where a c-axis is aligned substantially perpendicularly to a top surface of the first oxide, and the second oxide includes a region where the c-axis is aligned substantially perpendicularly to the top surface of the first oxide, a region where the c-axis is aligned substantially perpendicularly to a side surface of the first conductor, and a region where the c-axis is aligned substantially perpendicularly to a side surface of the second conductor.

8 Claims, 31 Drawing Sheets

(58) Field of Classification Search
USPC .......................................................... 257/43
See application file for complete search history.

(56) References Cited

U.S. PATENT DOCUMENTS

| | | | |
|---|---|---|---|
| 9,087,726 | B2 | 7/2015 | Sato et al. |
| 9,219,165 | B2 | 12/2015 | Sato et al. |
| 9,281,408 | B2 | 3/2016 | Yamazaki et al. |
| 9,431,547 | B2 | 8/2016 | Yamazaki et al. |
| 9,449,819 | B2 | 9/2016 | Sato et al. |
| 9,728,556 | B2 * | 8/2017 | Yamazaki ............ H01L 27/1225 |
| 9,812,583 | B2 | 11/2017 | Sato et al. |
| 9,837,552 | B2 | 12/2017 | Yamazaki et al. |
| 9,865,712 | B2 | 1/2018 | Okamoto et al. |
| 9,881,939 | B2 | 1/2018 | Takahashi et al. |
| 9,935,202 | B2 | 4/2018 | Yamazaki et al. |
| 10,128,384 | B2 | 11/2018 | Yamazaki et al. |
| 10,304,962 | B2 | 5/2019 | Akimoto et al. |
| 10,361,318 | B2 | 7/2019 | Sato et al. |
| 10,411,136 | B2 | 9/2019 | Yamazaki et al. |
| 10,446,671 | B2 | 10/2019 | Okamoto et al. |
| 10,886,413 | B2 | 1/2021 | Sato et al. |
| 2007/0108446 | A1 | 5/2007 | Akimoto |
| 2008/0099803 | A1 | 5/2008 | Li et al. |
| 2011/0193083 | A1 | 8/2011 | Kim et al. |
| 2012/0012847 | A1 | 1/2012 | Koyama et al. |
| 2014/0339560 | A1 | 11/2014 | Yamazaki et al. |
| 2016/0172500 | A1 | 6/2016 | Yamazaki et al. |
| 2016/0260822 | A1 | 9/2016 | Okamoto et al. |
| 2019/0378918 | A1 | 12/2019 | Okamoto et al. |
| 2020/0144425 | A1 | 5/2020 | Yamazaki et al. |
| 2021/0020785 | A1 | 1/2021 | Sato et al. |

FOREIGN PATENT DOCUMENTS

| | | |
|---|---|---|
| JP | 2015-005740 A | 1/2015 |
| JP | 2016-157937 A | 9/2016 |
| JP | 2016-167584 A | 9/2016 |
| KR | 2014-0136381 A | 11/2014 |
| TW | 201505161 | 2/2015 |
| TW | 201707215 | 2/2017 |
| TW | 201735355 | 10/2017 |
| WO | WO-2016/139548 | 9/2016 |

OTHER PUBLICATIONS

Written Opinion (Application No. PCT/IB2018/059379) dated Mar. 5, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

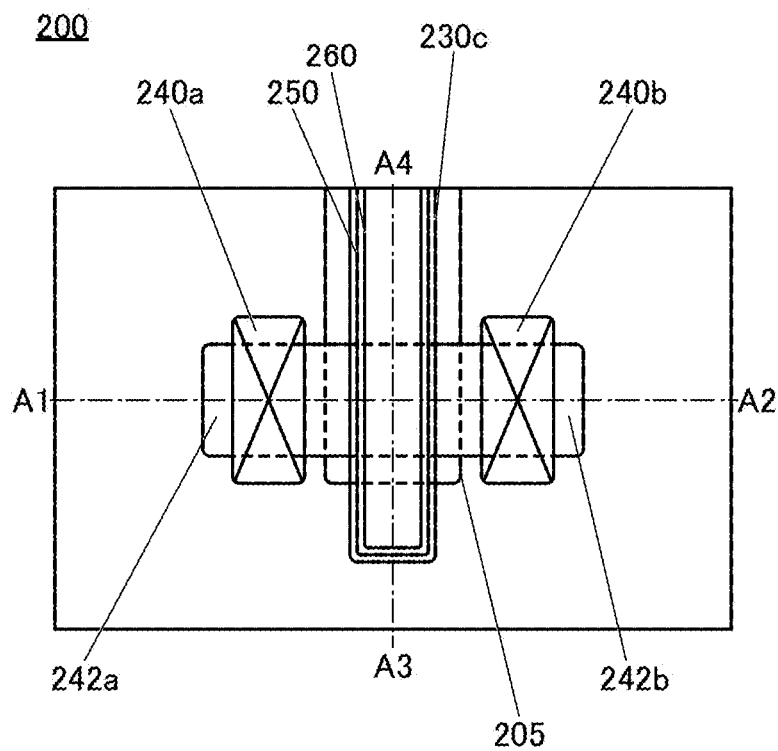
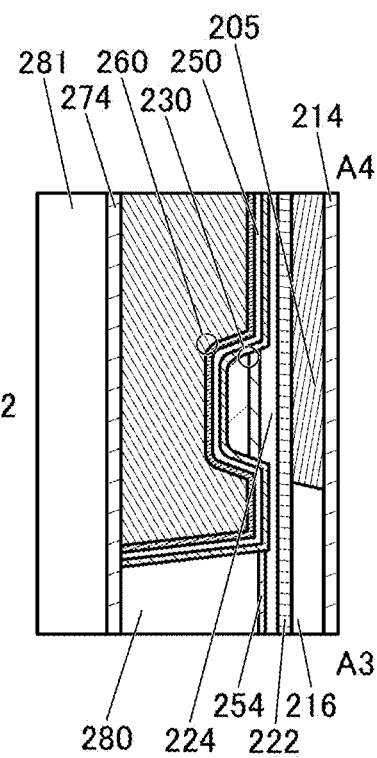
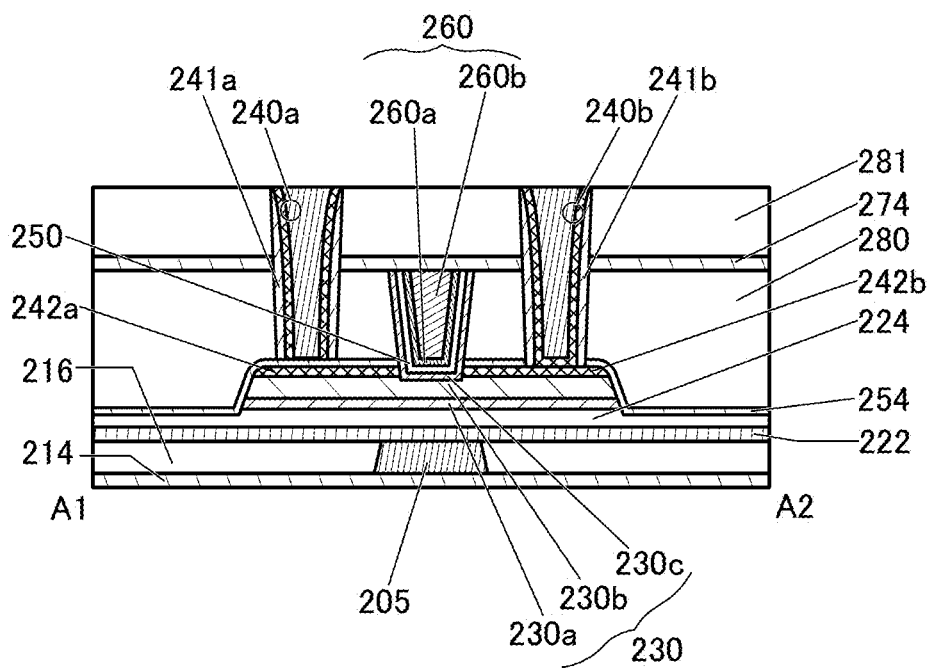

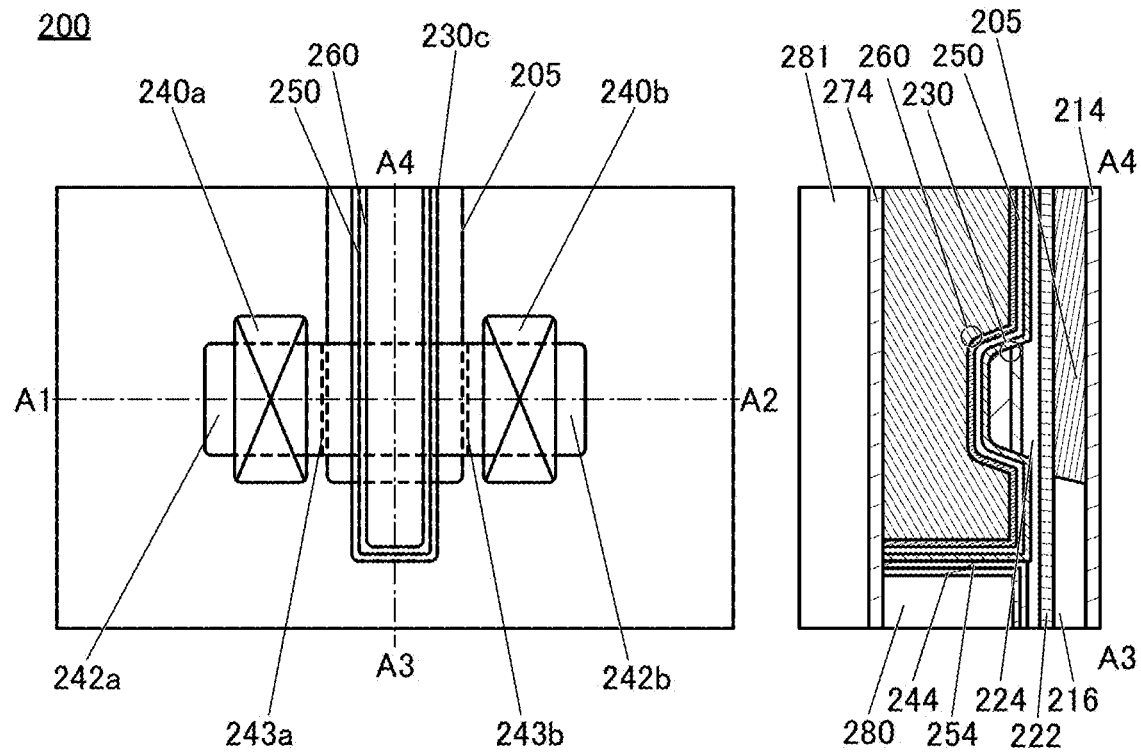
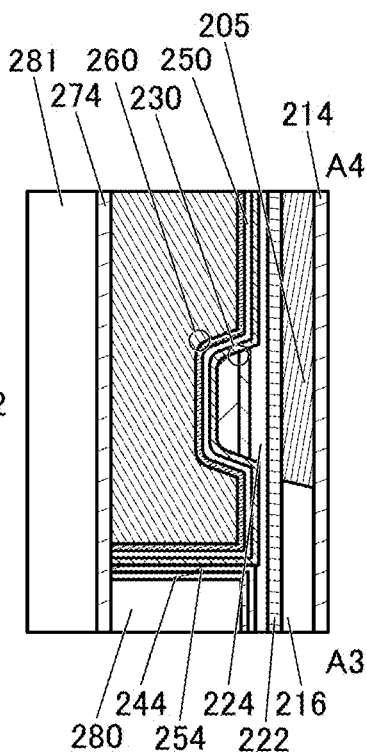
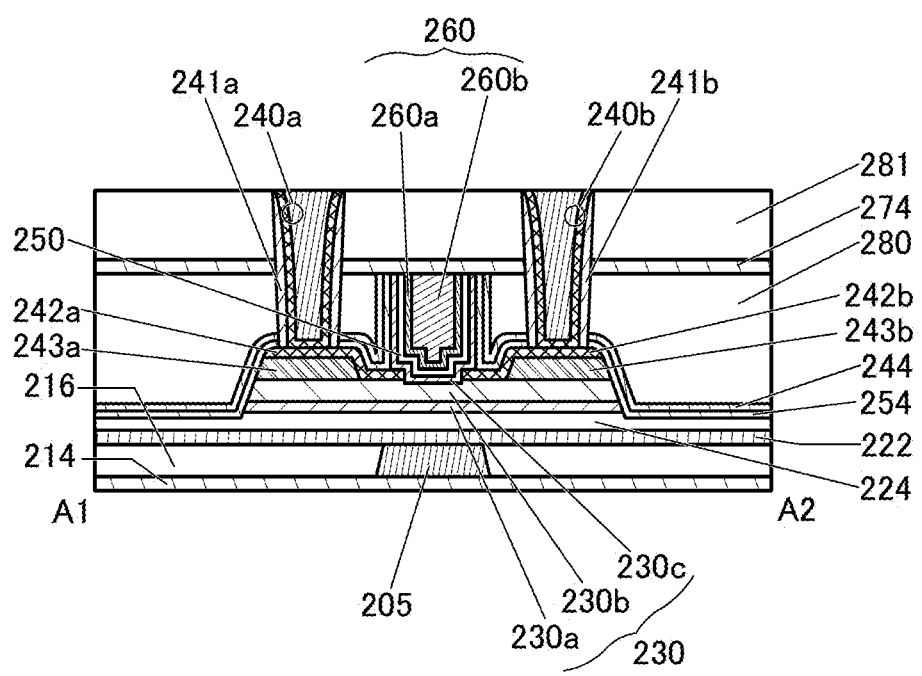

FIG. 26A
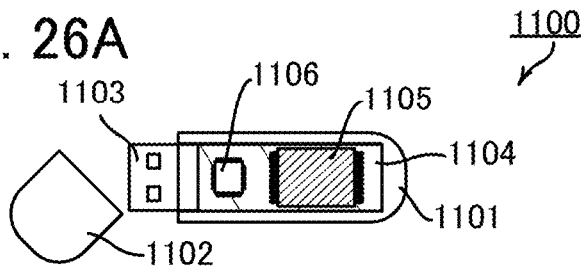
FIG. 26B  FIG. 26C
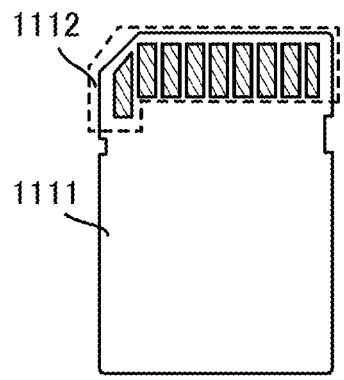 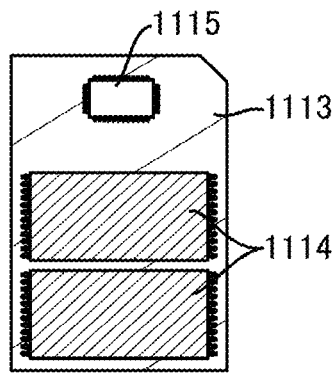
FIG. 26D  FIG. 26E
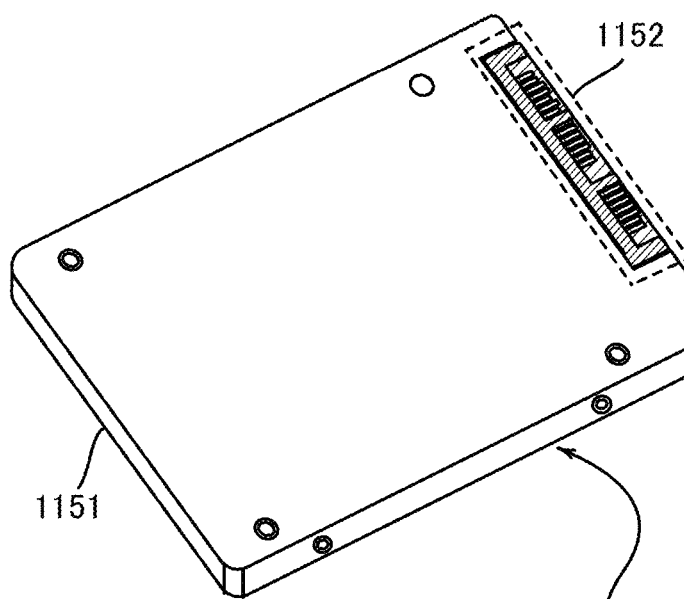 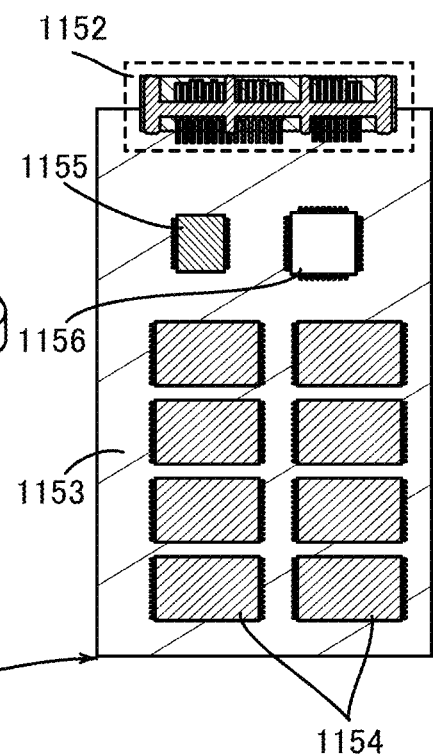

FIG. 27A
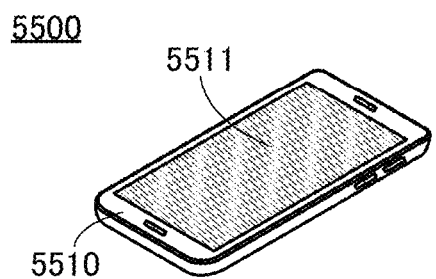
FIG. 27B
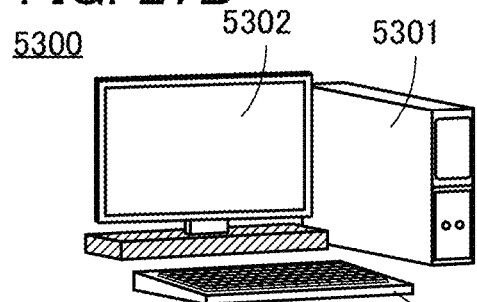
FIG. 27C
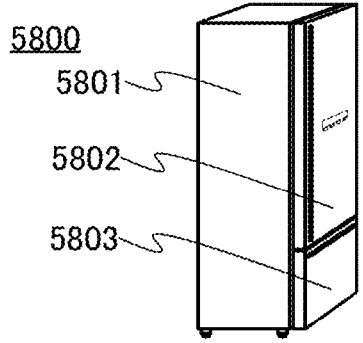
FIG. 27D
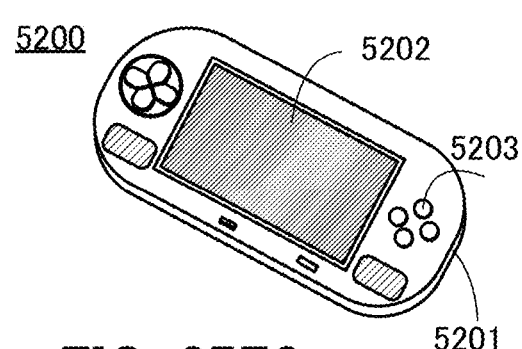
FIG. 27E1
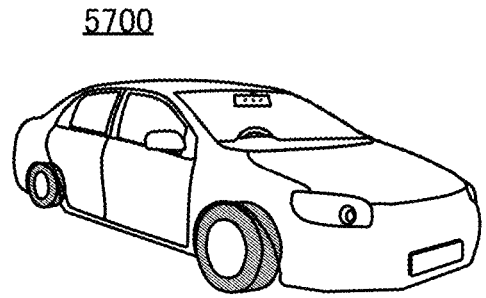
FIG. 27E2
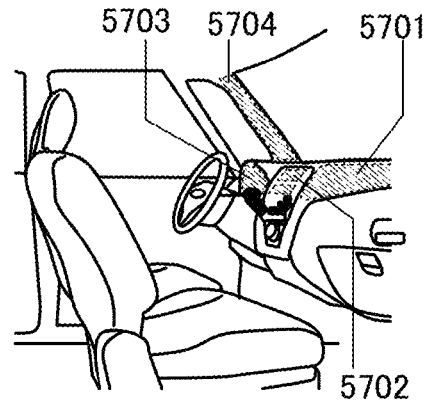
FIG. 27F
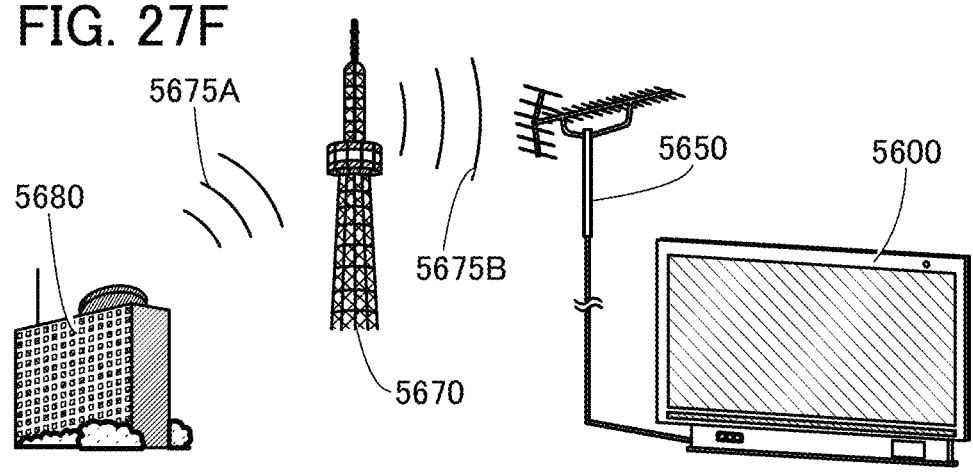

SEMICONDUCTOR DEVICE AND METHOD FOR MANUFACTURING THE SEMICONDUCTOR DEVICE

CROSS REFERENCE TO RELATED APPLICATIONS

This application is a continuation of U.S. application Ser. No. 16/766,425, filed May 22, 2020, now allowed, which is incorporated by reference and is a U.S. National Phase Application under 35 U.S.C. § 371 of International Application PCT/IB2018/059379, filed on Nov. 28, 2018, which is incorporated by reference and claims the benefit of foreign priority applications filed in Japan on Dec. 6, 2017, as Application No. 2017-234007 and on Mar. 6, 2018, as Application No. 2018-039420.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor using IGZO for an active layer has an extremely low off-state current (see Non-Patent Document 6), and an LSI and a display utilizing the characteristics have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Another object of one embodiment of the present invention is to provide a semiconductor device having high frequency characteristics. Another object of one embodiment of the present invention is to provide a semiconductor device with favorable reliability. Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device that can retain data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the descriptions of these objects do not disturb the existence of other objects. One embodiment of the present invention does not have to achieve all the objects.

Other objects will be apparent from and can be derived from the description of the specification, the drawings, the claims, and the like.

Means for Solving the Problems

One embodiment of the present invention is a semiconductor device including a first oxide; a first conductor and a second conductor provided over the first oxide to be separated from each other; and a second oxide provided over the first oxide and between the first conductor and the second conductor, in which each of the first oxide and the second oxide has crystallinity, the first oxide includes a region where a c-axis is aligned substantially perpendicularly to a top surface of the first oxide, and the second oxide includes a region where the c-axis is aligned substantially perpendicularly to the top surface of the first oxide, a region where the c-axis is aligned substantially perpendicularly to a side surface of the first conductor, and a region where the c-axis is aligned substantially perpendicularly to a side surface of the second conductor.

Another embodiment of the present invention is a semiconductor device including a first oxide; a first conductor and a second conductor provided over the first oxide to be separated from each other; a first insulator which is provided over the first conductor and the second conductor and in which an opening is formed to overlap with a region between the first conductor and the second conductor; a third conductor provided in the opening; a second insulator provided between the third conductor and the first oxide, the first conductor, the second conductor, and the first insulator; and a second oxide provided between the second insulator and the first oxide, the first conductor, the second conductor, and the first insulator, in which each of the first oxide and the second oxide has crystallinity, the first oxide includes a region where a c-axis is aligned substantially perpendicularly to a top surface of the first oxide, and the second oxide includes a region where the c-axis is aligned substantially perpendicularly to the top surface of the first oxide, a region where the c-axis is aligned substantially perpendicularly to a side surface of the first conductor, and a region where the c-axis is aligned substantially perpendicularly to a side surface of the second conductor.

In the above embodiment, a third insulator may be provided between the first insulator and the first oxide, the first conductor, the second conductor, and the second oxide, and the third insulator may have a lower oxygen permeability than the first insulator.

In the above embodiment, the third insulator may be provided between the first insulator and the first oxide, the first conductor, and the second conductor, the third insulator may have a lower oxygen permeability than the first insulator, and the second oxide may be in contact with the first insulator.

In the above embodiments, the third conductor may be provided between the first conductor and the first oxide, a fourth conductor may be provided between the second conductor and the first oxide, part of the first conductor may be in contact with the top surface of the first oxide, and part of the second conductor may be in contact with the top surface of the first oxide. In the above embodiment, the distance between the first conductor and the second conductor may be shorter than the length of the opening in the channel length direction.

In the above embodiments, the side surface of the first conductor may be substantially perpendicular to a bottom surface of the first conductor, and the side surface of the second conductor may be substantially perpendicular to a bottom surface of the second conductor.

In the above embodiments, the angle formed by the side surface of the first conductor and the bottom surface of the first conductor may be greater than or equal to 100 and less than or equal to 80°, and the angle formed by the side surface of the second conductor and the bottom surface of the second conductor may be greater than or equal to 100 and less than or equal to 80°.

In any of the above embodiments, the first oxide and the second oxide may contain In, an element M (M is Al, Ga, Y, or Sn), and Zn. Furthermore, in the above embodiment, the atomic ratio of In to the element M in the first oxide may be higher than the atomic ratio of In to the element M in the second oxide.

In the above embodiments, the c-axis in the first oxide aligned substantially perpendicularly to the top surface of the first oxide and the c-axis in the second oxide aligned substantially perpendicularly to the top surface of the first oxide may be substantially continuous.

In the above embodiment, a third oxide may be provided under the first oxide. In the above embodiment, the energy of the conduction band minimum of each of the second oxide and the third oxide may be higher than the energy of the conduction band minimum of the first oxide. In any of the above embodiments, the first oxide, the second oxide, and the third oxide may contain In, the element M (M is Al, Ga, Y, or Sn), and Zn. Furthermore, in the above embodiment, the atomic ratio of In to the element M in the first oxide may be higher than the atomic ratio of In to the element M in each of the second oxide and the third oxide.

Effect of the Invention

According to one embodiment of the present invention, a semiconductor device having a high on-state current can be provided. According to one embodiment of the present invention, a semiconductor device having high frequency characteristics can be provided. According to one embodiment of the present invention, a semiconductor device with favorable reliability can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with high productivity can be provided.

A semiconductor device that can retain data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIGS. 10A to 10C A top view and cross-sectional views of a semiconductor device of one embodiment of the present invention.

FIGS. 12A to 12C A top view and cross-sectional views of a semiconductor device of one embodiment of the present invention.

FIGS. 26A to 26E Schematic views of memory devices of one embodiment of the present invention.

FIGS. 27A, 27B, 27C, 27D, 27E1, 27E2, and 27F Diagrams illustrating electronic devices of one embodiment of the present invention.

MODE FOR CARRYING OUT THE INVENTION

Figure 1A:
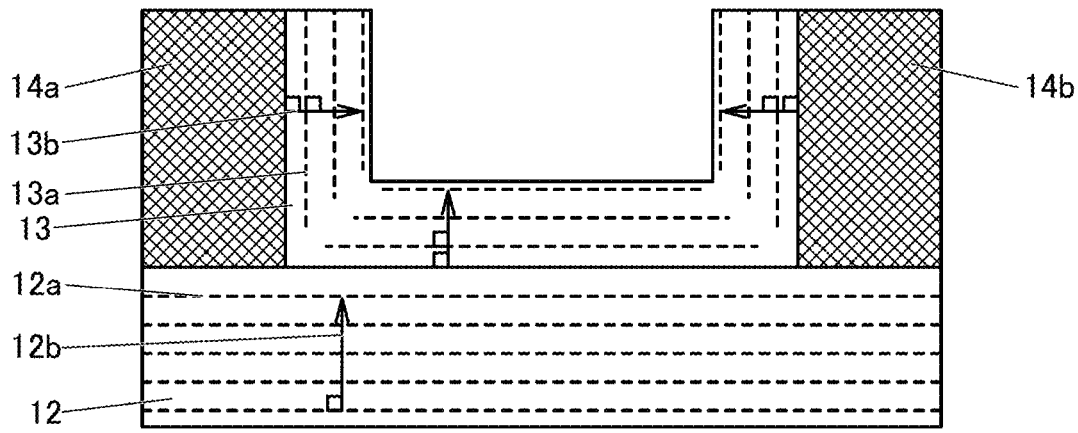
FIGS. 1A to 1C Cross-sectional views of semiconductor devices of embodiments of the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

Particularly in a top view (also referred to as a plan view), a perspective view, or the like, the description of some components might be omitted for easy understanding of the invention. Furthermore, the description of some hidden lines and the like might be omitted.

In this specification and the like, ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, the terms for explaining arrangement, such as "over" and "under", are used for convenience to describe the positional relation between components with reference to drawings. The positional relation between components is changed as appropriate in accordance with a direction in which the components are described. Thus, terms for the description are not limited to those used in this specification, and description can be made appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being described in the drawings or the texts.

Here, X and Y denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be used interchangeably in this specification and the like.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies may be formed by entry of impurities, for example. Furthermore, when the semiconductor is silicon, examples of an impurity that changes the characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with insulating film or insulating layer. Moreover, the term "conductor" can be replaced with conductive film or conductive layer. Furthermore, the term "semiconductor" can be replaced with semiconductor film or semiconductor layer.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. In addition, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting the transmission of oxygen and impurities such as water and hydrogen, and the barrier film having conductivity is sometimes referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is $1\times10^{-20}$ A or lower at room temperature, $1\times10^{-18}$ A or lower at 85° C., or $1\times10^{-16}$ A or lower at 125° C.

Embodiment 1

The structure and characteristics of a semiconductor device of one embodiment of the present invention will be described below.

FIG. 1(A) is a cross-sectional view of part of a transistor 10a of one embodiment of the present invention.

As illustrated in FIG. 1(A), the transistor 10a includes an oxide 12 provided over a substrate; a conductor 14a and a conductor 14b provided over the oxide 12 to be separated from each other; and an oxide 13 provided over the oxide 12 and between the conductor 14a and the conductor 14b. Here, each of the conductor 14a and the conductor 14b functions as a source electrode and a drain electrode of the transistor 10a. Although not illustrated, a gate insulator and a gate electrode of the transistor 10a are provided over the oxide 13 and between the conductor 14a and the conductor 14b.

The oxide 12 includes a channel formation region in a region between the conductor 14a and the conductor 14b and includes a source region and a drain region in the vicinity of a region overlapping with the conductor 14a (the conductor 14b) so that the channel formation region is sandwiched between the source region and the drain region. Note that the source region and/or the drain region may have a shape in which the source region and/or the drain region extends inward from the conductor 14a (the conductor 14b). Note that the channel formation region of the transistor 10a is formed not only in the oxide 12 but also in the vicinity of the interface between the oxide 12 and the oxide 13 and/or in the oxide 13, in some cases.

In the transistor 10a, a metal oxide functioning as an oxide semiconductor (hereinafter also referred to as an oxide semiconductor) is preferably used as the oxide 12 and the oxide 13. For example, a metal oxide having an energy gap of 2 eV or more, preferably 2.5 eV or more is preferably used as a metal oxide to be the oxide 12 and the oxide 13. The off-state current (leakage current) of a transistor including a metal oxide having a wide energy gap as described above is small. When such a transistor is used, a semiconductor device with low power consumption can be provided.

For the oxide 12 and the oxide 13, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 12 and the oxide 13, an In—Ga oxide or an In—Zn oxide may be used.

Here, the atomic ratio of In to the element M in the metal oxide used as the oxide 12 is preferably higher than the atomic ratio of In to the element M in the metal oxide used as the oxide 13. When the oxide 13 is provided over the oxide 12 as described above, impurities can be inhibited from being diffused into the oxide 12 from components formed above the oxide 13. Furthermore, when the oxide 12 and the oxide 13 contain a common element (as its main component) besides oxygen, the density of defect states at the interface between the oxide 12 and the oxide 13 can be low. In that case, a main carrier path is the oxide 12 or the vicinity thereof, for example, the interface between the oxide 12 and the oxide 13. Since the density of defect states at the interface between the oxide 12 and the oxide 13 can be low, the influence of interface scattering on carrier conduction is small, and a high on-state current can be obtained.

A transistor using an oxide semiconductor is likely to have its electrical characteristics changed when impurities and oxygen vacancies exist in a region of the oxide semiconductor where a channel is formed, which may affect the reliability. Moreover, if the region of the oxide semiconductor where a channel is formed includes oxygen vacancies, the transistor tends to have normally-on characteristics. Thus, oxygen vacancies in the region where a channel is formed are preferably reduced as much as possible. Thus, a transistor which has reduced variation in electrical characteristics, stable electrical characteristics, and improved reliability can be provided.

Each of the oxide 12 and the oxide 13 preferably has crystallinity. It is particularly preferable to use a CAAC-OS (c-axis aligned crystalline oxide semiconductor) for the oxide 12 and the oxide 13.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In, M, Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

Here, an example of a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle ($2\theta$) in the neighborhood of 31° in some cases. This peak is assigned to the (009) plane of the $InGaZnO_4$ crystal, which indicates that crystals in the CAAC-OS have c-axis alignment, and that the c-axes face a direction substantially perpendicular to the formation surface or the top surface.

Furthermore, an example of a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) appears in some cases. This diffraction pattern includes spots derived from the (009) plane of the $InGaZnO_4$ crystal. Thus, the electron diffraction also indicates that crystals included in the CAAC-OS have c-axis alignment, and that the c-axes face a direction substantially perpendicular to the formation surface or the top surface. Meanwhile, a ring-like diffraction pattern is shown when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

As described above, the oxide 12 includes a crystal region including a layer 12a of crystals that extend in the a-b plane direction and a c-axis 12b perpendicular to the a-b plane direction. Here, in the oxide 12, the c-axis 12b preferably faces a direction substantially perpendicular to a formation surface or a top surface of the oxide 12. Thus, as illustrated in FIG. 1, the oxide 12 includes a region where the c-axis 12b is aligned substantially perpendicularly to the top surface of the oxide 12.

Furthermore, the oxide 13 includes a crystal region including a layer 13a of crystals that extend in the a-b plane direction and a c-axis 13b perpendicular to the a-b plane direction. Here, in the oxide 13, the c-axis 13b preferably faces a direction substantially perpendicular to a formation surface or a top surface of the oxide 13. Thus, as illustrated in FIG. 1, the oxide 13 includes a region where the c-axis 13b is aligned substantially perpendicularly to the top surface of the oxide 12, a region where the c-axis 13b is aligned substantially perpendicularly to a side surface of the conductor 14a, and a region where the c-axis 13b is aligned substantially perpendicularly to a side surface of the conductor 14b.

Although described in detail later, the CAAC-OS has a property in which oxygen is likely to be transferred in the c-axis direction. Thus, when the oxide 13 includes the region where the c-axis 13b is aligned substantially perpendicularly to the side surface of the conductor 14a and the region where the c-axis 13b is aligned substantially perpendicularly to the side surface of the conductor 14b as described above, excess oxygen from an insulator provided over the oxide 13 and containing oxygen (e.g., a gate insulator) can be inhibited from being absorbed by the conductor 14a and the conductor 14b. Thus, oxidation of the vicinity of the side surfaces of the conductor 14a and the conductor 14b that face each other can be inhibited. Thus, the channel length of the transistor 10a can be prevented from being shorter than the distance in design of the conductor 14a and the conductor 14b; therefore, the on-state current, the S value, and the frequency characteristic can be prevented from being lower than the design values.

Here, the thickness of the oxide 13 is 2 nm or more, preferably 3 nm or more, further preferably 5 nm or more, for example. The thickness of the oxide 13 is increased as described above, so that the region where the c-axis 13b is aligned substantially perpendicularly to the side surface of the conductor 14a (the conductor 14b) can be formed.

When excess oxygen is supplied to an oxide semiconductor, for example, the structure of the excess oxygen in the oxide semiconductor may be changed by a stress such as a voltage or a high temperature. Thus, the transistor including the oxide semiconductor might have unstable electrical characteristics or lower reliability. However, the oxide 13 includes the region where the c-axis 13b is aligned substantially perpendicularly to the top surface of the oxide 12 as described above, whereby excess oxygen from an insulator provided over the oxide 13 and containing oxygen (e.g., a gate insulator) can be inhibited from being absorbed by the oxide 12. Thus, the transistor can have stable electrical characteristics and increased reliability.

The crystal structures of the oxide 12 and the oxide 13 can be confirmed by taking a cross-sectional TEM image, for example. In addition, a map obtained by overlapping data on the degree of crystallization and the alignment for each pixel in the cross-sectional TEM image with the cross-sectional TEM image (hereinafter referred to as a crystal orientation map) may be made to perform analysis.

The crystal orientation map can be made as follows. First, a region to be subjected to FFT (Fast Fourier Transform) using a pixel as a center (hereinafter referred to as a FFT window) is set for each pixel in the cross-sectional TEM image. The FFT window may be set in accordance with the resolution of the cross-sectional TEM image and the size of a target crystal to be observed as appropriate. For example, in the case of the CAAC-OS, the FFT window may have a circular shape with a diameter of approximately 1.5 nm on the scale of the cross-sectional TEM image.

Next, each FFT window is subjected to FFT processing to obtain a FFT image corresponding to each FFT window. In the FFT image, spots reflecting the crystal structure of the FFT window appear. That is, the intensity of the spots represents the degree of crystallization in the FFT window, and the arrangement of the spots represents the crystal orientation in the FFT window. For example, in the case of the cross-sectional TEM image of the CAAC-OS taken from the direction perpendicular to the c-axis, two spots having high intensity are observed in the FFT image in some cases. The intensity of the two spots represents the degree of crystallization of the CAAC-OS, and the angle of a line segment obtained by connecting the two spots represents the crystal orientation of the CAAC-OS.

Next, the pixel of the cross-sectional TEM image is colored in accordance with the angle of the spots of the FFT image. At this time, a pixel having a high spot intensity is colored with low transparency, and a pixel having a low spot intensity is colored with high transparency. In the crystal orientation map made in this manner, the cross-sectional TEM of a region where the degree of crystallization is low is seen as it is, and a color corresponding to the crystal orientation is seen in a region where the degree of crystallization is high.

Furthermore, as described above, the oxide 12 includes the region where the c-axis 12b is aligned substantially perpendicularly to the top surface of the oxide 12, whereby oxygen vacancies, impurities, or the like in the oxide can be reduced, and the on-state current, the S value, and the frequency characteristic of the transistor 10a can be improved. Here, the region where the c-axis 12b is aligned substantially perpendicularly to the top surface of the oxide 12 is formed at least in the channel formation region of the transistor 10a. That is, in a region in the vicinity of a source region or a drain region of the transistor 10a, i.e., in a region of the oxide 12 in the vicinity of the conductor 14a (the conductor 14b), the region where the c-axis 12b is aligned substantially perpendicularly to the top surface of the oxide 12 is not formed in some cases.

It is preferable to make the planarity of the formation surface of the oxide 12 favorable in order to provide such an oxide 12. For example, the average surface roughness (Ra) of the formation surface of the oxide 12 is less than or equal to 1 nm, preferably less than or equal to 0.5 nm, further preferably less than or equal to 0.3 nm.

Note that in this specification and the like, average surface roughness (Ra) is obtained by three-dimensional expansion of arithmetic mean surface roughness that is defined by JIS B 0601:2001 (ISO4287:1997) so as to be applied to a curved surface, and is represented by an average value of the absolute values of deviations from a reference surface to a specific surface. The average surface roughness (Ra) can be measured using an atomic force microscope (AFM).

Moreover, it is preferable that the c-axis 12b in the oxide 12 that is aligned substantially perpendicularly to the top surface of the oxide 12 and the c-axis 13b in the oxide 13 that is aligned substantially perpendicularly to the top surface of the oxide 12 be substantially continuous. Here, "the c-axis of the oxide 12 and the c-axis of the oxide 13 are substantially continuous" refers to a state in which a clear crystal grain boundary cannot be observed in a cross-sectional TEM image of a stacked film of the oxide 12 and the oxide 13, for example. By formation of such an oxide 12 and such an oxide 13, the density of defect states at the interface between the oxide 12 and the oxide 13 can be decreased, and thus the influence of interface scattering on carrier conduction becomes small, and a high on-state current can be obtained.

In order to provide the oxide 12 and the oxide 13 in this manner, it is preferable that the oxide 12 be deposited over the formation surface having high planarity and that the oxide 13 be deposited in a state where impurities and the like over the oxide 12 are removed as much as possible, as described above.

In the transistor 10a, the side surface of the conductor 14a is substantially perpendicular to a bottom surface of the conductor 14a, and the side surface of the conductor 14b is substantially perpendicular to a bottom surface of the conductor 14b. However, the present application is not limited thereto. As in a transistor 10b illustrated in FIG. 1(B), side surfaces of the conductor 14a and the conductor 14b that face each other may have a tapered shape. Here, an angle (θ) formed between the side surface of the conductor 14a and the bottom surface of the conductor 14a is greater than or equal to 100 and less than or equal to 80°, preferably greater than or equal to 300 and less than or equal to 60°. An angle (θ) formed between the side surface of the conductor 14b and the bottom surface of the conductor 14b is greater than or equal to 10° and less than or equal to 80°, preferably greater than or equal to 30° and less than or equal to 60°. Thus, an electric field of a gate electrode largely contributes also to the region of the oxide 12 in the vicinity of the conductor 14a and the conductor 14b, so that the on-state current, the S value, and the frequency characteristic of the transistor 10b can be improved.

Also in the case where the conductor 14a and the conductor 14b have a tapered shape as described above, as illustrated in FIG. 1(B), the oxide 13 includes the region where the c-axis 13b is aligned substantially perpendicularly to the side surface of the conductor 14a and the region where the c-axis 13b is aligned substantially perpendicularly to the side surface of the conductor 14b.

Figure 1B:
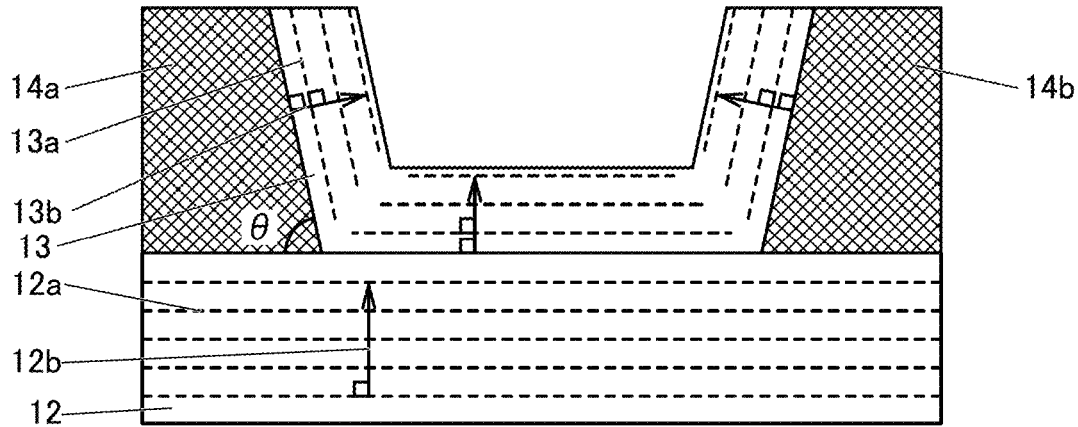
Figure 1C:
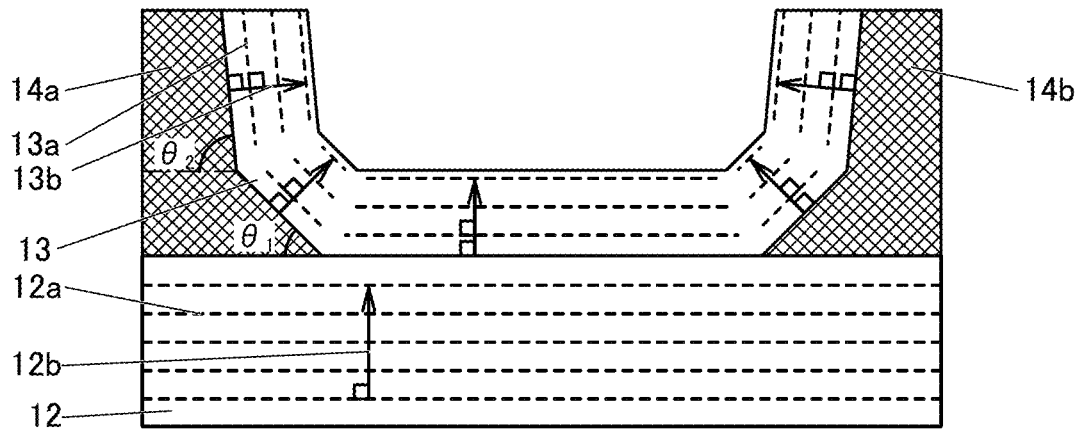

As in a transistor 10c illustrated in FIG. 1(C), side surfaces of the conductor 14a and the conductor 14b that face each other may have a plurality of surfaces. Angles ($θ_1$, $θ_2$) formed by the plurality of surfaces and the bottom surface of the conductor 14a (the conductor 14b) are different from each other. The oxide 13 includes a region where the c-axis 13b is aligned substantially perpendicularly to each of the plurality of surfaces. Note that although the side surface of the conductor 14a (the conductor 14b) has only the surface where the angle formed by the side surface and the bottom surface is $θ_1$ and the surface where the angle formed by the side surface and the bottom surface is $θ_2$ in FIG. 1(C), the semiconductor device in this embodiment is not limited to this, and the side surface of the conductor 14a (the conductor 14b) may have more surfaces.

According to one embodiment of the present invention, a semiconductor device having a high on-state current can be provided. According to one embodiment of the present invention, a semiconductor device having high frequency characteristics can be provided. According to one embodiment of the present invention, a semiconductor device with favorable reliability can be provided. According to one embodiment of the present invention, a semiconductor device having favorable electrical characteristics can be provided. According to one embodiment of the present invention, a semiconductor device having a low off-state current can be provided. According to one embodiment of the present invention, a semiconductor device with low power consumption can be provided.

<Movement of Oxygen in In—Ga—Zn Oxide>

A relationship between crystallinity and oxygen permeability in the case where the oxide 13 is an In—Ga—Zn oxide is described below.

An energy barrier due to movement of excess oxygen (oxygen) in a crystal of an In—Ga—Zn oxide is obtained by calculation. In the calculation, plane-wave basis first-principles calculation software VASP (Vienna ab-initio simulation package) based on density functional theory is used. Note that GGA-PBE is used as a functional. Cut-off energy of a plane wave is 400 eV. The effect of an inner shell electron is included by a PAW (Projector Augmented Wave) method.

Figure 2:
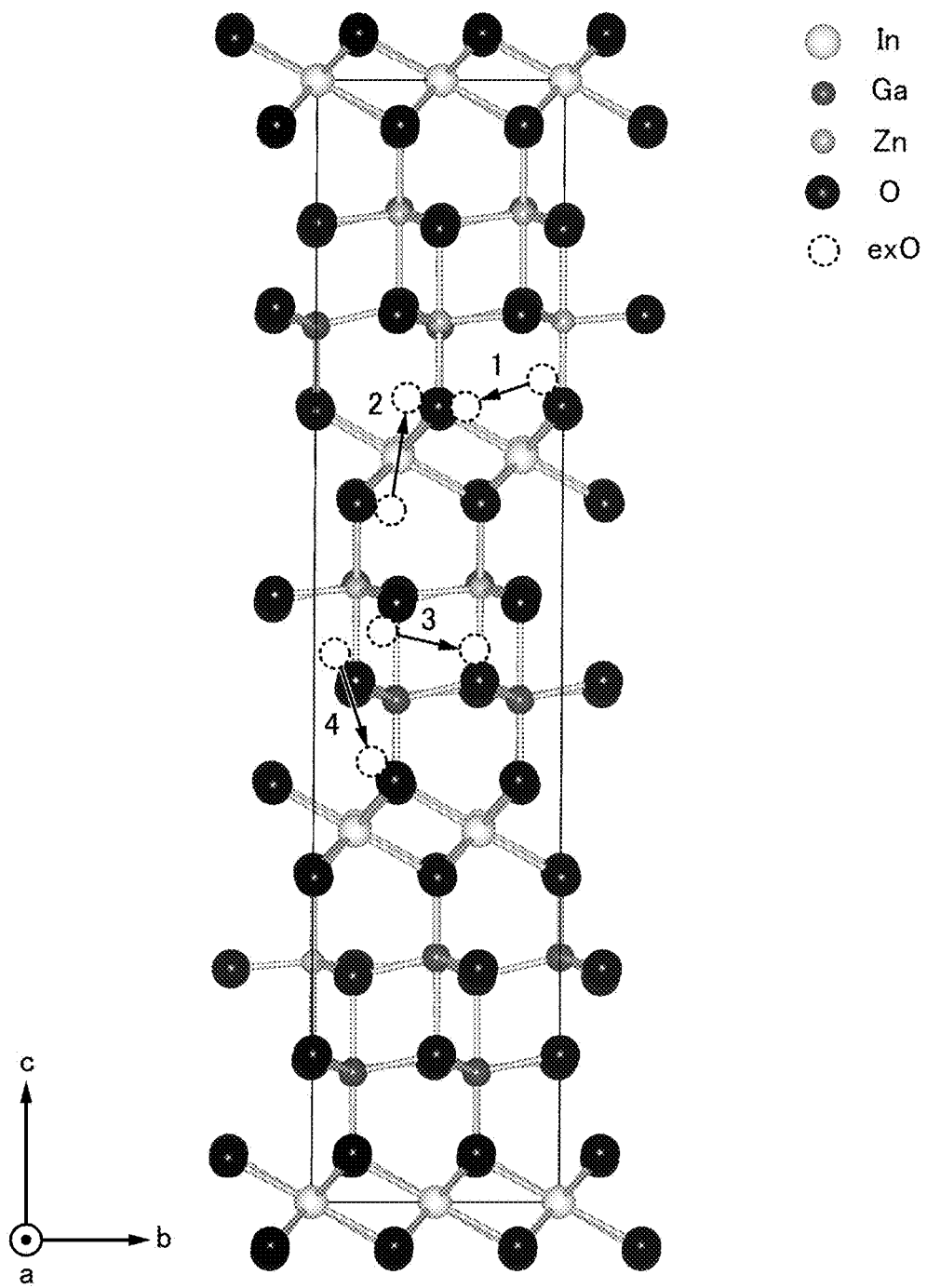
FIG. 2 A diagram illustrating a movement path of oxygen in an In—Ga—Zn oxide.

Here, the ease of movement of excess oxygen (oxygen) through a movement path 1, a movement path 2, a movement path 3, and a movement path 4 in a crystal of an In—Ga—Zn oxide illustrated in FIG. 2 is calculated. Note that the a-axis, the b-axis, and the c-axis in FIG. 2 correspond to a crystal structure of an In—Ga—Zn oxide.

Note that the movement path 1 is a path through which excess oxygen (oxygen) bonded to oxygen bonded to three indium atoms and one zinc atom is bonded to adjacent oxygen bonded to three indium atoms and one zinc atom. The movement path 2 is a path through which excess oxygen (oxygen) bonded to oxygen bonded to three indium atoms and one gallium atom crosses a layer containing indium and oxygen and is bonded to adjacent oxygen bonded to three indium atoms and one zinc atom. The movement path 3 is a path through which excess oxygen (oxygen) bonded to oxygen bonded to two gallium atoms and one zinc atom is bonded to adjacent oxygen bonded to two zinc atoms and one gallium atom. The movement path 4 is a path through which excess oxygen (oxygen) bonded to oxygen bonded to two gallium atoms and one zinc atom crosses a layer containing gallium, zinc, and oxygen and is bonded to adjacent oxygen bonded to three indium atoms and one gallium atom.

When the frequency of going over an energy barrier $E_a$ of diffusion per unit time is referred to as a diffusion frequency R, R can be expressed as the following formula.

$$R = v \cdot \exp[-E_a/(k_B T)]$$

Note that v represents the number of heat vibrations of diffusion atoms, $k_B$ represents Boltzmann constant, and T represents the absolute temperature. The diffusion frequency R at 350° C. and 450° C. when $10^{13}$ [1/sec] is applied to v as Debye frequency is shown in Table 1.

TABLE 1

|  | Energy barrier [eV] | Diffusion frequency R [1/sec] | |
| --- | --- | --- | --- |
|  |  | 350° C. | 450° C. |
| Movement path 1 | 0.50 | $9.0 \times 10^8$ | $3.3 \times 10^9$ |
| Movement path 2 | 1.97 | $1.2 \times 10^{-3}$ | $1.9 \times 10^{-1}$ |
| Movement path 3 | 0.53 | $5.2 \times 10^8$ | $2.0 \times 10^9$ |
| Movement path 4 | 0.56 | $3.0 \times 10^8$ | $1.3 \times 10^9$ |

As shown in Table 1, it is found that the movement path 2 across the layer containing indium and oxygen has a higher energy barrier than the other movement paths. This indicates that movement of excess oxygen (oxygen) in the c-axis direction is less likely to occur in a crystal of an In—Ga—Zn oxide. In other words, in the case where crystals have c-axis alignment and the c-axes are aligned in a direction substantially perpendicular to a formation surface or a top surface, like CAAC-OS, movement of excess oxygen (oxygen) is less likely to occur in the direction substantially perpendicular to the formation surface or the top surface.

The structure, method, and the like described above in this embodiment can be used in combination as appropriate with the structures, methods, and the like described in the other embodiments.

Embodiment 2

Specific structure examples of the semiconductor device described in the above embodiment will be described below with reference to FIG. 3 to FIG. 20.

<Structure Example of Semiconductor Device>

Figure 3A:
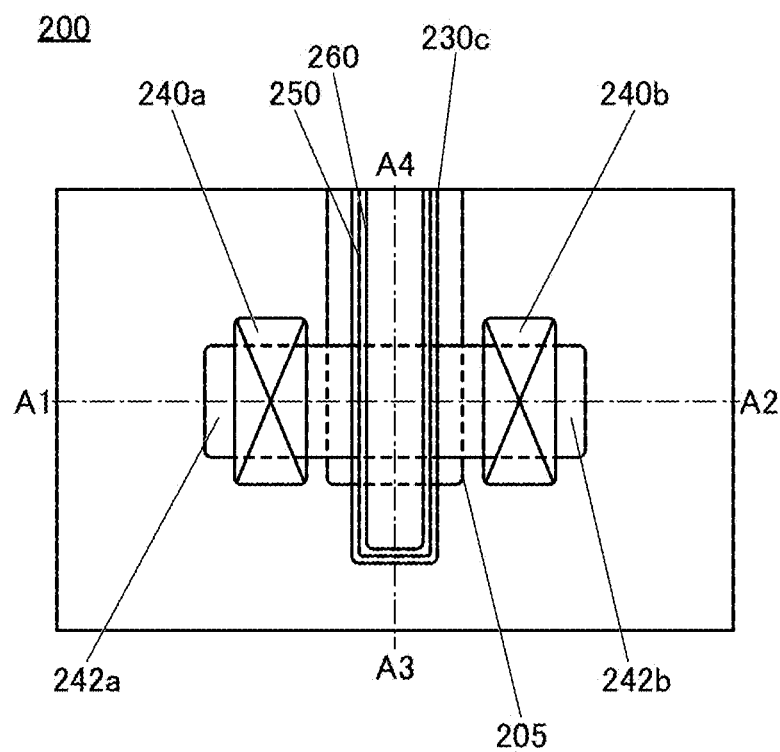
FIGS. 3A to 3C A top view and cross-sectional views of a semiconductor device of one embodiment of the present invention.
Figure 3C:
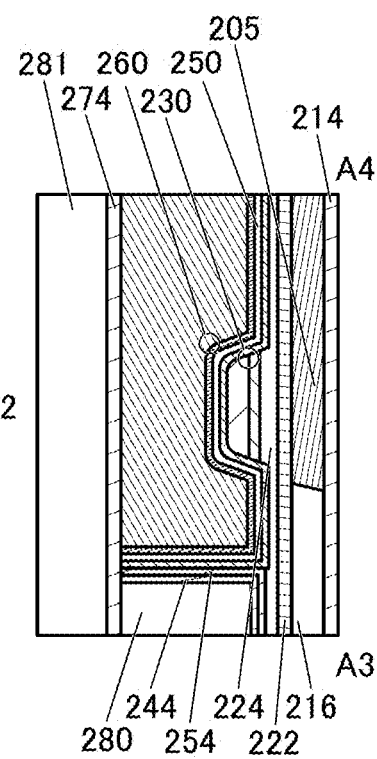
Figure 3B:
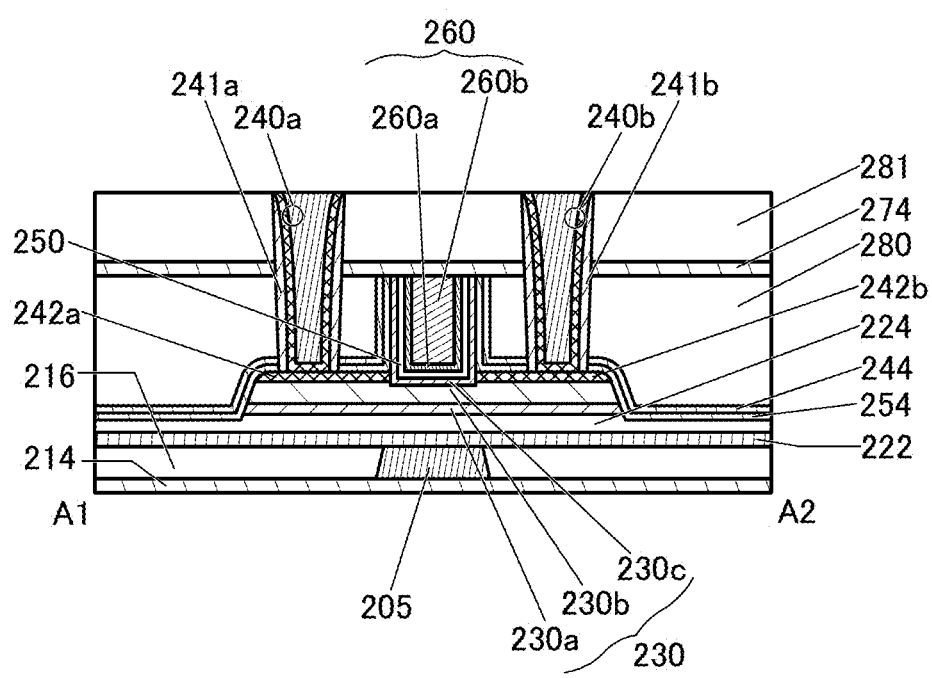

FIG. 3(A), FIG. 3(B), and FIG. 3(C) are a top view and cross-sectional views of a transistor 200 of one embodiment of the present invention and a periphery of the transistor 200.

FIG. 3(A) is a top view of a semiconductor device including the transistor 200. FIG. 3(B) and FIG. 3(C) are cross-sectional views of the semiconductor device. Here, FIG. 3(B) is a cross-sectional view of a portion indicated by a dashed-dotted line A1-A2 in FIG. 3(A), and is a cross-sectional view in the channel length direction of the transistor 200. FIG. 3(C) is a cross-sectional view of a portion indicated by a dashed-dotted line A3-A4 in FIG. 3(A), and is a cross-sectional view in the channel width direction of the transistor 200. For clarity of the drawing, some components are not illustrated in the top view of FIG. 3(A).

[Transistor 200]

As illustrated in FIG. 3, the transistor 200 includes an oxide 230a provided over a substrate (not illustrated); an oxide 230b provided over the oxide 230a; a conductor 242a and a conductor 242b provided over the oxide 230b to be apart from each other; an insulator 280 which is provided over the conductor 242a and the conductor 242b and in which an opening is formed to overlap a region between the conductor 242a and the conductor 242b; a conductor 260 provided in the opening; an insulator 250 provided between the conductor 260 and the oxide 230b, the conductor 242a, the conductor 242b, and the insulator 280; and an oxide 230c provided between the insulator 250 and the oxide 230b, the conductor 242a, the conductor 242b, and the insulator 280. Here, as illustrated in FIGS. 3(B) and 3(C), it is preferable that a top surface of the conductor 260 be substantially aligned with the top surfaces of the insulator 250, an insulator 254, an insulator 244, the oxide 230c, and the insulator 280. Hereinafter, the oxide 230a, the oxide 230b, and the oxide 230c may be collectively referred to as an oxide 230. The conductor 242a and the conductor 242b may be collectively referred to as a conductor 242.

Here, the oxide 230b corresponds to the oxide 12 of the transistor 10a in the above embodiment. The oxide 230c corresponds to the oxide 13 of the transistor 10a in the above embodiment. The conductor 242a and the conductor 242b correspond to the conductor 14a and the conductor 14b of the transistor 10a in the above embodiment, respectively.

In the transistor 200 illustrated in FIG. 3, the side surfaces of the conductor 242a and the conductor 242b on the conductor 260 side have a substantially perpendicular shape, as in the transistor 10a illustrated in FIG. 1(A). Note that the transistor 200 illustrated in FIG. 3 is not limited thereto, and as in the transistor 10b illustrated in FIG. 1(B), angles formed by side surfaces and bottom surfaces of the conductor 242a and the conductor 242b may be greater than or equal to 100 and less than or equal to 80°, preferably greater than or equal to 30° and less than or equal to 60°. As in the transistor 10c illustrated in FIG. 1(C), the side surfaces of the conductor 242a and the conductor 242b that face each other may have a plurality of surfaces.

As illustrated in FIG. 3, it is preferable that the insulator 244 and the insulator 254 be provided between the insulator 280 and the insulator 224, the oxide 230a, the oxide 230b, the conductor 242a, the conductor 242b, and the oxide 230c. Here, as illustrated in FIGS. 3(B) and 3(C), the insulator 254 is preferably in contact with the side surfaces of the oxide 230c, the top surface and a side surface of the conductor 242a, the top surface and a side surface of the conductor 242b, the side surfaces of the oxide 230a and the oxide 230b, and a top surface of the insulator 224. The insulator 244 is preferably provided in contact with a top surface of the insulator 254.

The transistor 200 has, in the region where a channel is formed (hereinafter also referred to as a channel formation region) and its vicinity, a structure in which three layers of the oxide 230a, the oxide 230b, and the oxide 230c are stacked; however, the present invention is not limited thereto. For example, a two-layer structure of the oxide 230b and the oxide 230c or a stacked-layer structure of four or more layers may be provided. Each of the oxide 230a, the oxide 230b, and the oxide 230c may have a stacked-layer structure of two or more layers.

For example, when the oxide 230c has a stacked-layer structure including a first oxide and a second oxide over the first oxide, the first oxide may have a composition similar to that of the oxide 230b and the second oxide may have a composition similar to that of the oxide 230a.

Although the conductor 260 is shown to have a stacked-layer structure of two layers in the transistor 200, the present invention is not limited thereto. For example, the conductor 260 may have a single-layer structure or a stacked-layer structure of three or more layers.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, in the transistor 200, the gate electrode can be positioned between the source electrode and the drain electrode in a self-aligned manner. Therefore, the conductor 260 can be formed without an alignment margin, resulting in a reduction in the area occupied by the transistor 200. Accordingly, miniaturization and high integration of the semiconductor device can be achieved.

In addition, as illustrated in FIG. 3, the conductor 260 preferably includes a conductor 260a provided inside the insulator 250 and a conductor 260b embedded inside the conductor 260a.

The transistor 200 preferably further includes an insulator 214 provided over the substrate (not illustrated); an insulator 216 provided over the insulator 214; a conductor 205 provided to be embedded in the insulator 216; an insulator 222 provided over the insulator 216 and the conductor 205; and the insulator 224 provided over the insulator 222. The oxide 230a is preferably provided over the insulator 224.

An insulator 274 and an insulator 281 functioning as interlayer films are preferably provided over the transistor 200. Here, the insulator 274 is preferably provided in contact with the top surfaces of the conductor 260, the insulator 250, the insulator 254, the insulator 244, the oxide 230c, and the insulator 280.

It is preferable that the insulator 222, the insulator 254, the insulator 244, and the insulator 274 have a function of inhibiting diffusion of at least one of hydrogen (e.g., a hydrogen atom, a hydrogen molecule, and the like). For example, the insulator 222, the insulator 254, the insulator 244, and the insulator 274 preferably have a lower hydrogen permeability than the insulator 224, the insulator 250, and the insulator 280. Here, it is preferable that the insulator 222, the insulator 254, the insulator 244, and the insulator 274 have a function of inhibiting diffusion of oxygen (e.g., at least one of an oxygen atom, an oxygen molecule, and the like). For example, the insulator 222, the insulator 254, the insulator 244, and the insulator 274 preferably have a lower oxygen permeability than the insulator 224, the insulator 250, and the insulator 280.

Here, the insulator 224, the oxide 230, and the insulator 250 are separated from the insulator 280 and the insulator 281 by the insulator 254, the insulator 244, and the insulator 274. Therefore, impurities such as hydrogen contained in the insulator 280 and the insulator 281 and excess oxygen can be inhibited from entering the insulator 224, the oxide 230, and the insulator 250.

Furthermore, it is preferable to provide a conductor 240 (a conductor 240a and a conductor 240b) functioning as a plug and being electrically connected to the transistor 200. Note that an insulator 241 (an insulator 241a and an insulator 241b) is provided in contact with a side surface of the conductor 240 functioning as a plug. In other words, the insulator 241 is provided in contact with an inner wall of an opening in the insulator 254, the insulator 244, the insulator 280, the insulator 274, and the insulator 281. Alternatively, a first conductor of the conductor 240 may be provided in contact with the side surface of the insulator 241 and a second conductor of the conductor 240 may be provided further inside. Here, a top surface of the conductor 240 and a top surface of the insulator 281 can be substantially level with each other. Although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, the layers may be distinguished by ordinal numbers corresponding to the formation order.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used. The transistor 200 using an oxide semiconductor in its channel formation region has an extremely low leakage current (off-state current) in a non-conduction state; thus, a semiconductor device with low power consumption can be provided.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide or an In—Zn oxide may be used.

As described above, the oxide 230b corresponds to the oxide 12, and the oxide 230c corresponds to the oxide 13. Accordingly, the oxide 230b includes a region where the c-axis is aligned substantially perpendicularly to a top surface of the oxide 230b. The oxide 230c includes the region where the c-axis is aligned substantially perpendicularly to the top surface of the oxide 230b, a region where the c-axis is aligned substantially perpendicularly to the side surface of the conductor 242a, and a region where the c-axis is aligned substantially perpendicularly to the side surface of the conductor 242b. Thus, as in the transistor 10a described above, the on-state current, the S value, and the frequency characteristic of the transistor 200 can be improved. In addition, like the transistor 10a described above, the transistor 200 can have stable electrical characteristics and increased reliability.

As illustrated in FIG. 3(B), the oxide 230b may have a smaller thickness in a region that does not overlap with the conductor 242 than in a region that overlaps with the conductor 242. This is formed when part of the top surface of the oxide 230b is removed at the time of forming the conductor 242a and the conductor 242b. When a conductive film to be the conductor 242 is deposited, a low-resistance region may be formed on the top surface of the oxide 230b in the vicinity of the interface with the conductive film. Removing the low-resistance region positioned between the conductor 242a and the conductor 242b on the top surface of the oxide 230b in the above manner can prevent formation of the channel in the region.

Accordingly, a semiconductor device including a transistor having a high on-state current can be provided. A semiconductor device including a transistor having high frequency characteristics can be provided. A semiconductor device which has reduced variation in electrical characteristics, stable electrical characteristics, and improved reliability can be provided. A semiconductor device including a transistor having a low off-state current can be provided.

The structure of the semiconductor device including the transistor 200 of one embodiment of the present invention will be described in detail below.

The conductor 205 is provided to overlap with the oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This can achieve favorable planarity of the insulator 224 formed over the conductor 205 and increase the crystallinity of the oxide 230b and the oxide 230c.

Here, the conductor 260 sometimes functions as a first gate (also referred to as top gate) electrode. The conductor 205 sometimes functions as a second gate (also referred to as bottom gate) electrode. In that case, the $V_{th}$ of the transistor 200 can be controlled by changing a potential applied to the conductor 205 independently of a potential applied to the conductor 260. In particular, the $V_{th}$ of the transistor 200 can be higher than 0 V and the off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

The conductor 205 is preferably larger than the channel formation region of the oxide 230. As illustrated in FIG. 3(C), it is particularly preferable that the conductor 205 extend to a region outside an end portion of the oxide 230 that intersects with the channel width direction. That is, the conductor 205 and the conductor 260 preferably overlap with each other with the insulator therebetween on an outer side of the side surface of the oxide 230 in the channel width direction.

With the above structure, the channel formation region of the oxide 230 can be electrically surrounded by the electric field of the conductor 260 functioning as the first gate electrode and the electric field of the conductor 205 functioning as the second gate electrode.

As illustrated in FIG. 3(C), the conductor 205 is extended to function as a wiring. However, without limitation to this, a structure in which a conductor functioning as a wiring is provided under the conductor 205 may be employed.

Moreover, a conductive material containing tungsten, copper, or aluminum as its main component is preferably used for the conductor 205. Note that the conductor 205 is illustrated as a single layer but may have a stacked-layer structure, for example, a stacked layer of any of the above conductive materials and titanium or titanium nitride.

A conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (that does not easily transmit the above impurities) may be used under the conductor 205. Alternatively, it is preferable to use a conductor which has a function of inhibiting diffusion of oxygen (e.g., at least one of oxygen atoms, oxygen molecules, and the like) (that does not easily transmit the above oxygen). Note that in this specification, a function of inhibiting diffusion of impurities or oxygen means a function of inhibiting diffusion of any one or all of the above impurities and the above oxygen.

When a conductor having a function of inhibiting diffusion of oxygen is used under the conductor 205, the conductivity of the conductor 205 can be inhibited from being reduced because of oxidation of the conductor 205. As the conductor having a function of inhibiting diffusion of oxygen, for example, tantalum, tantalum nitride, ruthenium, or ruthenium oxide is preferably used. Accordingly, a first conductor of the conductor 205 is a single layer or a stacked layer of the above conductive materials.

The insulator 214 preferably functions as a barrier insulating film that prevents impurities such as water or hydrogen from entering the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (that does not easily transmit the above impurities). Alternatively, it is preferable to use an insulating material having a function of inhibiting diffusion of oxygen (e.g., at least one of oxygen atoms, oxygen molecules, and the like) (that does not easily transmit the above oxygen).

For example, aluminum oxide, silicon nitride, or the like is preferably used for the insulator 214. Accordingly, impurities such as water and hydrogen can be inhibited from being diffused to the transistor 200 side from the substrate side of the insulator 214. In addition, oxygen contained in the insulator 224 and the like can be prevented from being diffused to the substrate side of the insulator 214.

The dielectric constants of the insulator 216, the insulator 280, and the insulator 281 functioning as an interlayer film is preferably lower than that of the insulator 214. When a material with a low dielectric constant is used for an interlayer film, the parasitic capacitance generated between wirings can be reduced. As the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 each have a function of a gate insulator.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like may be used for the insulator 224 appropriately. When such an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The thickness of the region that does not overlap with the oxide 230b is smaller than the thickness of the other region in some cases. In particular, as illustrated in FIG. 3(C), the thickness of the insulator 224 in a region that does not overlap with the insulator 254 and the oxide 230b is significantly smaller than the thickness of the insulator 224 in the other region in some cases. The thickness of the insulator 224 in the region that does not overlap with the insulator 254 and the oxide 230b is preferably a thickness with which the above oxygen can be sufficiently diffused.

Like the insulator 214 or the like, the insulator 222 preferably functions as a barrier insulating film that inhibits impurities such as water and hydrogen from entering the transistor 200 from the substrate side. For example, the insulator 222 preferably has a lower hydrogen permeability than the insulator 224. When the insulator 224, the oxide 230, the insulator 250, and the like are surrounded by the insulator 222, the insulator 254, the insulator 244, and the insulator 274, impurities such as water and hydrogen can be inhibited from entering the transistor 200 from outside.

Furthermore, it is preferable that the insulator 222 have a function of inhibiting diffusion of oxygen (e.g., at least one of an oxygen atom, an oxygen molecule, and the like) (that the insulator 222 do not easily transmit the above oxygen). For example, the insulator 222 preferably has a lower oxygen permeability than the insulator 224. When the insulator 222 has a function of inhibiting diffusion of oxygen or impurities, oxygen contained in the oxide 230 can be inhibited from being diffused to the substrate side, which is preferable. Furthermore, the conductor 205 can be prevented from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The oxide 230 includes the oxide 230a, the oxide 230b over the oxide 230a, and the oxide 230c over the oxide 230b. When the oxide 230a is provided under the oxide 230b, impurities can be inhibited from being diffused into the oxide 230b from the structure bodies formed below the oxide 230a. Moreover, when the oxide 230c is provided over the oxide 230b, impurities can be inhibited from being diffused into the oxide 230b from the structure bodies formed above the oxide 230c.

Note that the oxide 230 preferably has a stacked-layer structure of oxides that differ in the atomic ratio of metal atoms. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

As described with reference to FIG. 1, the oxide 230b and the oxide 230c preferably have crystallinity, and it is particularly preferable to use a CAAC-OS. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; hence, the transistor 200 is stable with respect to high temperatures in the manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. Specifically, the atomic ratio of the element M to the constituent elements in the metal oxide used for the oxide 230c is preferably greater than the atomic ratio of the element M to the constituent elements in the metal oxide used for the oxide 230b. Moreover, the atomic ratio of the element M to In in the metal oxide used for the oxide 230c is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230c.

The energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, a gallium oxide, or the like may be used for the oxide 230a and the oxide 230c. The oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and a gallium oxide over the In—Ga—Zn oxide can be used. In other words, a stacked-layer structure of an In—Ga—Zn oxide and an oxide that does not contain In may be used for the oxide 230c.

Specifically, as the oxide 230a, a metal oxide with In:Ga:Zn=1:3:4 [atomic ratio] or In:Ga:Zn=1:1:0.5 [atomic ratio]

is used. As the oxide 230b, a metal oxide with In:Ga:Zn=4:2:3 [atomic ratio] or In:Ga:Zn=3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], a stacked-layer structure of In:Ga:Zn=4:2:3 [atomic ratio] and gallium oxide, and the like.

At this time, the oxide 230b and the vicinity of the interface serve as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and high frequency characteristics. Note that in the case where the oxide 230c has a stacked-layer structure, not only an effect of lowering the density of defect state at the interface between the oxide 230b and the oxide 230c but also an effect of inhibiting diffusion of the constituent elements contained in the oxide 230c into the insulator 250 side is expected. More specifically, the oxide 230c has a stacked-layer structure, and the oxide that does not contain In is positioned as an upper layer in the stacked-layer structure, and thus In that can be diffused into the insulator 250 side can be inhibited. Since the insulator 250 functions as a gate insulator, the transistor shows poor characteristics when In is diffused into the insulator 250. Thus, when the oxide 230c has a stacked-layer structure, a semiconductor device having high reliability can be provided.

A metal oxide functioning as an oxide semiconductor is preferably used for the oxide 230. For example, as the metal oxide to be the channel formation region of the oxide 230, it is preferable to use one having a band gap of 2 eV or more, preferably 2.5 eV or more. With the use of a metal oxide having such a wide band gap, the off-state current of the transistor can be reduced. With the use of such a transistor, a semiconductor device with low power consumption can be provided.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration of the oxide 230 in the vicinity of the conductor 242 sometimes decreases. Furthermore, in the oxide 230 in the vicinity of the conductor 242, a metal compound layer that contains the metal contained in the conductor 242 and the component of the oxide 230 is sometimes formed. In such a case, the carrier density of a region in the oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed between the conductor 242a and the conductor 242b in a self-aligned manner.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulator 224, the concentration of impurities such as water and hydrogen in the insulator 250 is preferably lowered. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Thus, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. In addition, the equivalent oxide thickness (EOT) of the insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

Although the conductor 260 has a two-layer structure in FIG. 3, the conductor 260 may have a single-layer structure or a stacked-layer structure of three or more layers.

For the conductor 260a, it is preferable to use the above conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation of the conductor 260b due to oxygen contained in the insulator 250. As a conductive material having a function of inhibiting diffusion of oxygen, for example, tantalum, tantalum nitride, ruthenium, ruthenium oxide, or the like is preferably used.

For the conductor 260b, it is preferable to use a conductive material containing tungsten, copper, or aluminum as its main component. The conductor 260 also functions as a wiring, and thus a conductor having high conductivity is preferably used. For example, a conductive material containing tungsten, copper, or aluminum as its main component can be used. The conductor 260b may have a stacked-layer structure, for example, a stacked-layer structure of any of the above conductive materials and titanium or titanium nitride.

As illustrated in FIGS. 3(A) and 3(C), the side surface of the oxide 230 is provided to be covered with the conductor 260 in a region of the oxide 230b that does not overlap with the conductor 242, that is, the channel formation region of the oxide 230. Accordingly, the electric field of the conductor 260 functioning as the first gate electrode is easily applied to the side surface of the oxide 230. Thus, the on-state current of the transistor 200 can be increased, and the frequency characteristics can be improved.

Like the insulator 214 or the like, the insulator 254 preferably functions as a barrier insulating film that inhibits impurities such as water and hydrogen from entering the transistor 200 from the insulator 280 side. For example, the insulator 254 preferably has a lower hydrogen permeability than the insulator 224. Furthermore, as illustrated in FIGS. 3(B) and 3(C), the insulator 254 is preferably in contact with the side surfaces of the oxide 230c, the top surface and side surface of the conductor 242a, the top surface and side surface of the conductor 242b, the side surfaces of the oxide 230a, the side surfaces of the oxide 230b, and the top surface of the insulator 224. Such a structure can inhibit entry of hydrogen contained in the insulator 280 into the oxide 230 through the top surfaces or side surfaces of the conductor 242a, the conductor 242b, the oxide 230a, the oxide 230b, and the insulator 224.

Furthermore, it is preferable that the insulator 254 have a function of inhibiting diffusion of oxygen (e.g., at least one of an oxygen atom, an oxygen molecule, and the like) (that the insulator 254 do not easily transmit the above oxygen). For example, the insulator 254 preferably has a lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to a region of the insulator 224 in contact with the insulator 254 and its vicinity. Accordingly, oxygen can be supplied from the region to the oxide 230 through the insulator 224. Here, when the insulator 254 has a function of inhibiting upward oxygen diffusion, oxygen can be prevented from being diffused from the oxide 230 into the insulator 280. Moreover, when the insulator 222 has a function of inhibiting downward oxygen diffusion, oxygen can be prevented from being diffused from the oxide 230 toward the substrate side. In the above manner, oxygen is supplied to the channel formation region of the oxide 230. Thus, oxygen vacancies in the oxide 230 can be reduced, so that the transistor can be inhibited from becoming normally on.

An insulator containing an oxide of one or both of aluminum and hafnium is deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

Like the insulator 214 or the like, the insulator 244 preferably functions as a barrier insulating film that inhibits impurities such as water and hydrogen from entering the transistor 200 from the insulator 280 side. For example, the insulator 244 preferably has a lower hydrogen permeability than the insulator 224. Furthermore, as illustrated in FIGS. 3(B) and 3(C), the insulator 244 is preferably provided in contact with the insulator 254. Such a structure can inhibit entry of hydrogen contained in the insulator 280 into the oxide 230 through the side surfaces of the conductor 260, the oxide 230c, and the insulator 250.

Thus, the insulator 224, the insulator 250, and the oxide 230 are covered with the insulator 254 and the insulator 244 having a barrier property against hydrogen, whereby the insulator 280 is separated from the insulator 224, the oxide 230, and the insulator 250 by the insulator 254 or the insulator 244. Thus, impurities such as hydrogen can be inhibited from entering the insulator 224, the insulator 250, and the oxide 230 from the outside of the transistor 200, so that the transistor 200 can have favorable electrical characteristics and high reliability.

Furthermore, it is preferable that the insulator 244 have a function of inhibiting diffusion of oxygen (e.g., at least one of an oxygen atom, an oxygen molecule, and the like) (that the insulator 244 do not easily transmit the above oxygen). For example, the insulator 244 preferably has a lower oxygen permeability than the insulator 224. When the insulator 244 has a function of inhibiting diffusion of oxygen, the conductor 260 can be inhibited from reacting with oxygen contained in the insulator 280.

An insulator containing aluminum nitride may be used as the insulator 244, for example. It is preferable to use, as the insulator 244, a nitride insulator that satisfies the composition formula $AlN_x$ (x is a real number greater than 0 and less than or equal to 2, preferably greater than 0.5 and less than or equal to 1.5). In that case, a film having an excellent insulating property and high thermal conductivity can be obtained, and thus dissipation of heat generated in driving the transistor 200 can be increased. Aluminum titanium nitride, titanium nitride, or the like can also be used as the insulator 244. In that case, it is preferable to perform deposition by a sputtering method because deposition can be performed without using, as a deposition gas, a gas with high oxidation such as oxygen or ozone. Silicon nitride, silicon nitride oxide, or the like can also be used.

An insulator containing an oxide of one or both of aluminum and hafnium is preferably deposited as the insulator 244, for example. Note that as the insulator containing an oxide of one or both of aluminum and hafnium, aluminum oxide, hafnium oxide, an oxide containing aluminum and hafnium (hafnium aluminate), or the like is preferably used. In this case, the insulator 244 is preferably deposited by an ALD method. An ALD method is a deposition method having excellent coverage, and thus can prevent formation of disconnection or the like due to unevenness of the insulator 244.

The insulator 280 is provided over the insulator 224, the oxide 230, and the conductor 242 with the insulator 244 and the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. A material such as silicon oxide, silicon oxynitride, or porous silicon oxide is particularly preferable because a region including oxygen that is released by heating can be easily formed.

Note that the concentration of impurities such as water and hydrogen in the insulator 280 is preferably lowered. A top surface of the insulator 280 may be planarized.

Like the insulator 214 or the like, the insulator 274 preferably functions as a barrier insulating film that inhibits impurities such as water and hydrogen from entering the insulator 280 from the above. An insulator that can be used as the insulator 214, the insulator 254, or the like is used as the insulator 274, for example.

The insulator 281 functioning as an interlayer film is preferably provided over the insulator 274. As in the insulator 224 or the like, the concentration of impurities such as water and hydrogen in the film of the insulator 281 is preferably lowered.

The conductor 240a and the conductor 240b are provided in openings formed in the insulator 281, the insulator 274, the insulator 280, and the insulator 244. The conductor 240a and the conductor 240b are provided to face each other with the conductor 260 therebetween. Note that the level of the top surfaces of the conductor 240a and the conductor 240b may be on the same surface as the top surface of the insulator 281.

Note that the insulator 241a is provided in contact with the inner wall of the opening of the insulator 281, the insulator 274, the insulator 280, the insulator 254, and the insulator 244, and a first conductor of the conductor 240a is formed in contact with a side surface of the insulator 241a. The conductor 242a is located on at least part of the bottom portion of the opening, and thus the conductor 240a is in contact with the conductor 242a. Similarly, the insulator 241b is provided in contact with the inner wall of the opening of the insulator 281, the insulator 274, the insulator 280, the insulator 254, and the insulator 244, and a first conductor of the conductor 240b is formed in contact with the side surface of the insulator 241b. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. The conductor 240a and the conductor 240b may have a stacked-layer structure.

In the case where the conductor 240 has a stacked-layer structure, the above conductor having a function of inhibiting diffusion of impurities such as water and hydrogen is preferably used as a conductor in contact with the oxide 230a, the oxide 230b, the conductor 242, the insulator 254, the insulator 244, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water and hydrogen may be used as a single layer or a stacked layer. The use of the conductive material can prevent oxygen added to the insulator 280 from being absorbed by the conductor 240a and the conductor 240b. Moreover, impurities such as water and hydrogen can be inhibited from entering the oxide 230 through the conductor 240a and the conductor 240b from a layer above the insulator 281.

As the insulator 241a and the insulator 241b, an insulator that can be used as the insulator 244 or the like is used, for example. Since the insulator 241a and the insulator 241b are provided in contact with the insulator 254 and the insulator 244, impurities such as water and hydrogen can be inhibited from entering the oxide 230 from the insulator 280 or the like through the conductor 240a and the conductor 240b. Moreover, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride.

The conductor may be formed to be embedded in an opening provided in an insulator.

<Constituent Material of Semiconductor Device>

Constituent materials that can be used for a semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the above semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided for the substrate include a capacitor, a resistor, a switching element, a light-emitting element, and a memory element.

<<Insulator>>

An insulating oxide, an insulating nitride, an insulating oxynitride, an insulating nitride oxide, an insulating metal oxide, an insulating metal oxynitride, and an insulating metal nitride oxide are given as an insulator.

With miniaturization and high integration of a transistor, for example, a problem of leakage current or the like may arise because a gate insulator becomes thin. When a high-k material is used for the insulator functioning as a gate insulator, the voltage at the time when the transistor operates can be reduced while the physical thickness of the gate insulator is kept. By contrast, when a material having a low relative permittivity is used for the insulator functioning as an interlayer film, the parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When the transistor using an oxide semiconductor is surrounded by an insulator that has a function of inhibiting the transmission of oxygen and impurities such as hydrogen (the insulator 214, the insulator 222, the insulator 254, the insulator 244, the insulator 274, and the like), the electrical characteristics of the transistor can be stable. As an insulator that has a function of inhibiting the transmission of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; and a metal nitride such as aluminum nitride, aluminum titanium nitride, titanium nitride, silicon nitride oxide, or silicon nitride can be used.

Furthermore, the insulator functioning as a gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used in the channel formation region of the transistor, a stacked-layer structure combining a material containing any of the above-described metal elements and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and anon-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of alkali metal or alkaline earth metal in the metal oxide that is obtained by SIMS (secondary ion mass spectrometry) (the concentration obtained by SIMS) is lower than or equal to $1 \times 10^{18}$ atoms/cm$^3$, preferably lower than or equal to $2 \times 10^{16}$ atoms/cm$^3$.

Furthermore, hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably than $1 \times 10^{18}$ atoms/cm$^3$. When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/µm ($10^{24}$ A/µm). For example, a low-power-consumption CPU utilizing a characteristic of a low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of low leakage current of the transistor have been studied.

<Method for Manufacturing Semiconductor Device>

Next, a method for manufacturing a semiconductor device including the transistor 200 of one embodiment of the present invention, which is illustrated in FIG. 3, will be described with reference to FIG. 4 to FIG. 9. In FIG. 4 to FIG. 9, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawing, some components are not illustrated in the top view in (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

In an ALD method, one atomic layer can be deposited at a time using self-controllability of atoms; therefore, an ALD method has effects such as possibilities of deposition of an extremely thin film, deposition on a component with a large aspect ratio, deposition of a film with a small number of defects such as pinholes, deposition with excellent coverage, and low-temperature deposition. An ALD method includes a PEALD (Plasma Enhanced ALD) method which is a deposition method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike in a deposition method in which particles ejected from a target or the like are deposited, in a CVD method and an ALD method, a film is formed by reaction at a surface of an object. Thus, a CVD method and an ALD method are deposition methods that are less likely to be influenced by the shape of an object and thus have favorable step coverage. In particular, an ALD method enables excellent step coverage and excellent thickness uniformity and can be favorably used to cover a surface of an opening with a high aspect ratio, for example. On the other hand, an ALD method has a relatively low deposition rate; hence, it is sometimes preferable to combine an ALD method with another deposition method with a high deposition rate, such as a CVD method.

A CVD method and an ALD method enable control of the composition of a film to be obtained with a flow rate ratio of the source gases. For example, by a CVD method or an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case where the film is deposited while changing the flow rate ratio of the source gases, as compared to the case where the film is deposited using a plurality of deposition chambers, time taken for the deposition can be shortened because time taken for transfer and pressure adjustment is omitted. Thus, the productivity of semiconductor devices can be improved in some cases.

In this embodiment, for the insulator 214, aluminum oxide is deposited by a sputtering method. The insulator 214 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, a conductive film to be the conductor 205 is deposited over the insulator 214. The conductive film to be the conductor 205 can be deposited by a sputtering method, a CVD method, an MBE method, a PLD method, an ALD method, or the like. The conductive film to be the conductor 205 can be a multilayer film. In this embodiment, tungsten is deposited as the conductive film to be the conductor 205.

Next, the conductive film to be the conductor 205 is processed by a lithography method, so that the conductor 205 is formed.

In the lithography method, first, a resist is exposed to light through a mask. Next, a region exposed to light is removed or left using a developing solution, so that a resist mask is formed. Then, etching through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask may be removed during the etching. The hard mask may be removed by etching after the etching of the conductive film to be the conductor 205. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which a high-frequency power with the same frequency is applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 216 is deposited over the insulator 214 and the conductor 205. The insulating film to be the insulator 216 can be deposited by a sputtering method, a CVD method, an MBE method, a PLD method, an ALD method, or the like. In this embodiment, as the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm and the thickness of the insulating film to be the insulator 216 is 350 nm.

Next, CMP (Chemical Mechanical Polishing) treatment is performed on the insulating film to be the insulator 216, so that part of the insulating film to be the insulator 216 is removed and a surface of the conductor 205 is exposed. In this manner, the insulator 216 and the conductor 205 with flat top surfaces can be formed (see FIG. 4). The planarity of the top surfaces of the insulator 216 and the conductor 205 is improved, whereby the crystallinity of a CAAC-OS for forming the oxide 230b and the oxide 230c can be improved.

Note that the method for forming the insulator 216 and the conductor 205 is not limited to the above. For example, the conductor 205 may be formed in such a manner that an insulating film to be the insulator 216 is deposited over the insulator 214, an opening is formed in the insulating film, and the conductor 205 is embedded in the opening.

Next, the insulator 222 is deposited over the insulator 216 and the conductor 205. An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, an insulating film to be the insulator 224 is deposited over the insulator 222. The insulating film to be the insulator 224 can be deposited by a sputtering method, a CVD method, an MBE method, a PLD method, an ALD method, or the like.

Sequentially, heat treatment is preferably performed. The heat treatment may be performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, as the heat treatment, treatment is performed in a nitrogen atmosphere at 400° C. for one hour after deposition of the insulator 224. By the heat treatment, impurities such as water and hydrogen contained in the insulator 224 can be removed, for example. The heat treatment can also be performed after the deposition of the insulator 222, or the like.

Here, in order to form an excess-oxygen region in the insulator 224, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment is not necessarily performed.

Figure 4A:
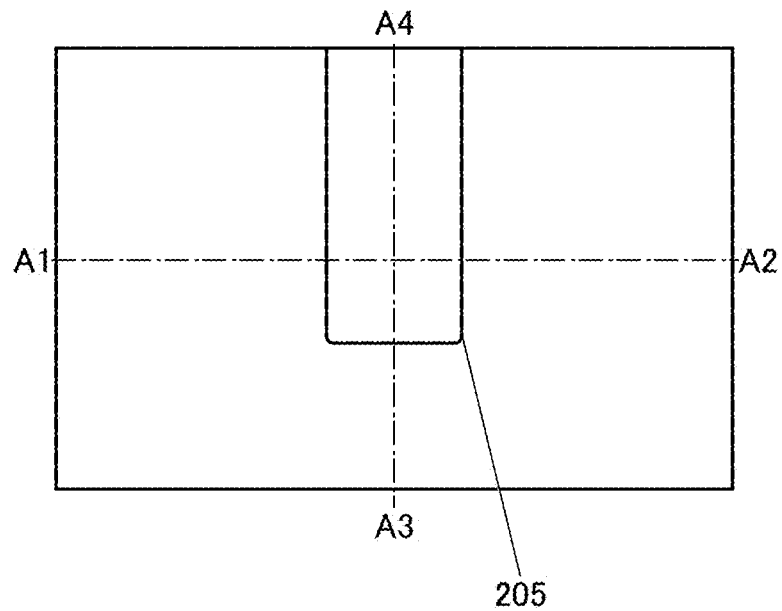
FIGS. 4A to 4C A top view and cross-sectional views illustrating a method for manufacturing a semiconductor device of one embodiment of the present invention.
Figure 4C:
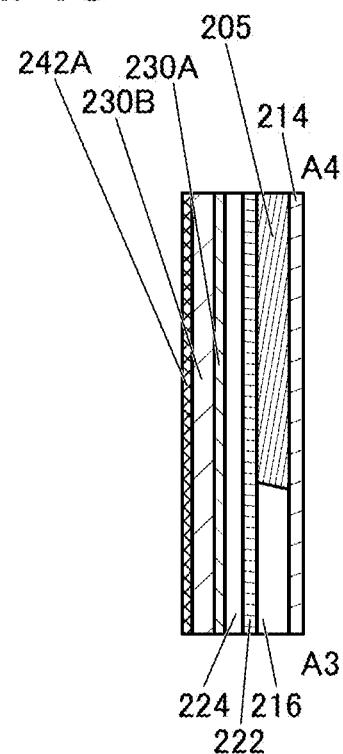
Figure 4B:
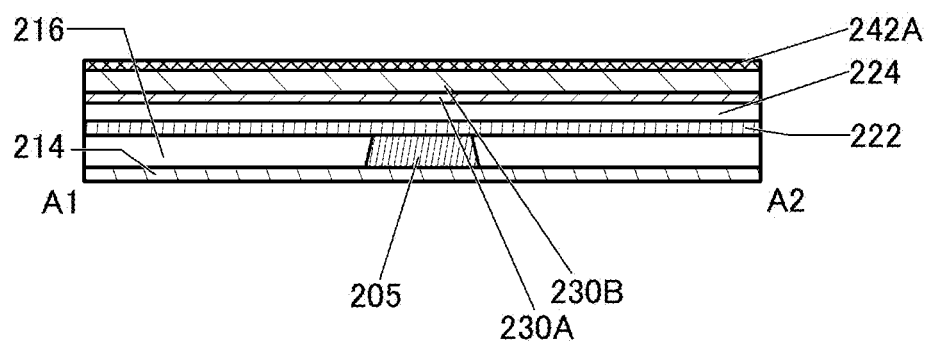
Figure 5A:
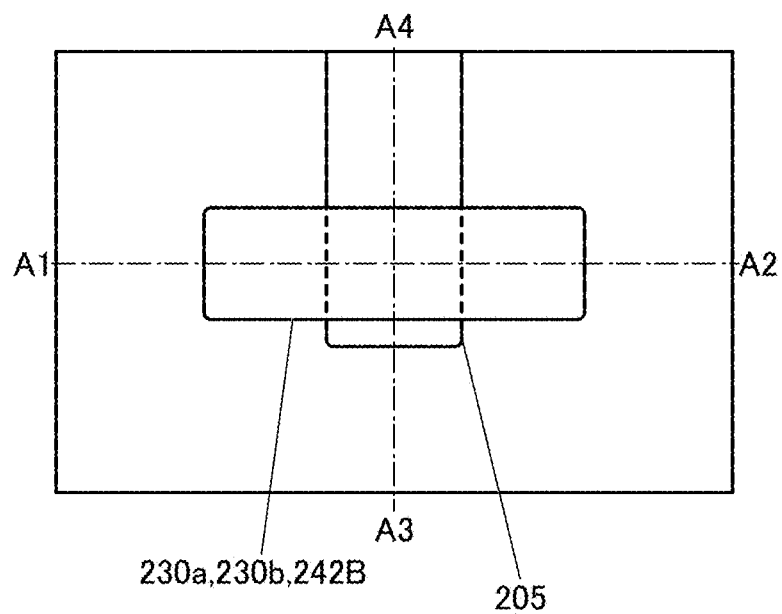
FIGS. 5A to 5C A top view and cross-sectional views illustrating a method for manufacturing a semiconductor device of one embodiment of the present invention.
Figure 5C:
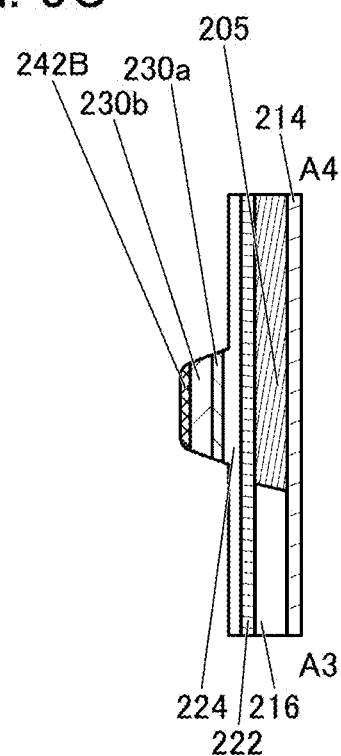
Figure 5B:
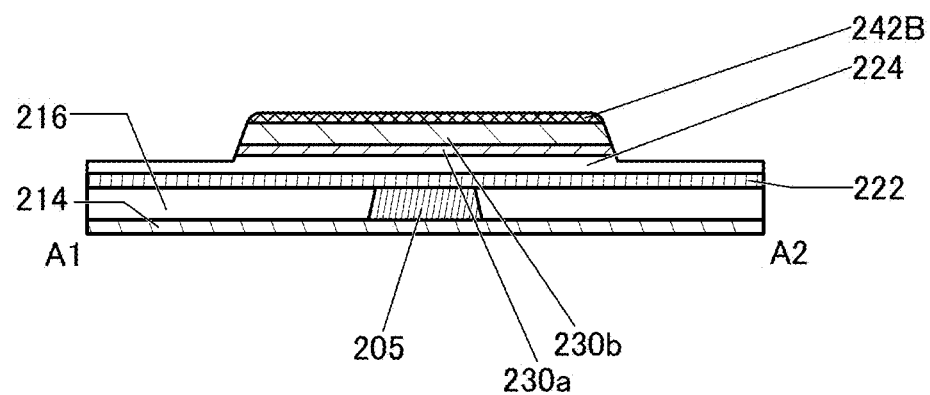

Next, an oxide film 230A to be the oxide 230a, an oxide film 230B to be the oxide 230b, and a conductive film 242A to be the conductor 242 are deposited in this order over the insulator 224 (see FIG. 4). Note that the oxide films are preferably deposited successively without being exposed to an air atmosphere. By the deposition without exposure to the air, impurities or moisture from the air atmosphere can be prevented from being attached to the oxide film 230A and the oxide film 230B, so that the vicinity of an interface between the oxide film 230A and the oxide film 230B can be kept clean.

The oxide film 230A, the oxide film 230B, and the conductive film 242A can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, the amount of excess oxygen in the oxide film to be deposited can be increased. In the case where the above oxide films are deposited by a sputtering method, the above In-M-Zn oxide target can be used.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is 1% or higher and 30% or lower, preferably 5% or higher and 20% or lower during the deposition, an oxygen-deficient oxide semiconductor is formed. In a transistor using an oxygen-deficient oxide semiconductor for its channel formation region, relatively high field-effect mobility can be obtained. In addition, when deposition is performed while the substrate is heated, the crystallinity of the oxide film can be improved. Note that one embodiment of the present invention is not limited thereto. In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using a target with In:Ga:Zn=1:1:0.5 [atomic ratio] (2:2:1 [atomic ratio]) or a target with In:Ga:Zn=1:3:4 [atomic ratio]. The oxide film 230B is deposited by a sputtering method using a target with In:Ga:Zn=4:2:4.1 [atomic ratio]. Note that each of the oxide films is preferably formed in accordance with characteristics required for the oxide 230 by appropriate selection of deposition conditions and an atomic ratio.

In addition, it is preferable that the sputtering gas be highly purified for the deposition of the oxide film 230A and the oxide film 230B. For example, as an oxygen gas or a rare gas used as a sputtering gas, a gas that is highly purified to have a dew point of −60° C. or lower, and preferably −100° C. or lower is used. When the highly purified sputtering gas is used for deposition, entry of moisture or the like into the oxide 230 can be prevented as much as possible.

Furthermore, in the case where the oxide film 230A and the oxide film 230B are deposited by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, the oxide film 230A, the oxide film 230B, and the conductive film 242A are processed into island shapes to form the oxide 230a, the oxide 230b, and a conductor layer 242B. Note that in this step, the thickness of the insulator 224 in a region not overlapping with the oxide 230a is reduced in some cases (see FIG. 5).

Here, the oxide 230a, the oxide 230b, and the conductor layer 242B are formed to at least partly overlap with the conductor 205. Alternatively, a structure may be employed in which an angle formed by the oxide 230a, the oxide 230b, and the conductor layer 242B and the top surface of the insulator 222 is a gentle angle. In that case, the angle formed by the side surfaces of the oxide 230a and the oxide 230b and the top surface of the insulator 222 is preferably greater than or equal to 60° and less than 70°. With such a shape, the coverage with the insulator 254 and the like can be improved in a later step, so that defects such as a void can be reduced. Alternatively, the side surfaces of the oxide 230a, the oxide 230b, and the conductor layer 242B may be substantially perpendicular to the top surface of the insulator 222. When the side surfaces of the oxide 230a, the oxide 230b, and the conductor layer 242B are substantially perpendicular to the top surface of the insulator 222, the plurality of transistors 200 can be provided in a smaller area and at a higher density.

The conductor layer 242B has a curved surface between its side surface and its top surface. That is, an end portion of the side surface and an end portion of the top surface are preferably curved (such a shape is hereinafter also referred to as a rounded shape). The radius of curvature of the curved surface at an end portion of the conductor layer 242B layer is greater than or equal to 3 nm and less than or equal to 10 nm, preferably greater than or equal to 5 nm and less than or equal to 6 nm, for example. When the end portions are not angular, the coverage with films deposited in a later step can be improved.

Note that the oxide film 230A, the oxide film 230B, and the conductive film 242A may be processed by a lithography method. The processing can be performed by a dry etching method or a wet etching method. The processing by a dry etching method is suitable for microfabrication.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Sequentially, heat treatment may be performed. For the conditions of the heat treatment, the conditions for the above-described heat treatment can be used.

Next, a dummy gate film to be a dummy gate layer 262A is deposited over the insulator 224, the oxide 230a, the oxide 230b, and the conductor layer 242B.

The dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily microfabricated and easily removed is preferably used as the dummy gate film to be the dummy gate layer 262A.

The dummy gate film to be the dummy gate layer 262A can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, an SOG (Spin On Glass), a resin film, or the like may be formed by a coating method. For example, a photoresist, polyester, polyolefin, polyamide (nylon, aramid, or the like), polyimide, polycarbonate, acrylic, or the like can be given. When the SOG or the resin film is formed by a coating method, a surface of the dummy gate film can be flat. In this manner, when having a flat surface, the dummy gate film can be easily microfabricated and easily removed.

The dummy gate film to be the dummy gate layer 262A can be a multilayer film using different kinds of films. For example, the dummy gate film to be the dummy gate layer 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end of the CMP treatment can be detected in some cases, so that processing variation can be reduced in some cases.

Figure 6A:
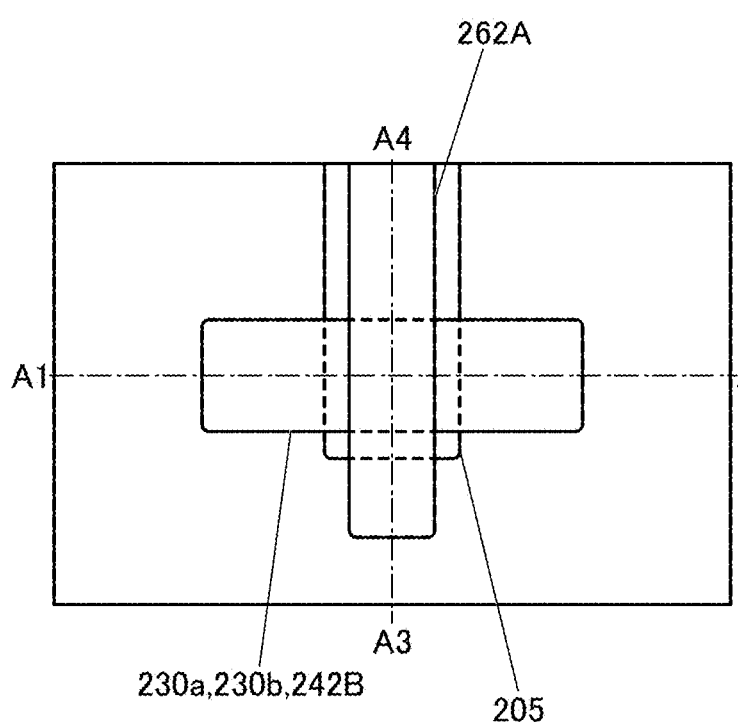
FIGS. 6A to 6C A top view and cross-sectional views illustrating a method for manufacturing a semiconductor device of one embodiment of the present invention.
Figure 6C:
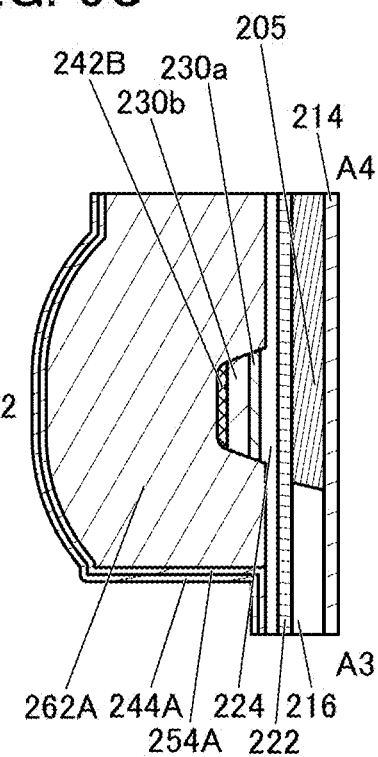
Figure 6B:
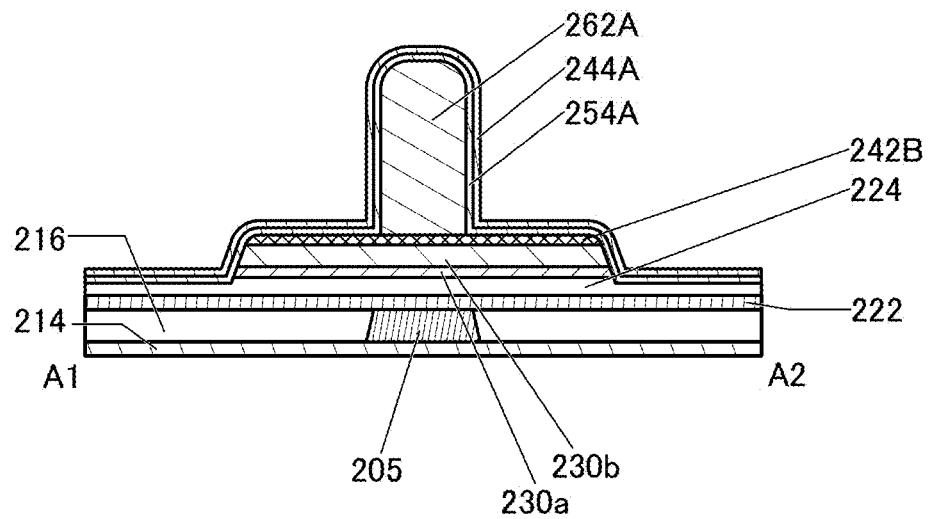

Next, the dummy gate film to be the dummy gate layer 262A is etched by a lithography method to form the dummy gate layer 262A (see FIG. 6). The dummy gate layer 262A is formed to at least partly overlap with the conductor 205 and the oxide 230.

Next, an insulating film 254A is deposited to cover the oxide 230a, the oxide 230b, the conductor layer 242B, and the dummy gate layer 262A. Next, an insulating film 244A may be deposited over the insulating film 254A (see FIG. 6). The insulating film 254A and the insulating film 244A can be deposited by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

As the insulating film 244A, an insulating film having a function of inhibiting diffusion of oxygen and impurities such as hydrogen is preferably used. For example, an aluminum oxide film is preferably deposited by an ALD method. By an ALD method which enables good coverage, the insulating film 244A having a uniform thickness can be formed even in a step portion formed by the dummy gate layer 262A and the like. With the use of an ALD method, a dense thin film can be deposited. A dense thin film having good coverage can be deposited in this manner, and thus even when defects such as voids or pinholes are generated in the insulating film 254A, for example, they can be covered with the insulating film 244A.

As the insulating film 244A, aluminum nitride, silicon nitride, silicon nitride oxide, or the like may be deposited. For example, in the case where an aluminum nitride film is deposited by reactive sputtering using an aluminum target as the insulating film 244A, the ratio of the nitrogen-gas flow rate to the total flow rate of the deposition gas is preferably higher than or equal to 30% and lower than or equal to 100%, further preferably higher than or equal to 40% and lower than or equal to 100%, still further preferably higher than or equal to 50% and lower than or equal to 100%.

As the insulating film 244A, aluminum oxide may be deposited while the substrate is being heated at high temperature. The substrate heating temperature during the deposition of the insulating film 244A is higher than or equal to 200° C., preferably higher than or equal to 250° C., still further preferably higher than or equal to 350° C. Aluminum oxide is deposited as the insulating film 254A by an ALD method at this time, whereby when the insulating film 244A is deposited at the above temperature, the dummy gate layer 262A can be prevented from being deformed.

Furthermore, fluorine may be added after the deposition of one or both of the insulating film 244A and the insulating film 254A. The addition of fluorine to one or both of the insulating film 244A and the insulating film 254A can be performed in such a manner that plasma treatment is performed in an atmosphere containing a fluorine-based gas (e.g. $CF_4$) or the like or doping of a gas containing fluorine is performed. When fluorine is added to one or both of the insulating film 244A and the insulating film 254A, hydrogen contained in the film can be expected to be terminated or gettered by fluorine.

Thus, excess oxygen contained in the insulator 224 can be prevented from being diffused to the outside, and in addition, impurities such as water and hydrogen can be pervented from entering the insulator 224 from the outside. Note that the deposition of the insulating film 244A can be omitted.

Next, an insulating film to be the insulator 280 is deposited over the insulating film 244A. The insulating film to be the insulator 280 can be deposited by a sputtering method, a CVD method, an MBE method, a PLD method, an ALD method, or the like.

Figure 7A:
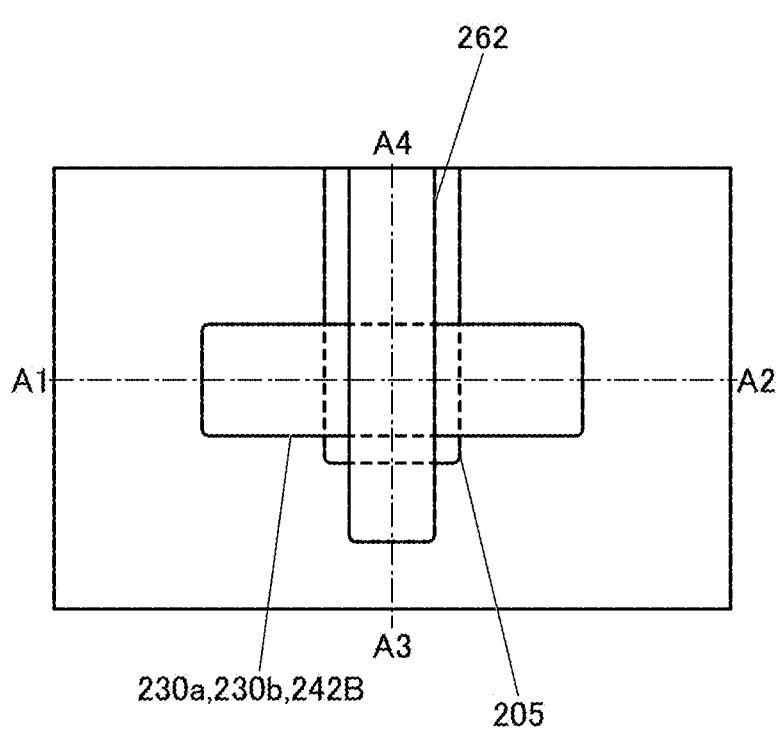
FIGS. 7A to 7C A top view and cross-sectional views illustrating a method for manufacturing a semiconductor device of one embodiment of the present invention.
Figure 7C:
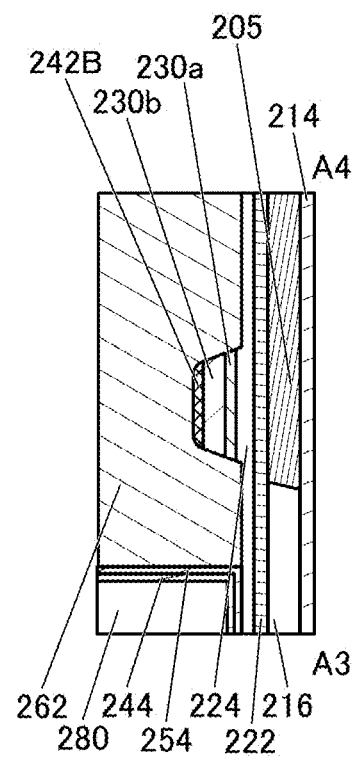

Next, the insulating film to be the insulator 280, the dummy gate layer 262A, the insulating film 254A, and the insulating film 244A are partly removed until part of the dummy gate layer 262A is exposed, and thus, the insulator 280, the dummy gate 262, the insulator 254, and the insulator 244 are formed (see FIG. 7). CMP treatment is preferably employed for forming the insulator 280, the dummy gate 262, the insulator 254, and the insulator 244.

Figure 7B:
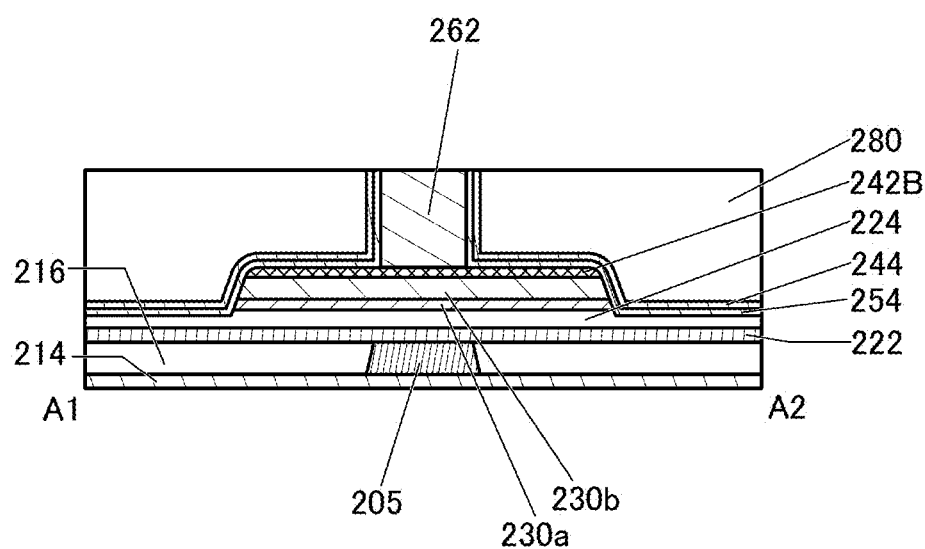

As mentioned above, when the dummy gate layer 262A has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 262 can be reduced in some cases. As illustrated in FIG. 7(B), the top surface of the dummy gate 262 is substantially aligned with the top surfaces of the insulator 273, the insulator 274, and the insulator 280.

Figure 8A:
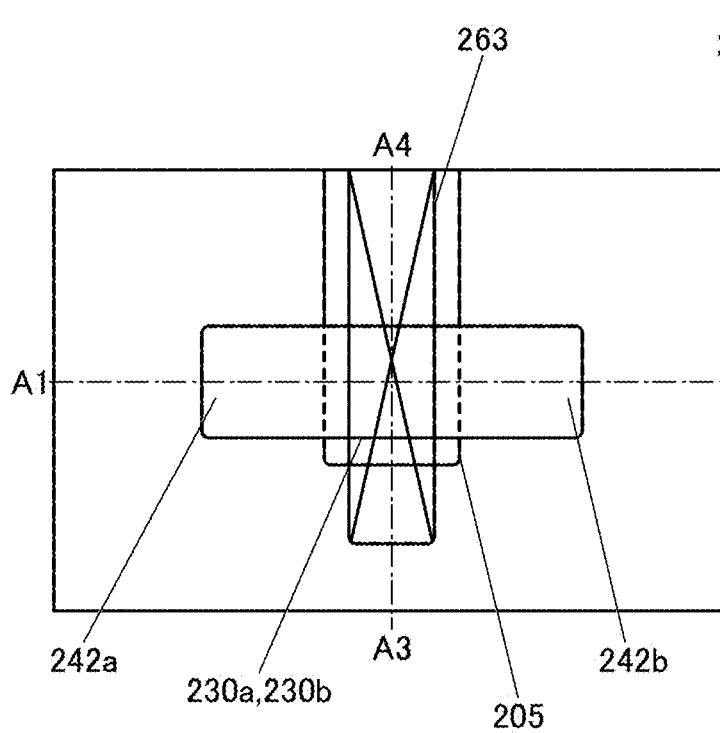
FIGS. 8A to 8C A top view and cross-sectional views illustrating a method for manufacturing a semiconductor device of one embodiment of the present invention.
Figure 8C:
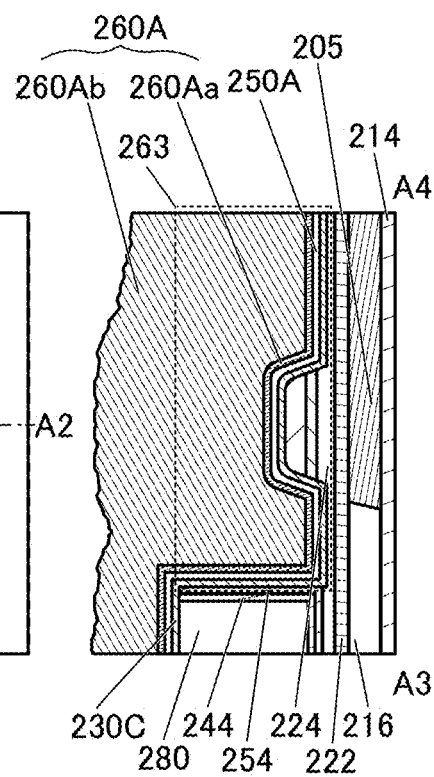
Figure 8B:
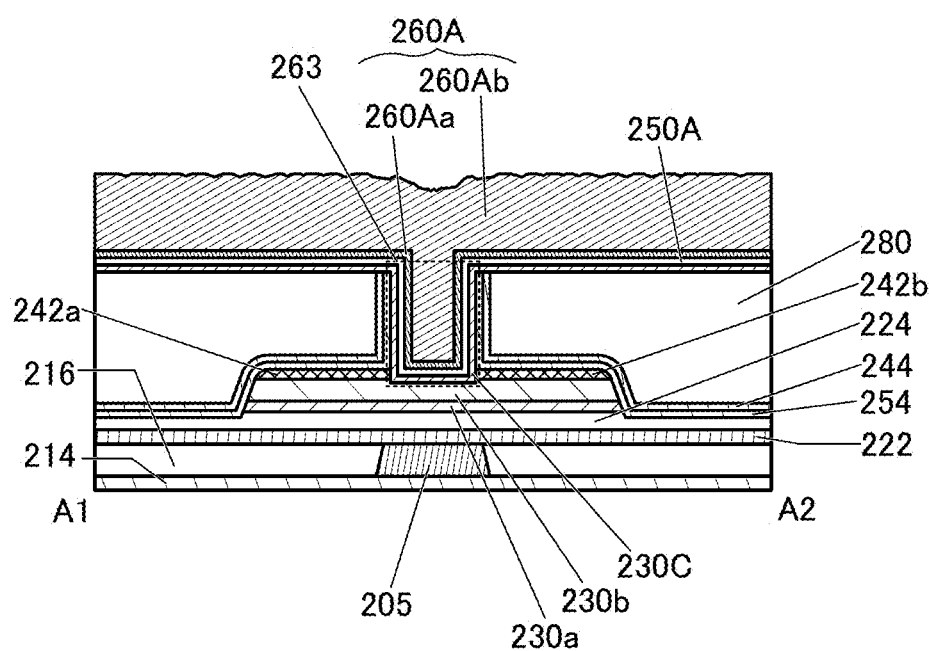

Next, the dummy gate 262 is removed to form an opening 263 (see FIG. 8). The dummy gate 262 can be removed by wet etching, dry etching, ashing, or the like. Alternatively, a plurality of the above treatments may be performed in combination as appropriate. For example, wet etching treatment may be performed after ashing treatment. By removing the dummy gate 262, part of a surface of the conductor layer 242B is exposed from the opening 263.

Next, by removal of a portion of the conductor layer 242B that is exposed from the opening 263, the surface of the oxide 230b is partly exposed, and thus the conductor 242a and the conductor 242b can be formed. The removal can be performed by wet etching or dry etching. In this embodiment, dry etching is used. Dry etching is preferably used because microfabrication is possible. Here, part of the top surface of the oxide 230b that is exposed between the conductor 242a and the conductor 242b is removed in some cases.

At this time, the conductor 242a and the conductor 242b are formed using the insulator 280, the insulator 244, and the insulator 254 as masks. Thus, the opening 263 formed in the insulator 280, the insulator 244, and the insulator 254 overlaps with a region between the conductor 242a and the conductor 242b. In this manner, the conductor 260 can be formed between the conductor 242a and the conductor 242b in a self-aligned manner in a later step.

Next, heat treatment is preferably performed before deposition of an oxide film 230C. The heat treatment may be performed at a temperature higher than or equal to 100° C. and lower than or equal to 400° C., for example, at 200° C. The heat treatment is preferably performed under reduced pressure, for example, may be performed in a vacuum atmosphere. A vacuum atmosphere is kept by evacuation with a turbomolecular pump or the like. The pressure in the treatment chamber in a vacuum atmosphere is preferably lower than or equal to $1\times10^{-2}$ Pa, further preferably lower than or equal to $1\times10^{-3}$ Pa.

The oxide film 230C is preferably deposited successively without being exposed to the air after the heat treatment. For example, it is preferable that the heat treatment and the deposition be successively performed in different chambers using a multi-chamber deposition apparatus. When such treatment is performed, moisture and hydrogen adsorbed on the surfaces of the surfaces and the like of the oxide 230a and the oxide 230b can be removed, and in addition, the concentrations of moisture and hydrogen in the oxide 230a and the oxide 230b can be reduced. Moreover, when the heat treatment and the deposition are successively performed without exposure to the air, impurities such as hydrogen can be prevented from entering the oxide 230 again. Heat treatment similar to the above may also be performed before the deposition of an insulating film 250A to be described later.

The oxide film 230C can be deposited by a sputtering method, a CVD method, an MBE method, a PLD method, an ALD method, or the like. An oxide film to be the oxide film 230C may be deposited by a deposition method similar to that for the oxide film 230A or the oxide film 230B in accordance with characteristics required for the oxide film 230C. In this embodiment, the oxide film 230C is deposited by a sputtering method using a target with In:Ga:Zn=1:3:4 [atomic ratio] or In:Ga:Zn=4:2:4.1 [atomic ratio].

The oxide film 230C is preferably deposited while the substrate is being heated. At this time, when the substrate temperature is higher than or equal to 300° C., oxygen vacancies in the oxide film 230B and the oxide film 230C can be reduced. For example, the deposition may be performed at the same temperature as the temperature for deposition of the insulating film 250A to be described later. The deposition is performed while the substrate is being heated, whereby the crystallinity of the oxide film 230C and the oxide 230b can be improved.

In particular, in the deposition of the oxide film 230C, part of oxygen contained in a sputtering gas is supplied to the oxide 230a and the oxide 230b, in some cases. Therefore, the proportion of oxygen contained in the sputtering gas for the oxide film 230C is preferably 70% or higher, further preferably 80% or higher, still further preferably 100%. In addition, when deposition is performed while the substrate is heated, the crystallinity of the oxide film can be improved.

Next, the insulating film 250A is deposited. The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 300° C. and lower than 450° C., further preferably higher than or equal to 300° C. and lower than 400° C., particularly preferably approximately 350° C. When the insulating film 250A is deposited at 350° C., for example, an insulator having few impurities can be deposited.

Note that oxygen is excited by microwaves to generate high-density oxygen plasma, and the insulating film 250A is exposed to the oxygen plasma, whereby oxygen can be introduced into the insulating film 250A.

Furthermore, heat treatment may be performed. For the heat treatment, the conditions for the above-described heat treatment can be used. By the heat treatment, the concentrations of moisture and hydrogen in the insulating film 250A can be reduced.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 8).

Figure 9A:
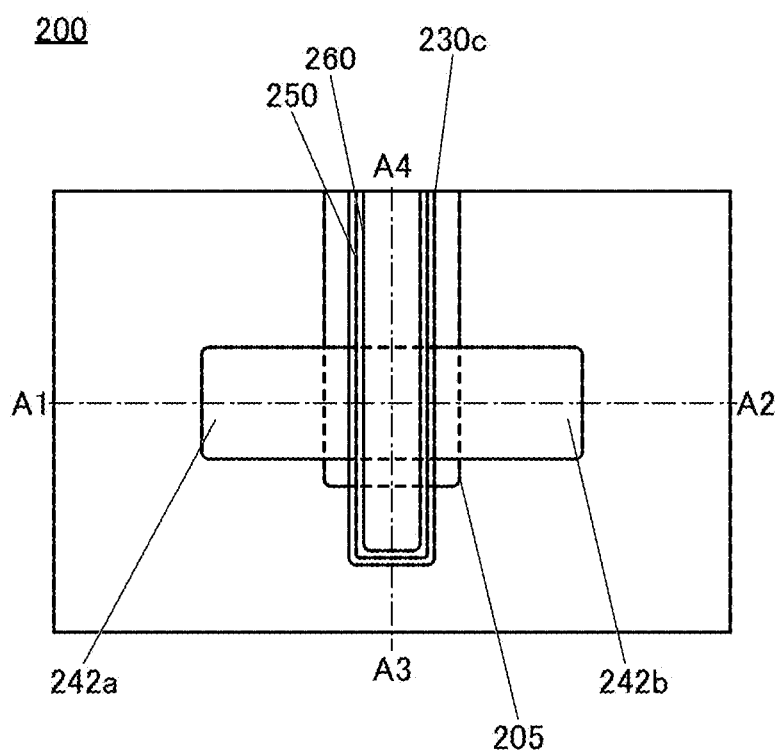
FIGS. 9A to 9C A top view and cross-sectional views illustrating a method for manufacturing a semiconductor device of one embodiment of the present invention.
Figure 9C:
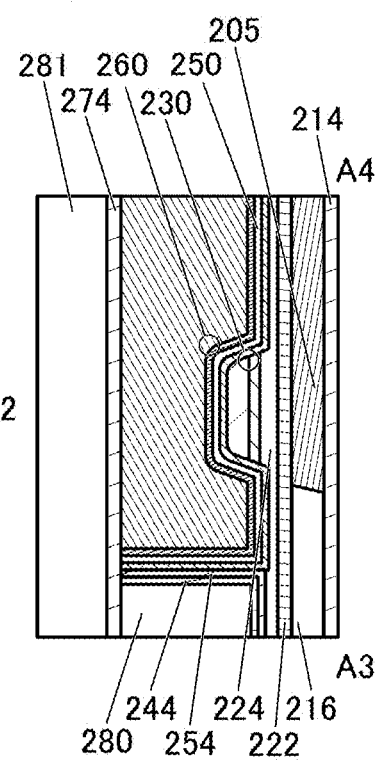
Figure 9B:
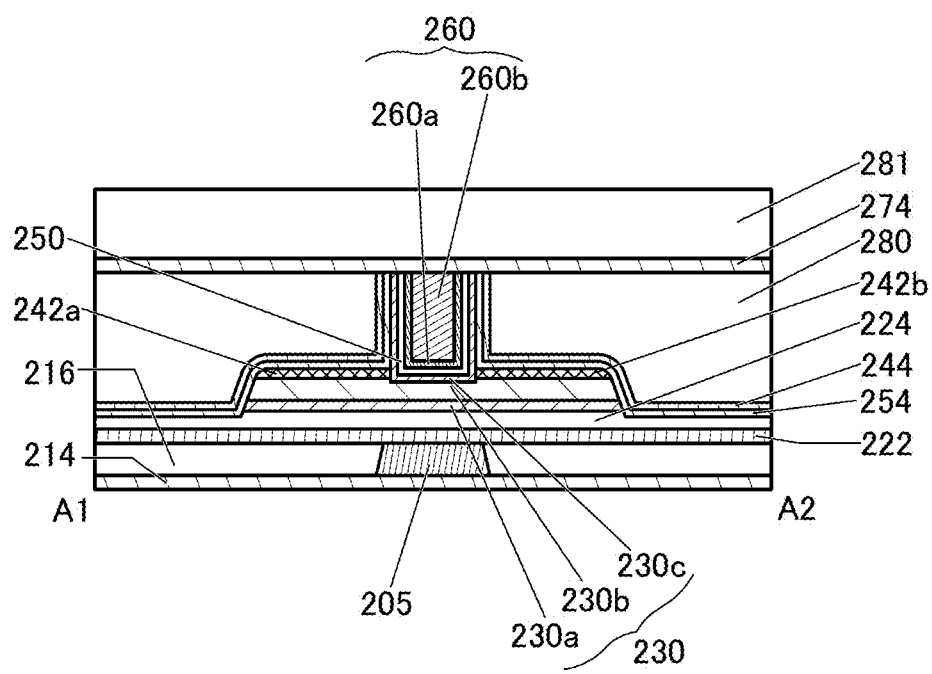

Then, the oxide film 230C, the insulating film 250A, the conductive film 260Aa, and the conductive film 260Ab are polished by CMP treatment until the insulator 280 is exposed, whereby the oxide 230c, the insulator 250, and the conductor 260 (the conductor 260a and the conductor 260b) are formed (see FIG. 9).

Next, heat treatment may be performed. For the heat treatment, the conditions for the above-described heat treatment can be used. By the heat treatment, the concentrations of moisture and hydrogen in the insulator 280 can be reduced.

Next, an insulating film to be the insulator 274 is formed over the insulator 280 (see FIG. 9). The insulating film to be the insulator 274 can be deposited by a sputtering method, a CVD method, an MBE method, a PLD method, an ALD method, or the like. An aluminum oxide film is preferably deposited as the insulating film to be the insulator 274 by a sputtering method, for example. When an aluminum oxide film is deposited by a sputtering method, hydrogen contained in the insulator 280 can be prevented from being diffused into the oxide 230 in some cases (see FIG. 9).

Next, heat treatment may be performed. For the heat treatment, the conditions for the above-described heat treatment can be used. By the heat treatment, the concentrations of moisture and hydrogen in the insulator 280 can be reduced.

Next, an insulating film to be the insulator 281 may be deposited over the insulator 274. The insulating film to be the insulator 281 can be deposited by a sputtering method, a CVD method, an MBE method, a PLD method, an ALD method, or the like (see FIG. 9).

Next, openings reaching the conductor 242a and the conductor 242b are formed in the insulator 254, the insulator 244, the insulator 280, the insulator 274, and the insulator 281. The openings may be formed by a lithography method.

Next, an insulating film to be the insulator 241 is deposited, and the insulating film is subjected to anisotropic etching to form the insulator 241. The insulating film can be deposited by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably deposited by an ALD method. For the anisotropic etching, a dry etching method may be employed, for example. By forming aluminum oxide on the side wall portions of the openings, the transmission of oxygen from the outside can be inhibited and oxidation of the conductor 240a and the conductor 240b can be prevented. Furthermore, impurities such as water and hydrogen can be prevented from being diffused from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting diffusion of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 3). Note that the insulator 281 is partly removed by the CMP treatment in some cases.

Through the above process, the semiconductor device including the transistor 200 illustrated in FIG. 3 can be manufactured. As illustrated in FIG. 4 to FIG. 9, with the use of the method for manufacturing the semiconductor device described in this embodiment, the transistor 200 can be formed.

According to one embodiment of the present invention, a semiconductor device having a high on-state current can be provided. According to one embodiment of the present invention, a semiconductor device having high frequency characteristics can be provided. According to one embodiment of the present invention, a semiconductor device with favorable reliability can be provided. According to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a semiconductor device with low power consumption can be provided. According to one embodiment of the present invention, a semiconductor device with high productivity can be provided.

The structure, method, and the like described above in this embodiment can be used in combination as appropriate with the structures, methods, and the like described in the other embodiments.

Modification Example of Semiconductor Device

An example of a semiconductor device including the transistor 200 of one embodiment of the present invention which is different from the semiconductor device described in <Structure example of semiconductor device> above and an example of a method for manufacturing the semiconductor device will be described below with reference to FIG. 10 to FIG. 20.

In FIG. 10 to FIG. 20, (A) of each drawing is a top view. Moreover, (B) of each drawing is a cross-sectional view corresponding to a portion indicated by a dashed-dotted line A1-A2 in FIG. 10(A), and is also a cross-sectional view in the channel length direction of the transistor 200. Furthermore, (C) of each drawing is a cross-sectional view corresponding to a portion indicated by a dashed-dotted line A3-A4 in FIG. 10(A), and is also a cross-sectional view in the channel width direction of the transistor 200. For clarity of the drawing, some components are not illustrated in the top view of (A) of each drawing.

Note that in the semiconductor device illustrated in FIG. 10 to FIG. 20, components having the same functions as the components in the semiconductor device described in <Structure example of semiconductor device> (see FIG. 3) are denoted by the same reference numerals. Note that in this section, the materials described in detail in <Structure example of semiconductor device> can be used as the constituent materials for the transistor 200.

The transistor 200 illustrated in FIG. 10 is different from the transistor 200 illustrated in FIG. 3 in that the insulator 244 is not included and the insulator 254 is provided between the insulator 280 and the insulator 224, the oxide 230a, the oxide 230b, the conductor 242a, and the conductor 242b. That is, the transistor 200 illustrated in FIG. 10 has a structure in which the side surface of the oxide 230c is in contact with the insulator 280.

In addition, in the transistor 200 illustrated in FIG. 10, the side surfaces of the conductor 242a and the conductor 242b on the conductor 260 side have a tapered shape, as in the transistor 10b illustrated in FIG. 1(B). Here, the angles formed by the side surfaces and the bottom surfaces of the conductor 242a and the conductor 242b may be greater than or equal to 100 and less than or equal to 80°, preferably greater than or equal to 300 and less than or equal to 60°. Thus, contribution of the electric field of the conductor 260 can be increased also in a region of the oxide 230 in the vicinity of the conductor 242a and the conductor 242b, and the on-state current and the frequency characteristics of the transistor 200 can be improved. Note that the transistor 200 illustrated in FIG. 10 is not limited to this, and as in the transistor 10a illustrated in FIG. 1(A), the side surfaces of the conductor 242a and the conductor 242b may be substantially perpendicular to the bottom surfaces. As in the transistor 10c illustrated in FIG. 1(C), the side surfaces of the conductor 242a and the conductor 242b that face each other may have a plurality of surfaces.

The semiconductor device illustrated in FIG. 10 is preferable because it can be manufactured without forming the dummy gate 262 and thus the manufacturing process of the semiconductor device can be simplified.

The method for manufacturing the semiconductor device illustrated in FIG. 10 up to the formation of the oxide 230a, the oxide 230b, and the conductor layer 242B is similar to the method for manufacturing the semiconductor device illustrated in FIG. 3. Therefore, the method for manufacturing the semiconductor device in FIG. 4 and FIG. 5 can be referred to.

Then, the insulating film 254A is deposited over the insulator 224, the oxide 230a, the oxide 230b, and the conductor layer 242B.

Next, an insulating film to be the insulator 280 is deposited over the insulating film 254A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed.

Figure 11A:
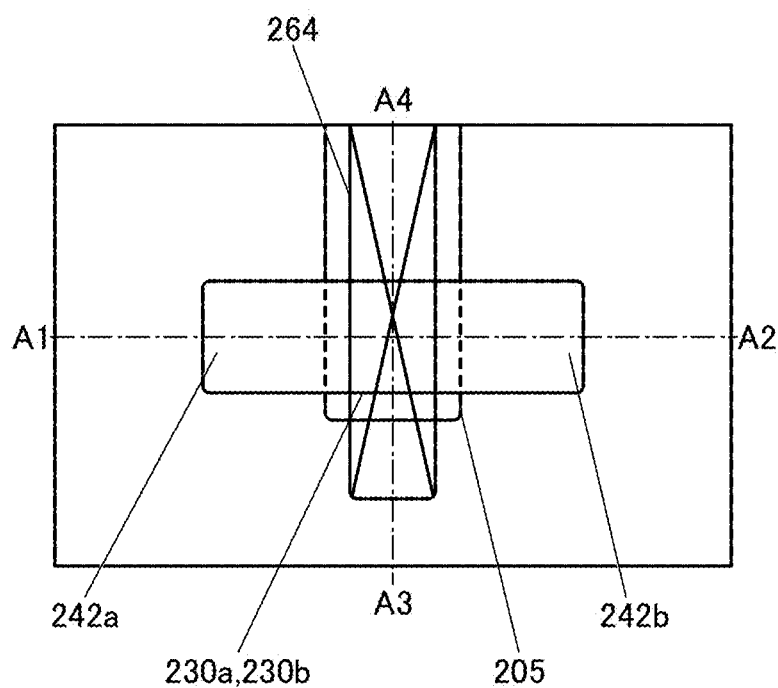
FIGS. 11A to 11C A top view and cross-sectional views illustrating a method for manufacturing a semiconductor device of one embodiment of the present invention.
Figure 11C:
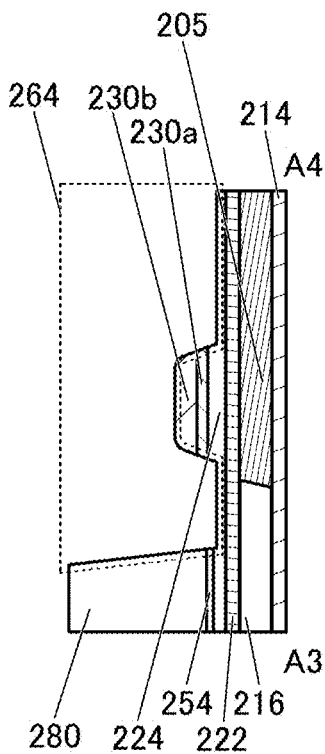
Figure 11B:
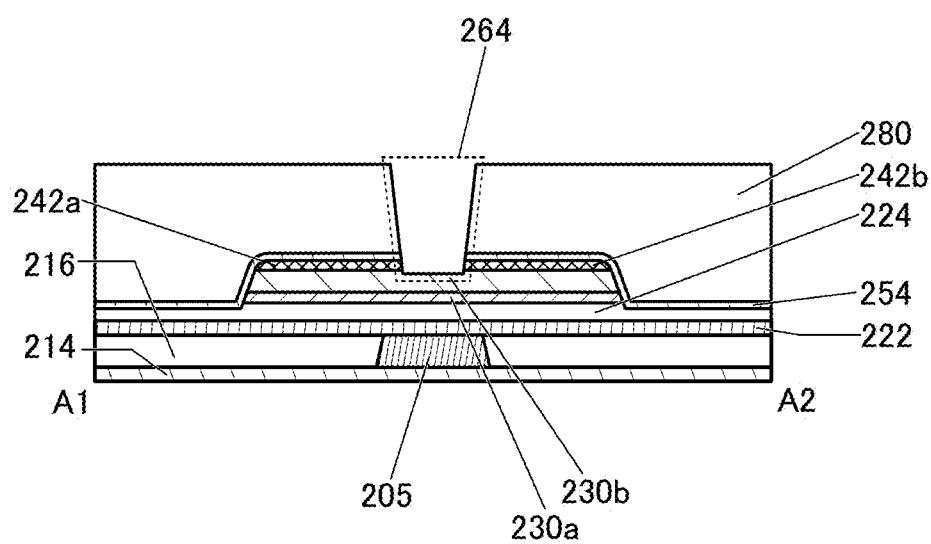

Next, part of the insulator 280, part of the insulating film 254A, and part of the conductor layer 242B are removed to form an opening 264 reaching the oxide 230b (see FIG. 11). The opening is preferably formed to overlap with the oxide 230a, the oxide 230b, and the conductor 205. The conductor 242a, the conductor 242b, and the insulator 254 are formed by forming the opening 264. Here, the part of the top surface of the oxide 230b that is exposed between the conductor 242a and the conductor 242b is removed in some cases.

The opening 264 may be formed by wet etching; however, dry etching is preferably used because microfabrication is possible. The opening 264 is preferably formed with a hard mask formed over the insulator 280. As the hard mask, a conductor may be used or an insulator may be used.

The part of the insulator 280, the part of the insulating film 254A, and the part of the conductor may be processed under different conditions. For example, the part of the insulator 280 may be processed by a dry etching method, the part of the insulating film 254A may be processed by a wet etching method, and the part of the conductor layer 242B may be processed by a dry etching method.

The following steps in the method for manufacturing the semiconductor device illustrated in FIG. 10 are similar to those in the method for manufacturing the semiconductor device illustrated in FIG. 3. Therefore, the method for manufacturing the semiconductor device in FIG. 8 and FIG. 9 can be referred to.

The transistor 200 illustrated in FIG. 12 is different from the transistor 200 illustrated in FIG. 3 in that a conductor 243a is provided between the conductor 242a and the oxide 230b and a conductor 243b is provided between the conductor 242b and the oxide 230b. Here, the conductor 242a (the conductor 242b) is provided in contact with a top surface and a side surface on the conductor 260 side of the conductor 243a (the conductor 243b) and the top surface of the oxide 230b. Here, as the conductor 243, a conductor that can be used as the conductor 242 may be used. Furthermore, the thickness of the conductor 243 is preferably larger than at least that of the conductor 242.

The transistor 200 illustrated in FIG. 12 is different from the transistor 200 illustrated in FIG. 3 in that the distance between the conductor 242a and the conductor 242b is shorter than the length of the opening 263 formed in the insulator 280, the insulator 244, and the insulator 254 in the channel length direction.

When the transistor 200 illustrated in FIG. 12 has the above structure, the contribution of the electric field of the conductor 260 can be increased also in the region of the oxide 230 in the vicinity of the conductor 242a and the conductor 242b. Thus, the substantial channel length of the transistor 200 can be shortened, so that the on-state current and the frequency characteristics can be improved.

The conductor 243a (the conductor 243b) is preferably provided to overlap with the conductor 240a (the conductor 240b). With this structure, the conductor 243a (the conductor 243b) is provided in a bottom portion of the opening, and thus the oxide 230b can be prevented from being overetched in the etching for forming the opening where the conductor 240a (the conductor 240b) is embedded.

In the transistor 200 illustrated in FIG. 12, the side surfaces of the conductor 242a and the conductor 242b on the conductor 260 side have a substantially perpendicular shape, as in the transistor 10a illustrated in FIG. 1(A). Note that the transistor 200 illustrated in FIG. 12 is not limited thereto, and as in the transistor 10b illustrated in FIG. 1(B), angles formed by side surfaces and bottom surfaces of the conductor 242a and the conductor 242b may be greater than or equal to 100 and less than or equal to 80°, preferably greater than or equal to 30° and less than or equal to 60°. As in the transistor 10c illustrated in FIG. 1(C), the side surfaces of the conductor 242a and the conductor 242b that face each other may have a plurality of surfaces.

The method for manufacturing the semiconductor device illustrated in FIG. 12 up to the deposition of the oxide film 230B to be the oxide 230b is similar to the method for manufacturing the semiconductor device illustrated in FIG. 3. Therefore, the method for manufacturing the semiconductor device in FIG. 4 can be referred to.

Next, a conductive film to be the conductor layer 243A is deposited over the oxide film 230B. The conductive film to be the conductor layer 243A can be deposited by a sputtering method, a CVD method, an MBE method, a PLD method, an ALD method, or the like.

Figure 13A:
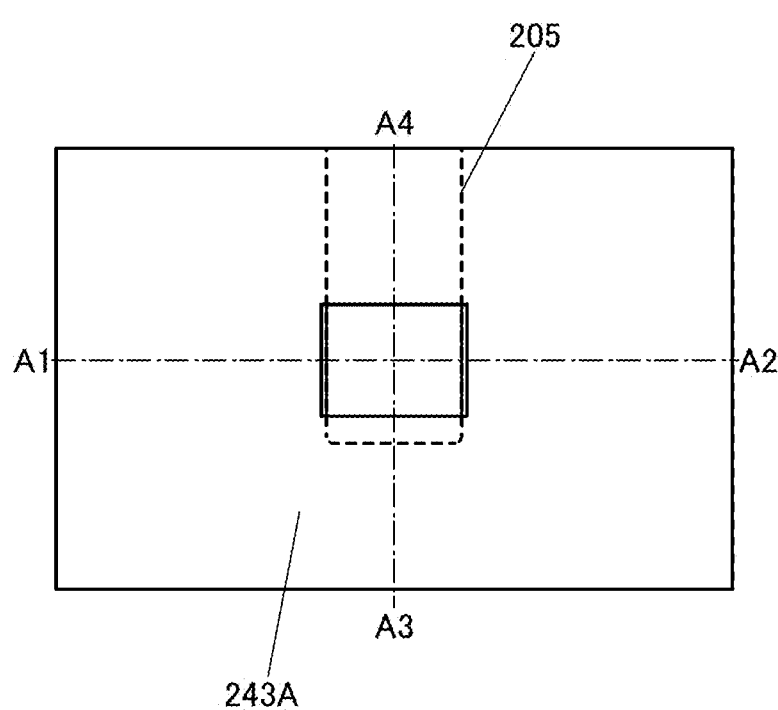
FIGS. 13A to 13C A top view and cross-sectional views illustrating a method for manufacturing a semiconductor device of one embodiment of the present invention.
Figure 13C:
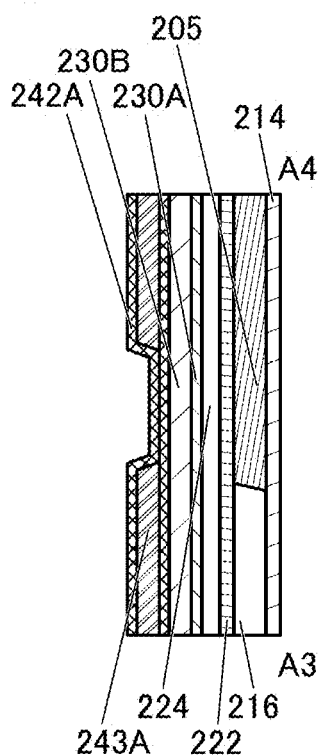
Figure 13B:
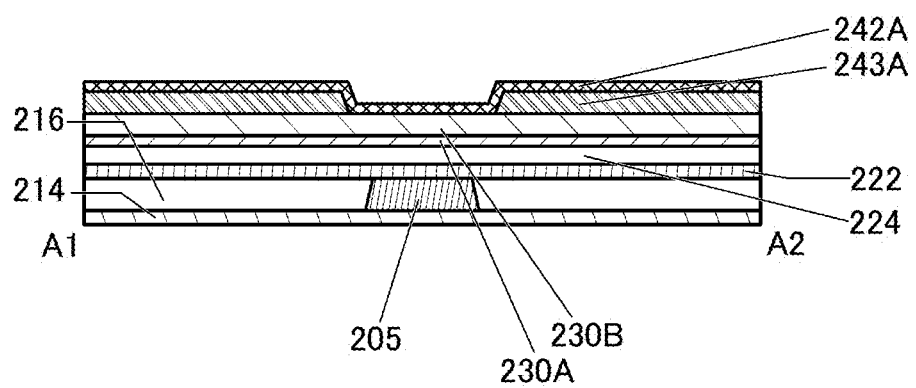
Figure 14A:
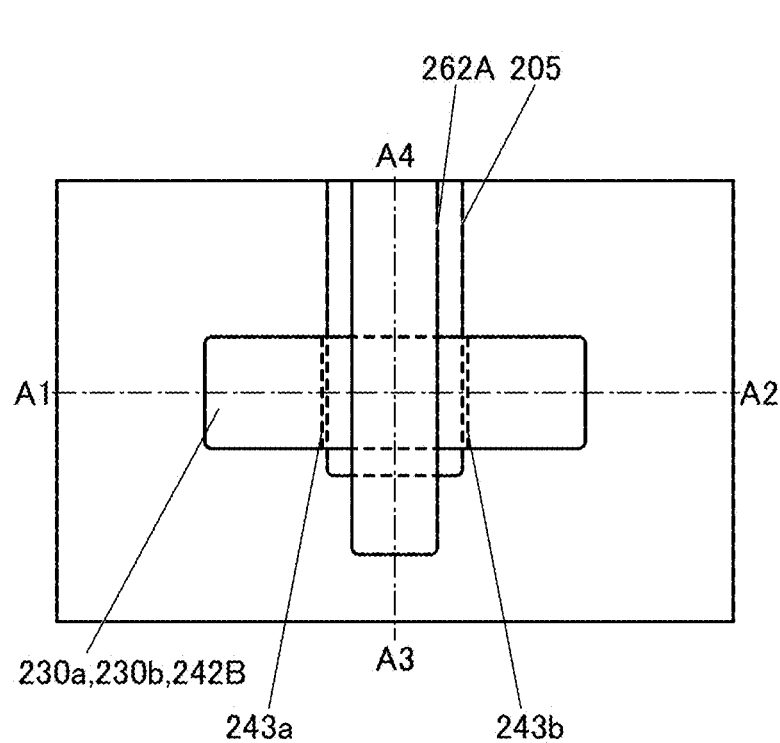
FIGS. 14A to 14C A top view and cross-sectional views illustrating a method for manufacturing a semiconductor device of one embodiment of the present invention.
Figure 14C:
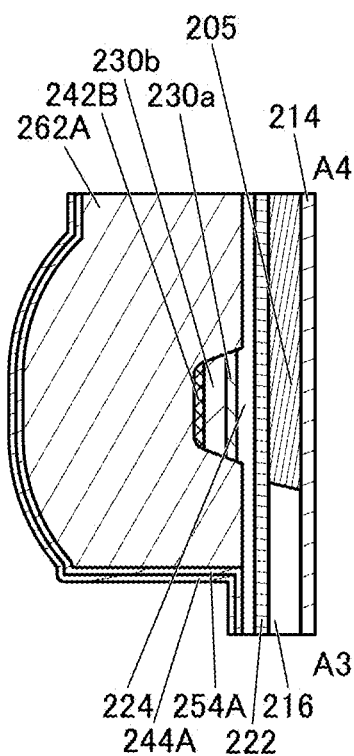
Figure 14B:
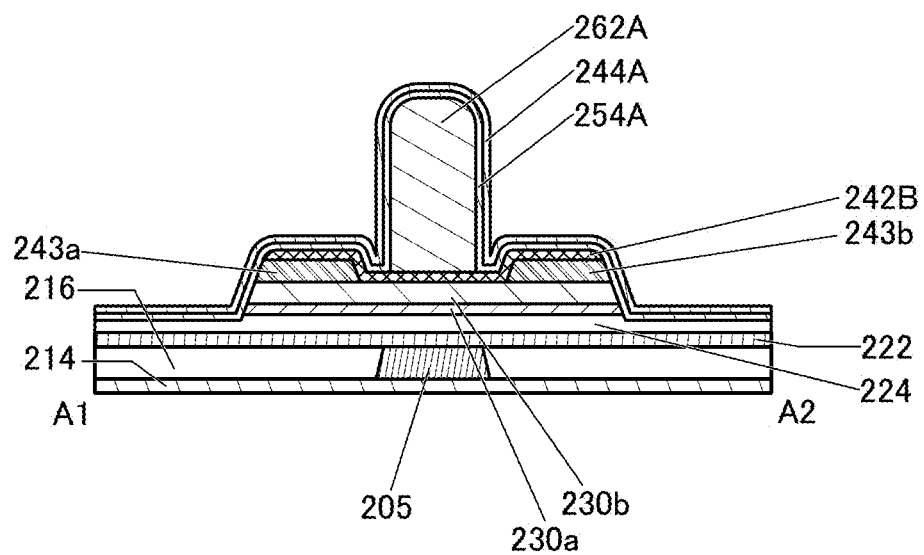

Next, part of the conductive film to be the conductor layer 243A is removed to form the conductor layer 243A (see FIG. 13). Although the conductor layer 243A has an opening in FIG. 13, this embodiment is not limited to this. In this step, a portion of the conductive film to be the conductor layer 243A that corresponds to a region between the conductor 243a and the conductor 243b is removed. For example, the conductive film to be the conductor layer 243A may be divided into an island-shaped conductor corresponding to the conductor 243a and an island-shaped conductor corresponding to the conductor 243b.

The conductive film to be the conductor layer 243A may be processed by a lithography method. The processing can be performed by a dry etching method or a wet etching method. The processing by a dry etching method is suitable for microfabrication.

Next, the conductive film 242A is deposited over the oxide 230b and the conductor layer 243A. For the deposition of the conductive film 242A, the method for manufacturing the semiconductor device in FIG. 5 can be referred to.

The following steps up to the formation of the dummy gate layer 262A and the deposition of the insulating film 254A and the insulating film 244A (see FIG. 14) are similar to those in the method for manufacturing the semiconductor device illustrated in FIG. 3. Therefore, the method for manufacturing the semiconductor device in FIG. 5 and FIG. 6 can be referred to.

For example, aluminum oxide may be deposited as the insulating film 244A while the substrate is being heated at high temperature. The substrate heating temperature in the deposition of the insulating film 244A is higher than or equal to 200° C., preferably higher than or equal to 250° C., further preferably higher than or equal to 350° C. By deposition of aluminum oxide as the insulating film 254A by an ALD method at this time, when the insulating film 244A is deposited at the above temperature, the dummy gate layer 262A can be prevented from being deformed.

Furthermore, fluorine may be added after the deposition of one or both of the insulating film 244A and the insulating film 254A. The addition of fluorine to one or both of the insulating film 244A and the insulating film 254A can be performed in such a manner that plasma treatment is performed in an atmosphere containing a fluorine-based gas (e.g. CF$_4$) or a gas containing fluorine is doped. When fluorine is added to one or both of the insulating film 244A and the insulating film 254A, hydrogen contained in the film can be expected to be terminated or gettered by fluorine.

Next, the insulating film to be the insulator 280 is deposited over the insulator 244A. The insulating film to be the insulator 280 can be deposited by a sputtering method, a CVD method, an MBE method, a PLD method, an ALD method, or the like.

Next, the insulating film to be the insulator 280, the dummy gate layer 262A, the insulating film 254A, and the insulating film 244A are partly removed until part of the dummy gate layer 262A is exposed, and thus, the insulator 280, the dummy gate 262, the insulator 254, and the insulator 244 are formed. CMP treatment is preferably employed for forming the insulator 280, the dummy gate 262, the insulator 254, and the insulator 244. The method for manufacturing a semiconductor device in FIG. 7 can be referred to for the details.

Next, the dummy gate 262 is removed to form the opening 263 (see FIG. 8). The dummy gate 262 can be removed by wet etching, dry etching, ashing, or the like. Alternatively, a plurality of the above treatments may be performed in combination as appropriate. For example, wet etching treatment may be performed after ashing treatment. By removing the dummy gate 262, part of the surface of the conductor layer 242B is exposed from the opening 263.

Figure 15A:
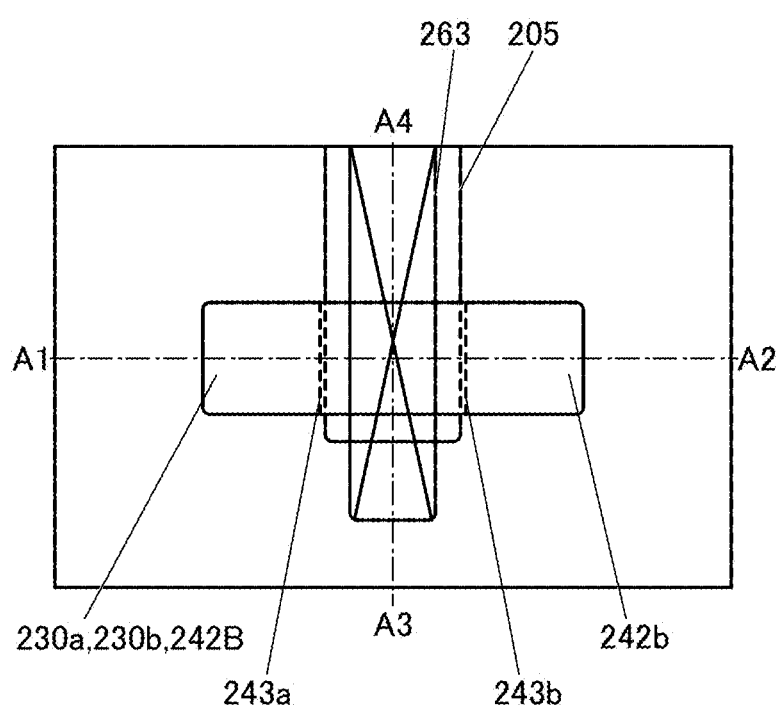
FIGS. 15A to 15C A top view and cross-sectional views illustrating a method for manufacturing a semiconductor device of one embodiment of the present invention.
Figure 15C:
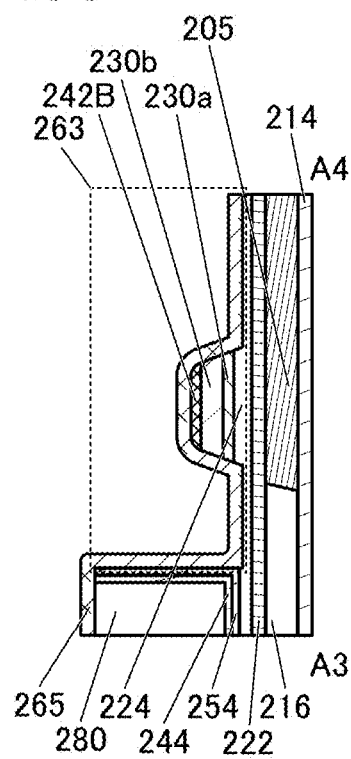
Figure 15B:
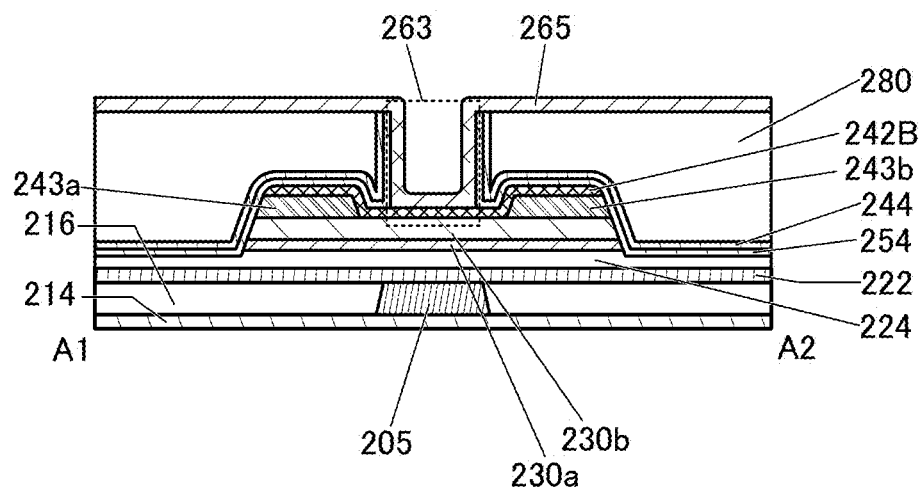
Figure 16A:
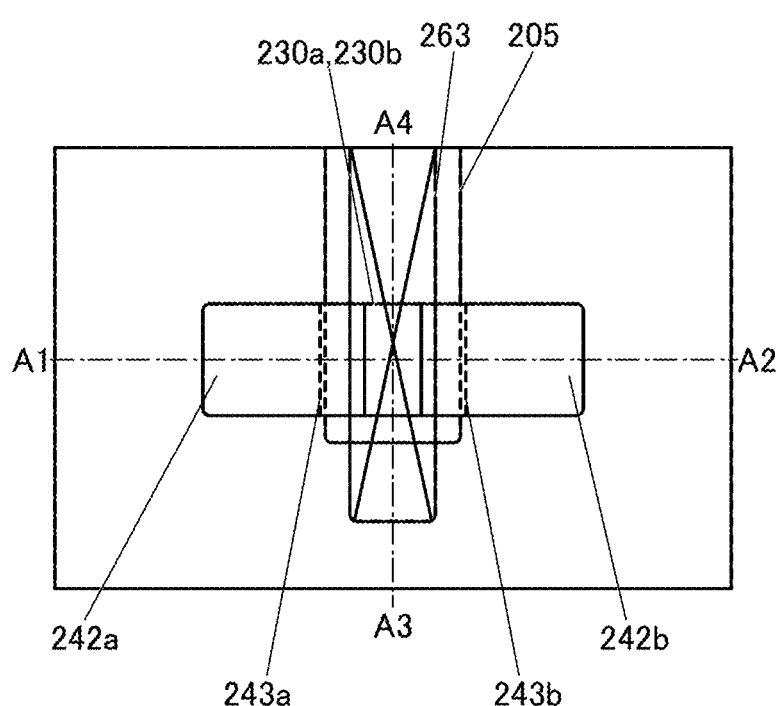
FIGS. 16A to 16C A top view and cross-sectional views illustrating a method for manufacturing a semiconductor device of one embodiment of the present invention.
Figure 16C:
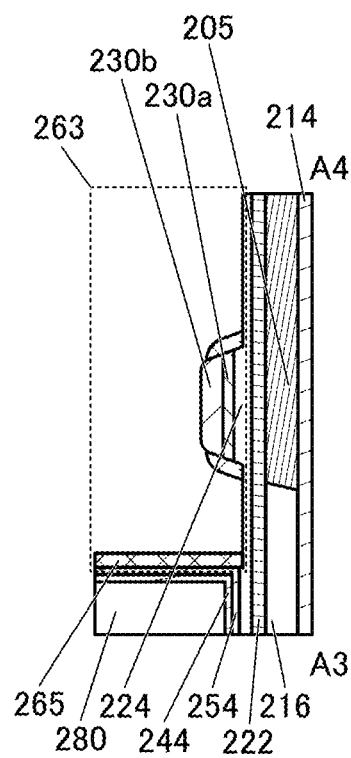
Figure 16B:
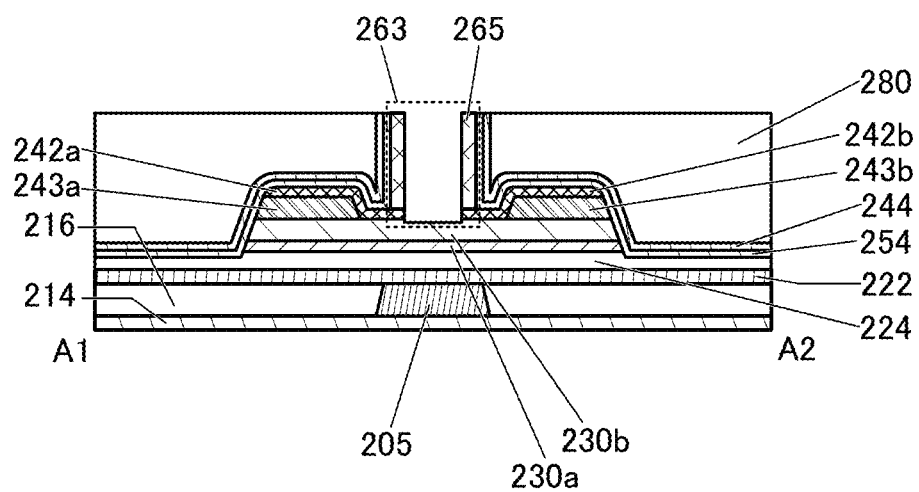

Next, a dummy film 265 is deposited over the insulator 280, the insulator 244, the insulator 254, and the conductor layer 242B (see FIG. 15). The dummy film 265 needs to be deposited on a side wall of the opening 263, and thus the distance between the conductor 242a and the conductor 242b, that is, the substantial channel length depends on the thickness of the dummy film. Therefore, the dummy film 265 is preferably deposited by an ALD method with which high coverage can be achieved and minor adjustment on the thickness is relatively easy. The thickness of the dummy film 265 may be set as appropriate in accordance with required electrical characteristics of the transistor 200; when the thickness is set to 5 nm, for example, the channel length can be substantially reduced by 10 nm. Note that the dummy film 265 is finally removed; therefore, it is preferable to use a film that is easily microfabricated and easily removed.

Next, the dummy film 265 is subjected to anisotropic etching, and only a portion of the dummy film 265 in contact with the side wall of the opening 263 remains. Moreover, the conductor layer 242B is etched using the remaining dummy film 265 as a mask to form the conductor 242a and the conductor 242b (see FIG. 16). Note that the etching of the dummy film 265 and the etching of the conductor layer 242B may be performed successively. The part of the top surface of the oxide 230b that is exposed between the conductor 242a and the conductor 242b is removed in some cases.

At this time, the conductor 242a and the conductor 242b are formed using the remaining dummy film 265 as a mask. Thus, the opening 263 formed in the insulator 280, the insulator 244, and the insulator 254 overlaps with the region between the conductor 242a and the conductor 242b. In this manner, the conductor 260 can be formed between the conductor 242a and the conductor 242b in a self-aligned manner in a later step.

Figure 17A:
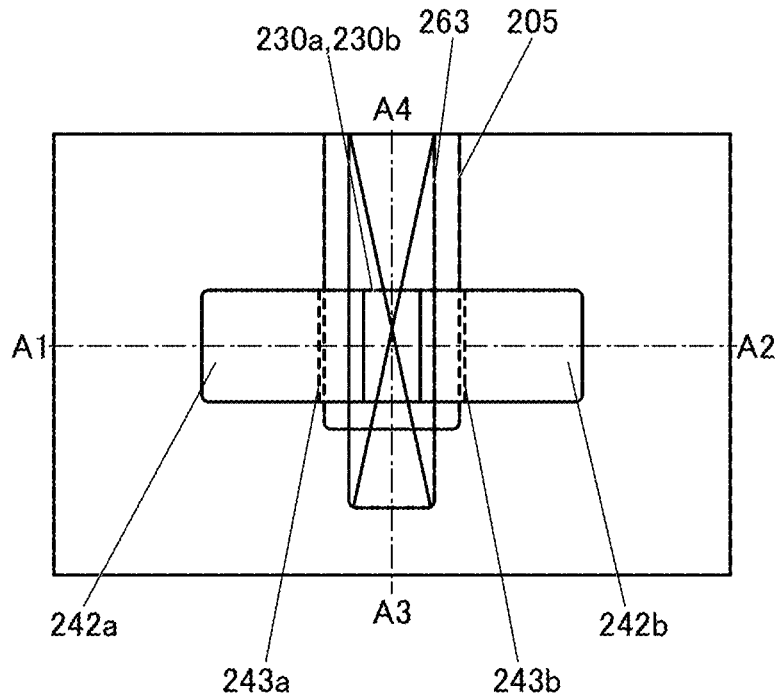
FIGS. 17A to 17C A top view and cross-sectional views illustrating a method for manufacturing a semiconductor device of one embodiment of the present invention.
Figure 17C:
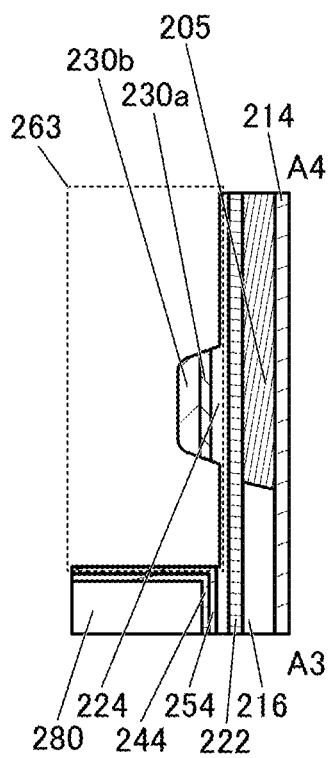
Figure 17B:
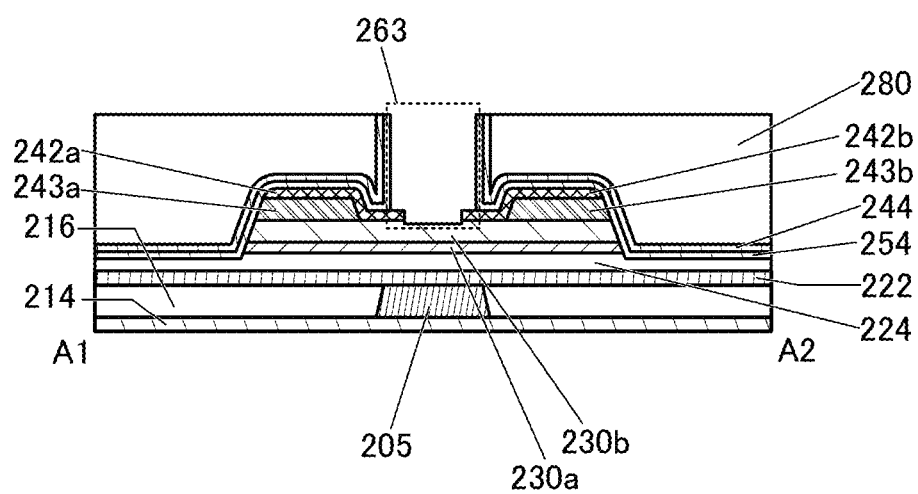

Next, the remaining dummy film 265 is selectively removed by isotropic etching (see FIG. 17). As the isotropic etching, wet etching or etching using a reactive gas is performed, for example. In this manner, the distance between the conductor 242a and the conductor 242b can be made shorter than the length of the opening 263 in the channel length direction.

The following steps in the method for manufacturing the semiconductor device illustrated in FIG. 12 are similar to those in the method for manufacturing the semiconductor device illustrated in FIG. 3. Therefore, the method for manufacturing the semiconductor device in FIG. 8 and FIG. 9 can be referred to.

Figure 18A:
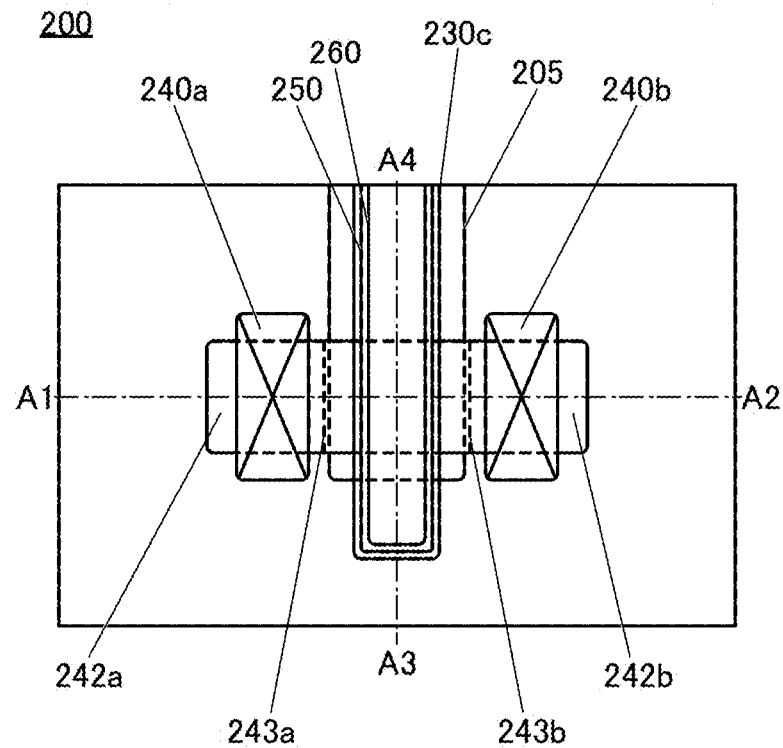
FIGS. 18A to 18C A top view and cross-sectional views of a semiconductor device of one embodiment of the present invention.
Figure 18C:
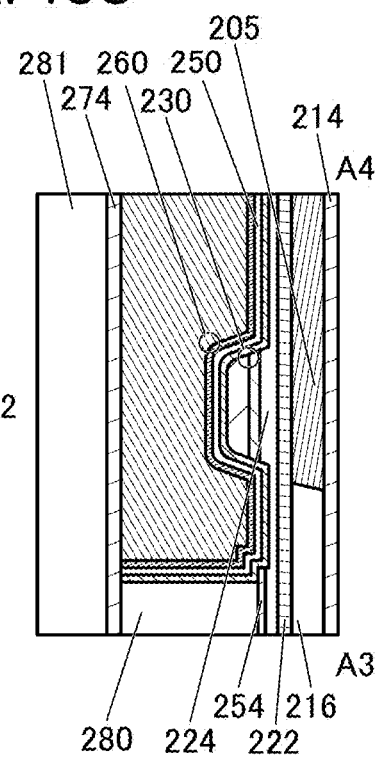
Figure 18B:
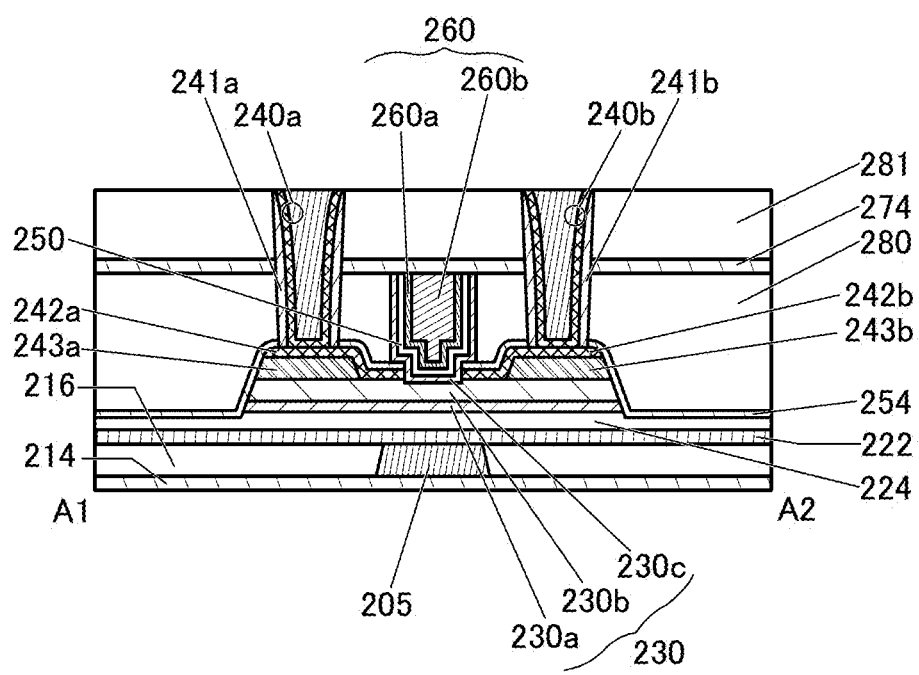

The transistor 200 illustrated in FIG. 18 is different from the transistor 200 illustrated in FIG. 12 in that the insulator 244 is not included and the insulator 254 is provided between the insulator 280 and the insulator 224, the oxide 230a, the oxide 230b, the conductor 243a, the conductor 243b, the conductor 242a, and the conductor 242b. That is, the transistor 200 illustrated in FIG. 18 has a structure in which the side surface of the oxide 230c is in contact with the insulator 280.

In the transistor 200 illustrated in FIG. 18, the side surfaces of the conductor 242a and the conductor 242b on the conductor 260 side have a substantially perpendicular shape, as in the transistor 10a illustrated in FIG. 1(A). Note that the transistor 200 illustrated in FIG. 18 is not limited thereto, and as in the transistor 10b illustrated in FIG. 1(B), angles formed by side surfaces and bottom surfaces of the conductor 242a and the conductor 242b may be greater than or equal to 10° and less than or equal to 80°, preferably greater than or equal to 30° and less than or equal to 60°. As in the transistor 10c illustrated in FIG. 1(C), the side surfaces of the conductor 242a and the conductor 242b that face each other may have a plurality of surfaces.

The semiconductor device illustrated in FIG. 18 is preferable because it can be manufactured without forming the dummy gate 262 and thus the manufacturing process of the semiconductor device can be simplified.

The method for manufacturing the semiconductor device illustrated in FIG. 18 up to the formation of the oxide 230a, the oxide 230b, the conductor 242a, the conductor 242b, and the conductor layer 242B is similar to the method for manufacturing the semiconductor device illustrated in FIG. 12. Therefore, the methods for manufacturing the semiconductor devices in FIG. 4, FIG. 5, and FIG. 13 can be referred to.

Then, the insulating film 254A is deposited over the insulator 224, the oxide 230a, the oxide 230b, the conductor 243a, the conductor 243b, and the conductor layer 242B.

Next, the insulating film to be the insulator 280 is deposited over the insulating film 254A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed.

Figure 19A:
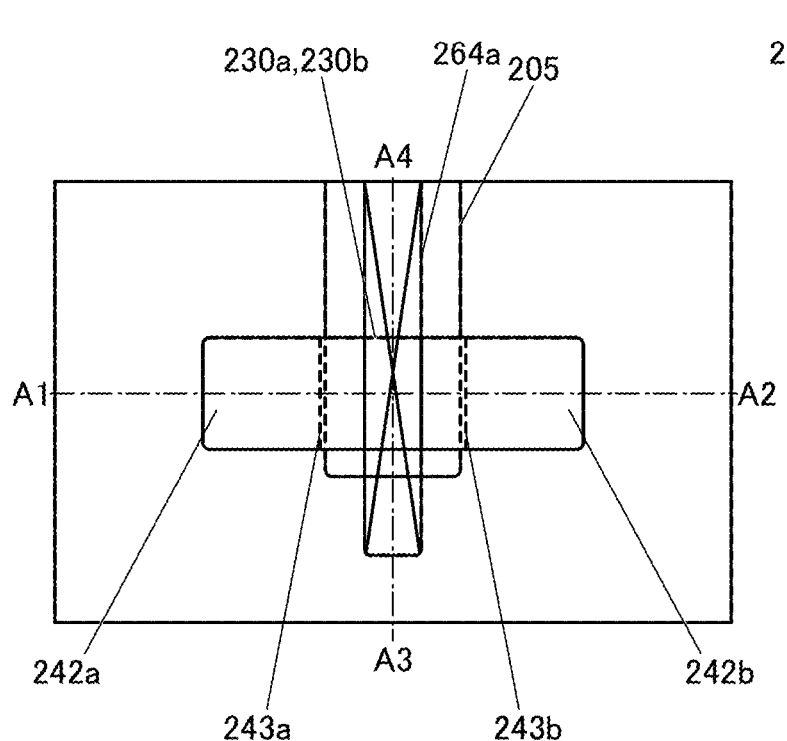
FIGS. 19A to 19C A top view and cross-sectional views illustrating a method for manufacturing a semiconductor device of one embodiment of the present invention.
Figure 19C:
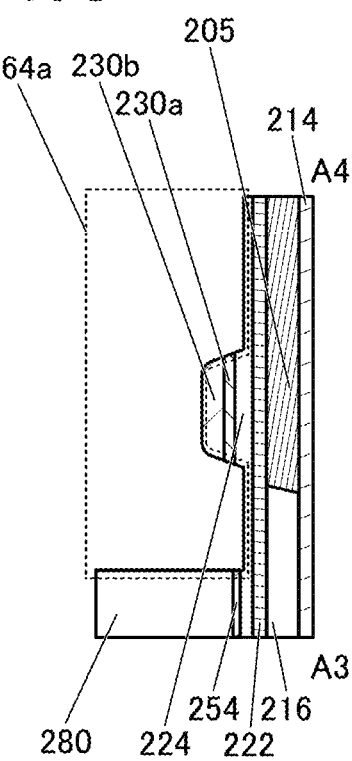
Figure 19B:
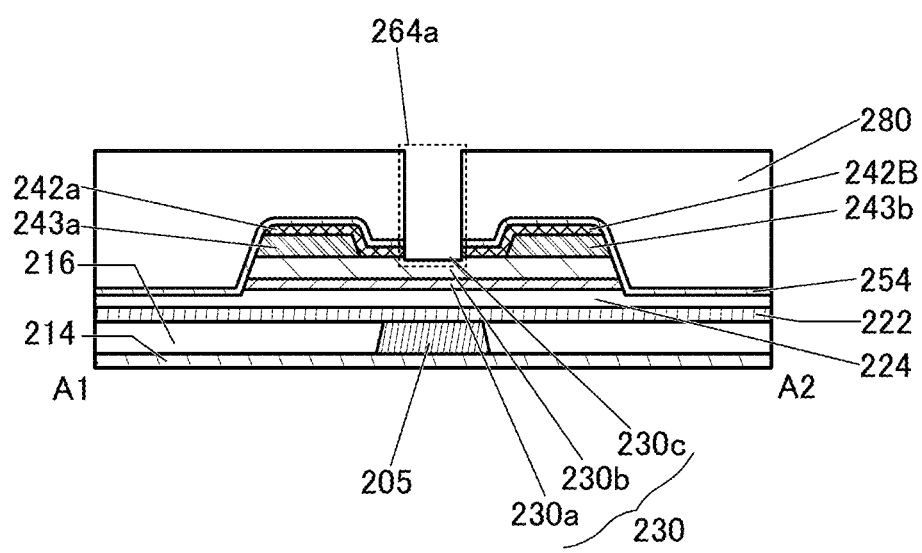

Next, the part of the insulator 280, the part of the insulating film 254A, and the part of the conductor layer 242B are removed to form an opening 264a reaching the oxide 230b (see FIG. 19). The opening is preferably formed to overlap with the oxide 230a, the oxide 230b, and the conductor 205. The conductor 242a, the conductor 242b, and the insulator 254 are formed by forming the opening 264a. Here, the part of the top surface of the oxide 230b that is exposed between the conductor 242a and the conductor 242b is removed in some cases.

The opening 264a may be formed by wet etching; however, dry etching is preferably used because microfabrication is possible. The opening 264a is preferably formed with a hard mask formed over the insulator 280. As the hard mask, a conductor may be used or an insulator may be used.

The part of the insulator 280, the part of the insulating film 254A, and the part of the conductor may be processed under different conditions. For example, the part of the insulator 280 may be processed by a dry etching method, the part of the insulating film 254A may be processed by a wet etching method, and the part of the conductor layer 242B may be processed by a dry etching method.

Figure 20A:
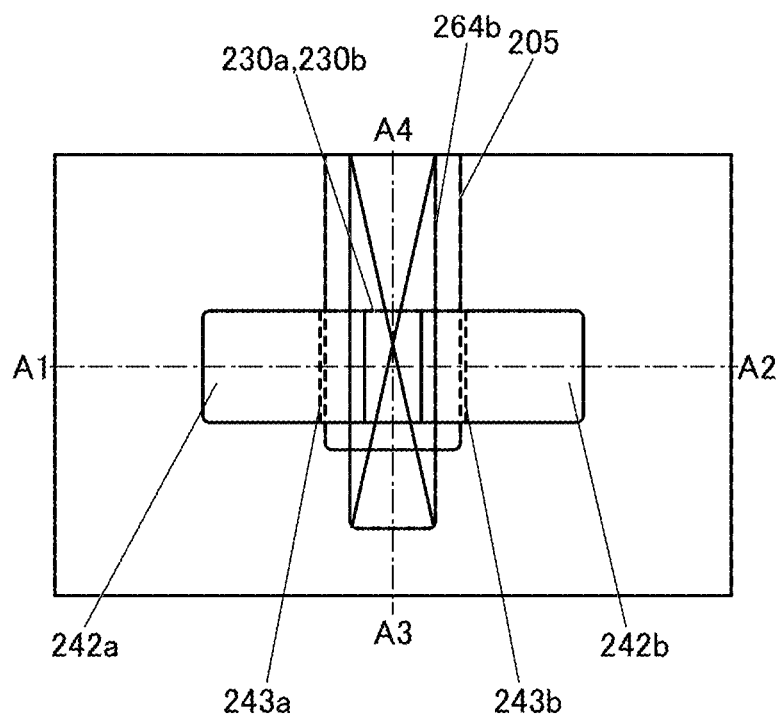
FIGS. 20A to 20C A top view and cross-sectional views illustrating a method for manufacturing a semiconductor device of one embodiment of the present invention.
Figure 20C:
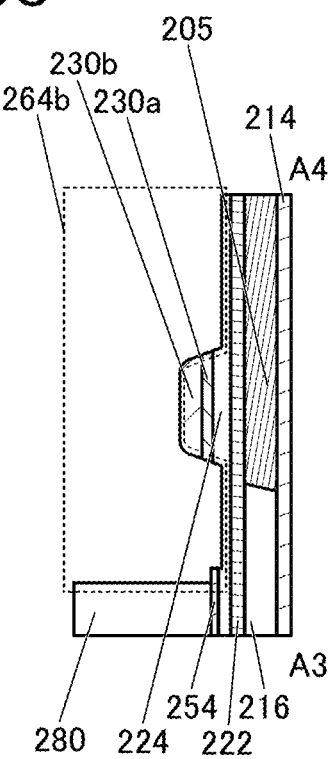
Figure 20B:
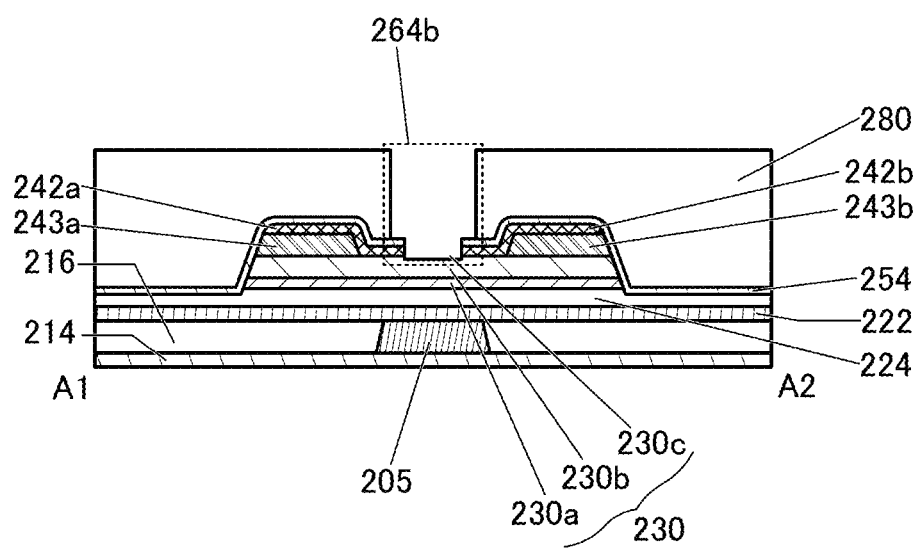

Next, the opening 264a in the insulator 280 is subjected to side etching to form an opening 264b (see FIG. 20). As the side etching of the insulator 280, isotropic etching such as wet etching or etching using a reactive gas may be used. For example, a side wall of the opening 264b is recessed from the opening 264a by 5 nm, whereby the conductor 242a (the conductor 242b) can be protruded from the side wall of the opening 264b by 5 nm. In this manner, the distance between the conductor 242a and the conductor 242b can be shorter than the length of the opening 264b in the channel length direction.

The following steps in the method for manufacturing the semiconductor device illustrated in FIG. 18 are similar to those in the method for manufacturing the semiconductor device illustrated in FIG. 3. Therefore, the method for manufacturing the semiconductor device in FIG. 8 and FIG. 9 can be referred to.

The structure, composition, method, and the like described above in this embodiment can be used in appropriate combination with the structures, compositions, methods, and the like described in the other embodiments.

Embodiment 3

In this embodiment, one embodiment of a semiconductor device will be described with reference to FIG. 21 and FIG. 22.

[Memory Device 1]

Figure 21:
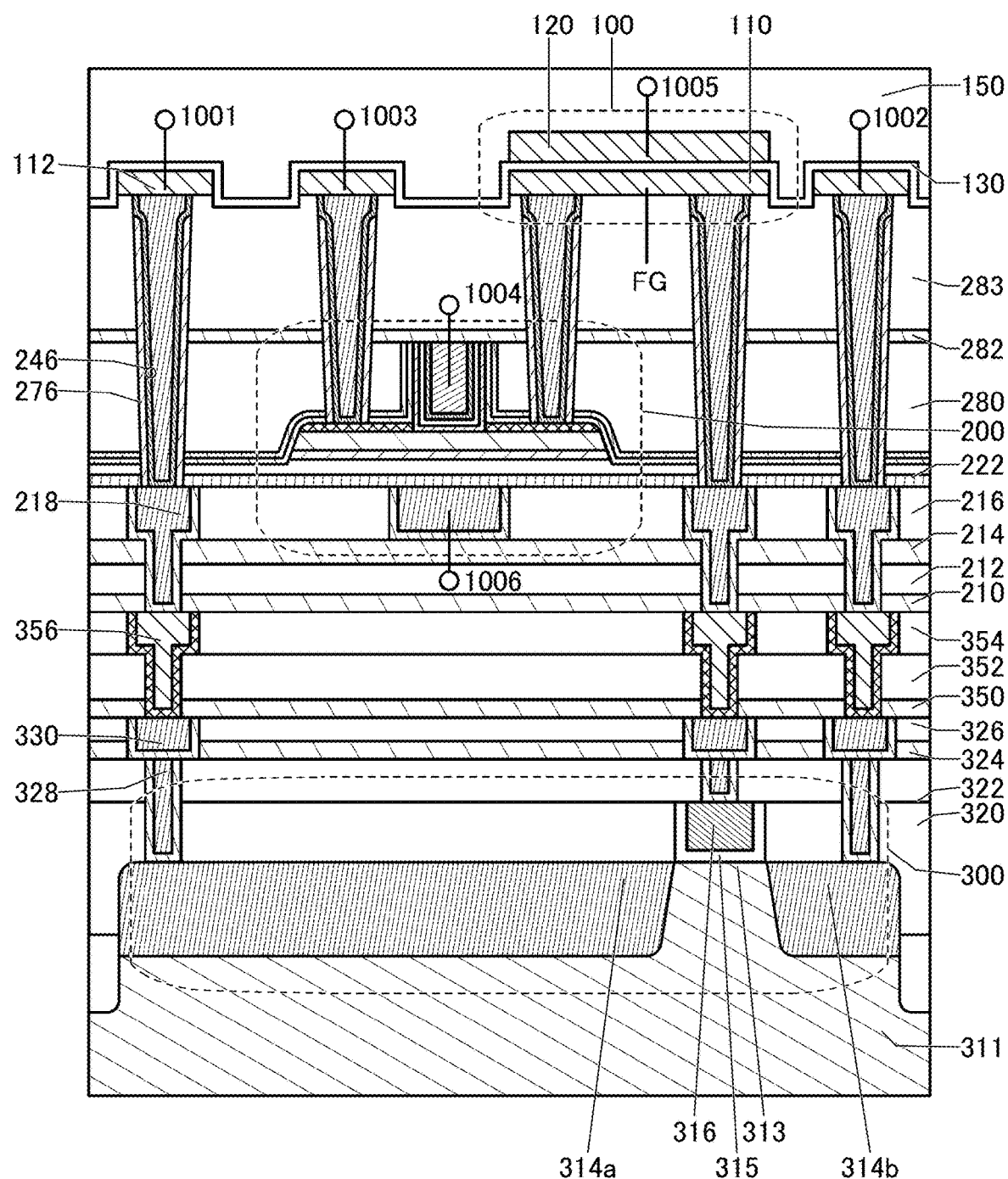
FIG. 21 A cross-sectional view illustrating a structure of a memory device of one embodiment of the present invention.

FIG. 21 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200, for example.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 21, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 21 in a matrix, a memory cell array can be formed.

<Transistor 300>

The transistor 300 is provided over a substrate 311 and includes a conductor 316 functioning as a gate electrode, an insulator 315 functioning as a gate insulator, a semiconductor region 313 that is a part of the substrate 311, and a low-resistance region 314a and a low-resistance region 314b functioning as the source region and the drain region. The transistor 300 is of either a p-channel type or an n-channel type.

In the transistor 300 illustrated in FIG. 21, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 21 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 246 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 21, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

Examples of the insulator with a high dielectric constant (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 21, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, the insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, the parasitic capacitance generated between wirings can be reduced. Thus, a material is preferably selected depending on the function of an insulator.

For example, as the insulator 150, the insulator 212, the insulator 352, the insulator 354, and the like, an insulator having a low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic When the transistor using an oxide semiconductor is surrounded by an insulator that has a function of inhibiting the transmission of oxygen and impurities such as hydrogen, the electrical characteristics of the transistor can be stable. Thus, an insulator having a function of inhibiting the transmission of oxygen and impurities such as hydrogen is preferably used for the insulator 210, the insulator 350, and the like.

As an insulator having a function of inhibiting the transmission of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or a stacked layer of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 276 is preferably provided between the insulator 224 and the conductor 246 in FIG. 21. In particular, the conductor 246 is preferably provided in contact with the insulator 224 containing an excess oxygen region, and the insulator 222, the insulator 254, and the insulator 244 which sandwich the insulator 224. Since the insulator 276 is provided in contact with the insulator 222 and the insulator 281, the insulator 224 and the transistor 200 can be sealed by the insulators having a barrier property. It is also preferable that the insulator 276 be in contact with part of the insulator 280. When the insulator 276 extends to the insulator 280, diffusion of oxygen and impurities can be further inhibited.

That is, when the insulator 276 is provided, absorption of excess oxygen contained in the insulator 224 by the conductor 246 can be inhibited. In addition, when the insulator 276 is included, diffusion of hydrogen, which is an impurity, into the transistor 200 through the conductor 246 can be inhibited.

For the insulator 276, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 22:
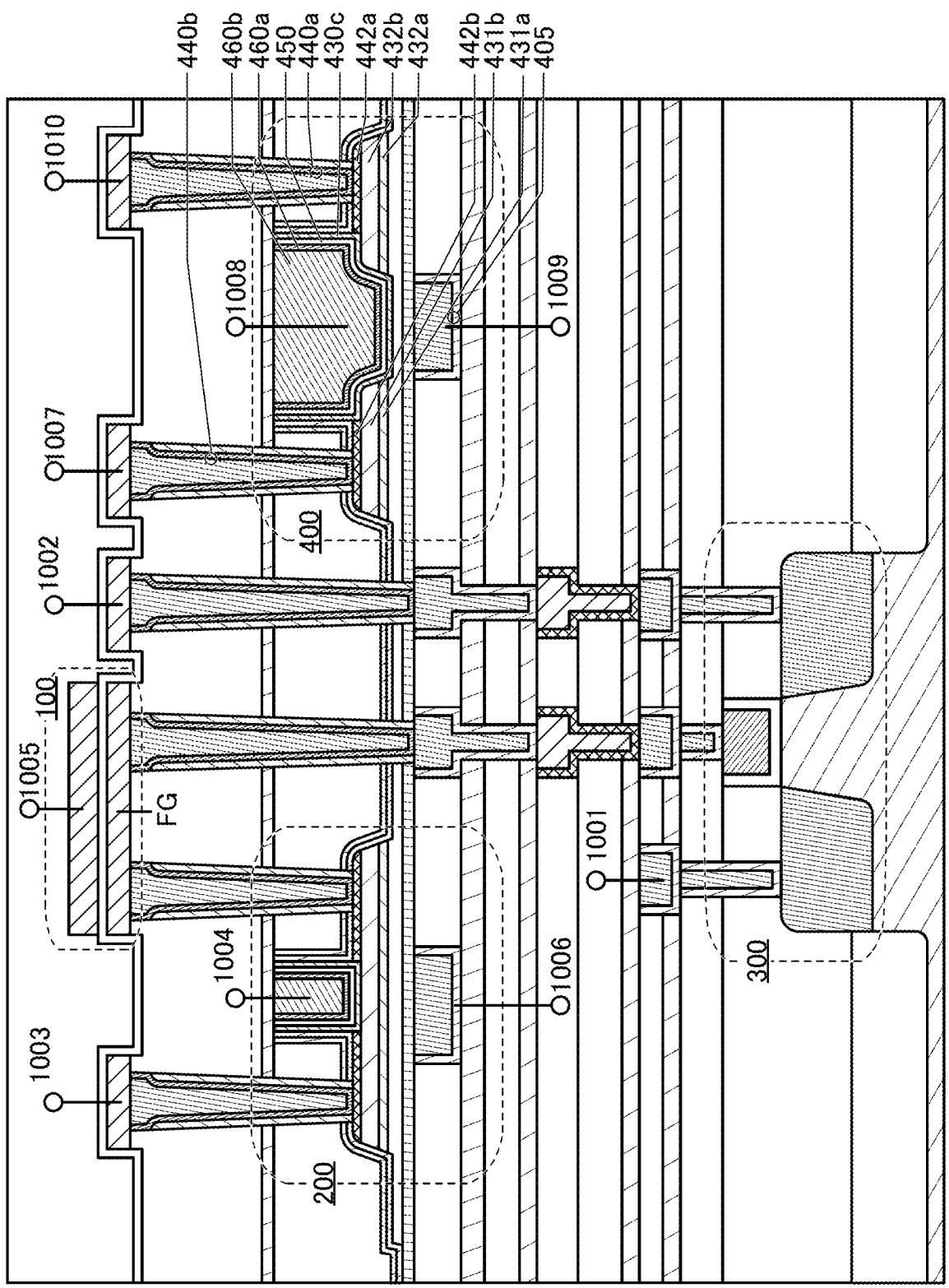
FIG. 22 A cross-sectional view illustrating a structure of a memory device of one embodiment of the present invention.

FIG. 22 illustrates an example of a memory device using the semiconductor device of one embodiment of the present invention. The memory device illustrated in FIG. 22 includes a transistor 400 in addition to the semiconductor device including the transistor 200, the transistor 300, and the capacitor 100 illustrated in FIG. 21.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 22, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 22 are arranged in a matrix like the memory devices illustrated in FIG. 21, a memory cell array can be formed. Note that one transistor 400 can control second gate voltages of the transistors 200. For this reason, the number of provided transistors 400 is preferably smaller than the number of transistors 200.

[Transistor 400]

The transistor 400 and the transistors 200 are formed in the same layer and thus can be fabricated in parallel. The transistor 400 includes a conductor 460 (a conductor 460a and a conductor 460b) functioning as a first gate electrode; a conductor 405 (a conductor 405a and a conductor 405b) functioning as a second gate electrode; the insulator 222, the insulator 224, and an insulator 450 each functioning as a gate insulating layer; an oxide 430c including a region where a channel is formed; a conductor 442a functioning as one of a source and a drain; an oxide 431a and an oxide 431b; a conductor 442b functioning as the other of the source and the drain; an oxide 432a and an oxide 432b; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 430c is in the same layer as the oxide 230c. The insulator 450 is in the same layer as the insulator 250. The conductor 460 is in the same layer as the conductor 260.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<<Dicing Line>>

A dicing line (also referred to as a scribe line, a dividing line, or a cutting line in some cases) that is provided when a large-sized substrate is divided into semiconductor elements so that a plurality of semiconductor devices are each formed in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 22, it is preferable to perform design so that a region in which the insulator 254 and the insulator 222 are in contact with each other is the dicing line. That is, an opening is provided in the insulator 224 in the vicinity of the region to be the dicing line that is provided in an outer edge of the transistor 400 and the memory cell including a plurality of transistors 200. The insulator 254 and the insulator 244 are provided to cover the side surface of the insulator 224.

That is, in the opening provided in the insulator 224, the insulator 222 is in contact with the insulator 254. For example, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200 and the transistor 400 can be enclosed with the insulator 222 and the insulator 254. Since the insulator 222 and the insulator 254 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 and the transistor 400 can be inhibited.

Furthermore, in the structure, excess oxygen in the insulator 224 can be inhibited from being diffused into the outside of the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in an appropriate combination with the structures described in the other embodiments and the like.

Embodiment 4

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 23 and FIG. 24. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 23A:
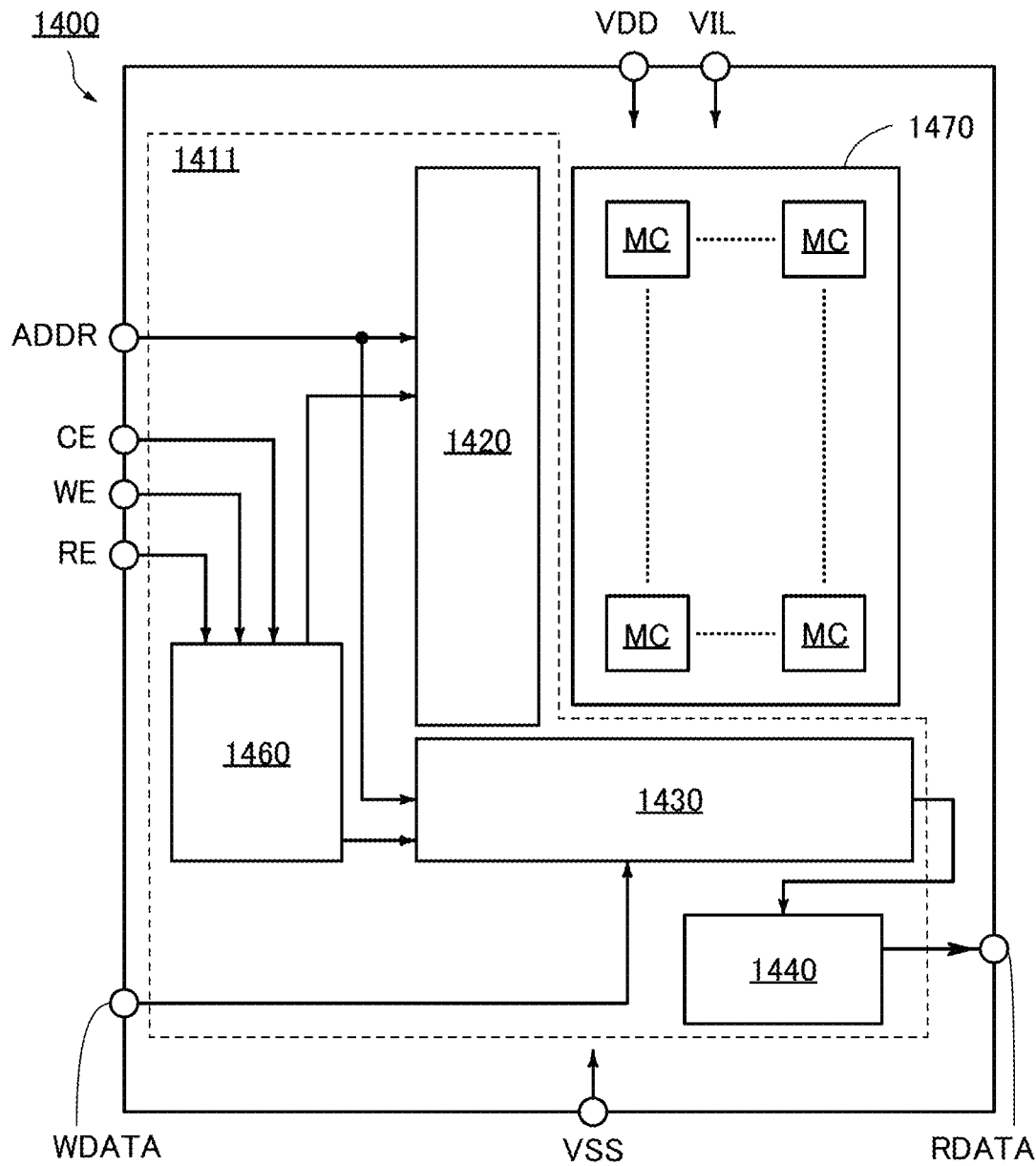
FIGS. 23A and 23B A block diagram illustrating a structure example of a memory device of one embodiment of the present invention.

FIG. 23A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the WDATA is input to the write circuit.

The control logic circuit 1460 processes the signals (CE, WE, and RE) input from the outside, and generates control signals for the row decoder and the column decoder. The CE is a chip enable signal, the WE is a write enable signal, and the RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 23B:
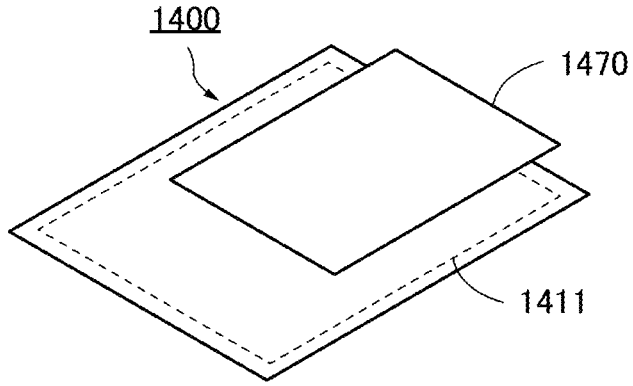

Note that FIG. 23(A) illustrates an example in which the peripheral circuit 1411 and the memory cell array 1470 are formed on the same plane; however, this embodiment is not limited thereto. For example, as illustrated in FIG. 23(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 24 illustrate structure examples of a memory cell applicable to the memory cell MC.

[DOSRAM]

Figure 24A:
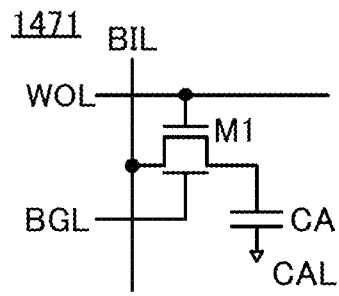
FIGS. 24A to 24H Circuit diagrams each illustrating a structure example of a memory device of one embodiment of the present invention.
Figure 24B:
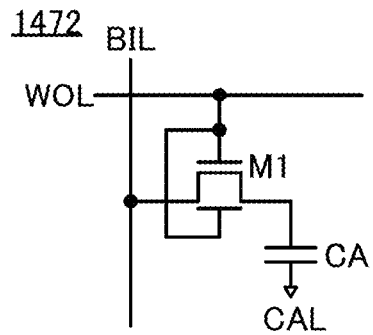
Figure 24C:
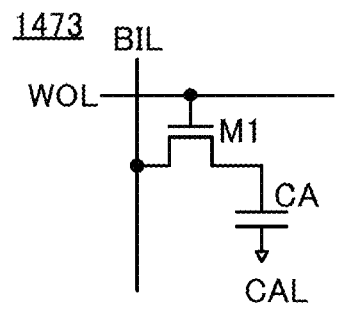
Figure 24D:
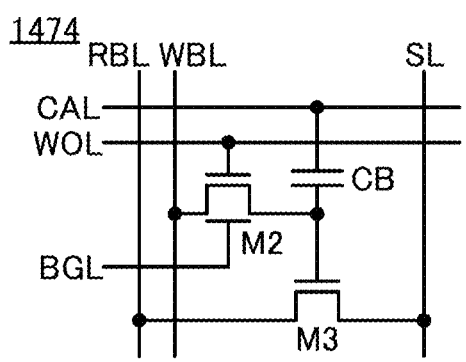
Figure 24E:
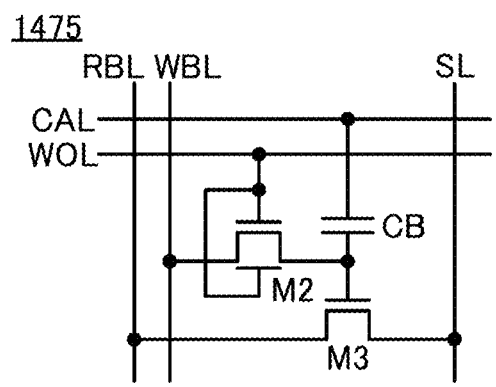
Figure 24F:
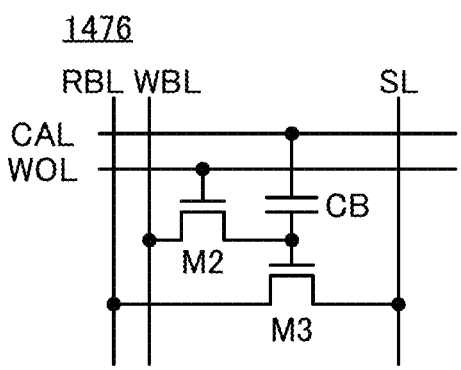
Figure 24G:
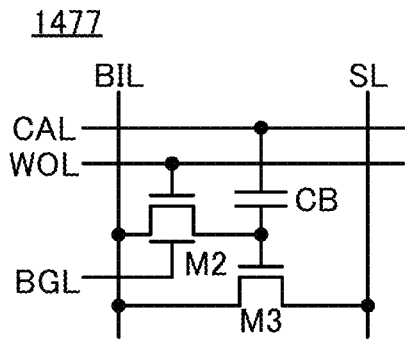

FIGS. 24(A) to 24(C) each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 24(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and the circuit structure can be changed. For example, as in a memory cell 1472 illustrated in FIG. 24(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 24(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 24(D) to 24(H) each illustrate a circuit structure example of a gain-cell memory cell including two transistors and one capacitor. A memory cell 1474 illustrated in FIG. 24(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 24(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 24(F). Alternatively, for example, in the memory cell MC, the wiring WBL and the wiring RBL may be combined into one wiring BIL, as in a memory cell 1477 illustrated in FIG. 24(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 24H:
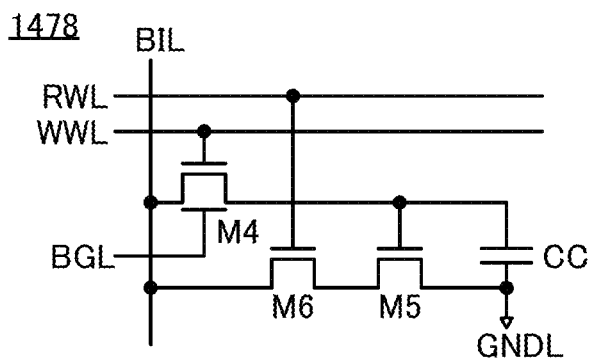

FIG. 24(H) illustrates an example of a gain-cell memory cell including three transistors and one capacitor. A memory cell 1478 illustrated in FIG. 24(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments and the like.

Embodiment 5

In this embodiment, an example of a chip 1200 on which the semiconductor device of the present invention is mounted will be described with reference to FIG. 25. A plurality of circuits (systems) are mounted on the chip 1200. The technique for integrating a plurality of circuits (systems) on one chip as described above is referred to as system on chip (SoC) in some cases.

Figure 25A:
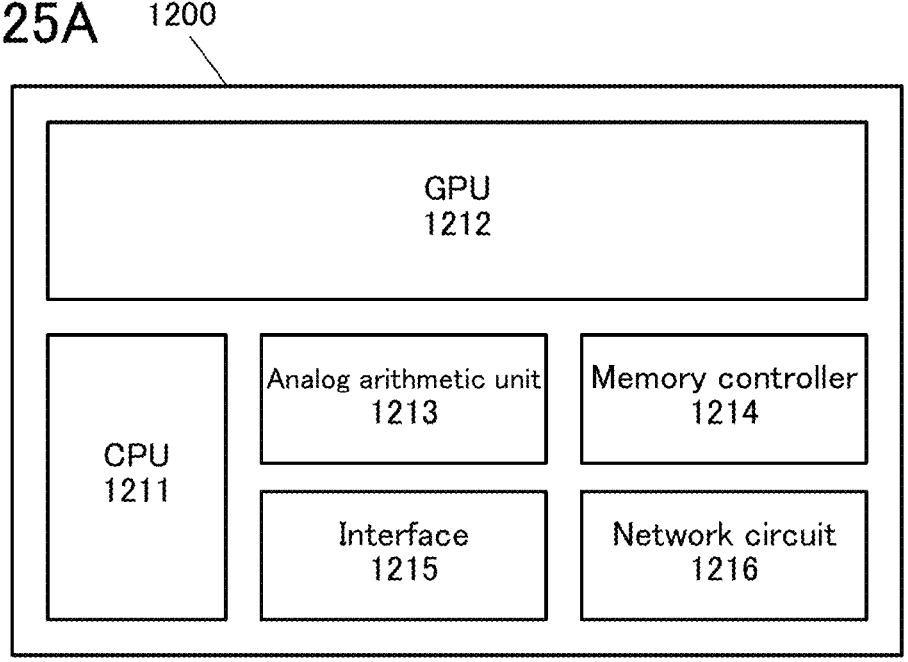
FIGS. 25A and 25B Schematic views of a semiconductor device of one embodiment of the present invention.

As illustrated in FIG. 25(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 25B:
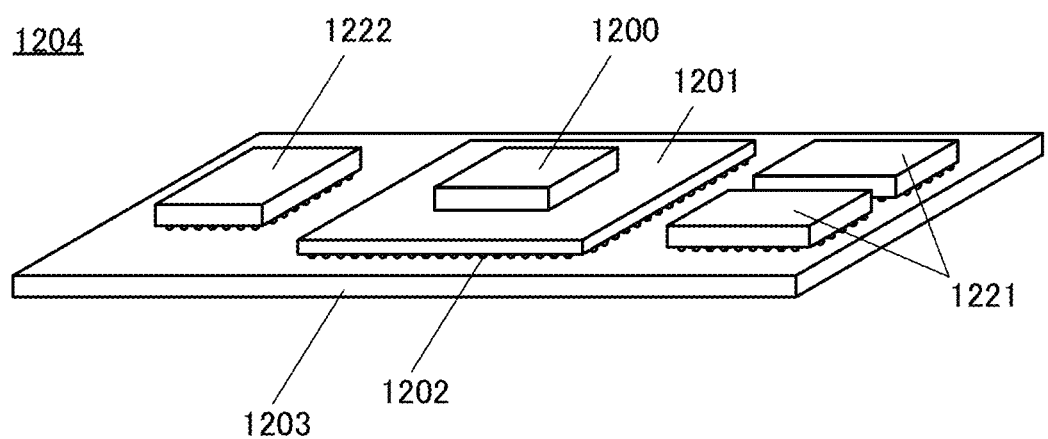

A bump (not illustrated) is provided on the chip 1200, and as illustrated in FIG. 25(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement the arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 26 schematically illustrates some structure examples of removable memory devices. The semiconductor device described in the above embodiment is processed into a packaged memory chip and used in a variety of storage devices and removable memories, for example.

FIG. 26(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104.

The semiconductor device described in the above embodiment can be incorporated in the memory chip 1105 or the like on the substrate 1104.

FIG. 26(B) is a schematic external view of an SD card, and FIG. 26(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 26(D) is a schematic external view of an SSD, and FIG. 26(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

Embodiment 7

<Electronic Device>

The semiconductor device of one embodiment of the present invention can be used for processors such as CPUs and GPUs or chips. FIG. 27 illustrates specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 27 illustrates examples of electronic devices.

[Mobile Phone]

FIG. 27(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

FIG. 27(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are shown as examples of the electronic devices in FIGS. 27(A) and 27(B); alternatively, the electronic device can be an information terminal other than a smartphone and a desktop information terminal. Examples of information terminals other than a smartphone and a desktop information terminal include a PDA (Personal Digital Assistant), a laptop information terminal, and a workstation.

[Household Appliance]

FIG. 27(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 27(D) illustrates a portable game machine 5200 as an example of a game machine. The portable game machine includes a housing 5201, a display portion 5202, a button 5203, and the like.

When the GPU or the chip of one embodiment of the present invention is used in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 27(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 27(E1) illustrates an automobile 5700 as an example of a moving vehicle, and FIG. 27(E2) is a diagram illustrating the periphery of a windshield inside the automobile. FIG. 27(E2) illustrates a display panel 5701, a display panel 5702, and a display panel 5703 that are attached to a dashboard and a display panel 5704 that is attached to a pillar.

The display panel 5701 to the display panel 5703 can provide various kinds of information such as a speedometer, a tachometer, a mileage, a fuel meter, a gearshift indicator, and air-condition setting. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 27(F) schematically shows data transmission in a broadcasting system. Specifically, FIG. 27(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 27(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 27(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in an appropriate combination with any of the structures described in the other embodiments and the like.

Example

In this example, a transistor having a structure similar to that of the transistor 200 illustrated in FIG. 10 (hereinafter referred to as Sample 1) was fabricated as the semiconductor device of one embodiment of the present invention. Observation results of the semiconductor device with a scanning transmission electron microscope (STEM) will be described.

First, a structure of Sample 1 will be described. As illustrated in FIG. 10, Sample 1 includes the insulator 214, the conductor 205, the insulator 216, the insulator 222, the insulator 224, the oxide 230a, the oxide 230b, the oxide 230c, the conductor 242a, the conductor 242b, the insulator 250, the conductor 260a, the conductor 260b, the insulator 254, the insulator 280, and the insulator 274.

As the insulator 214, 40-nm-thick aluminum oxide was used. As the conductor 205, 60-nm-thick tungsten was used. As the insulator 216, 60-nm-thick silicon oxynitride was used. As the insulator 222, 5-nm-thick aluminum oxide deposited by an ALD method was used. As the insulator 224, 35-nm-thick silicon oxynitride was used.

As the oxide 230a, 5-nm-thick In—Ga—Zn oxide deposited by a DC sputtering method was used. In the deposition of the oxide 230a, a target with In:Ga:Zn=1:3:4 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As the oxide 230b, 15-nm-thick In—Ga—Zn oxide deposited by a DC sputtering method was used. In the deposition of the oxide 230b, a target with In:Ga:Zn=4:2:4.1 [atomic ratio] was used; an argon gas at 30 sccm and an oxygen gas at 15 sccm were used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As each of the conductor 242a and the conductor 242b, 25-nm-thick tantalum nitride was used. As the insulator 254, a stacked film of 5-nm-thick aluminum oxide deposited by a sputtering method and 3-nm-thick aluminum oxide deposited thereover by an ALD method was used. As the insulator 280, silicon oxynitride was used.

The oxide 230c is a stacked film. As a lower film of the oxide 230c, 5-nm-thick In—Ga—Zn oxide deposited by a DC sputtering method was used. In the deposition of the lower film of the oxide 230c, a target with In:Ga:Zn=4:2:4.1 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As an upper film of the oxide 230c, 5-nm-thick In—Ga—Zn oxide deposited by a DC sputtering method was used. Note that in the deposition of the upper film of the oxide 230c, a target with In:Ga:Zn=1:3:4 [atomic ratio] was used, and the other deposition conditions were similar to those for the oxide 230a.

As the insulator 250, 10-nm-thick silicon oxynitride was used. As the conductor 260a, 5-nm-thick titanium nitride was used. As the conductor 260b, tungsten was used. As the insulator 274, 40-nm-thick aluminum oxide was used.

Sample 1 having the above structure is a transistor having a channel length of 60 nm and a channel width of 60 nm. Note that Sample 1 includes, in addition to the above components, the conductor 240 and the like in the insulator 280 and includes an insulating film functioning as an interlayer film, a conductive film functioning as a wiring, and the like over the insulator 274.

Figure 28:
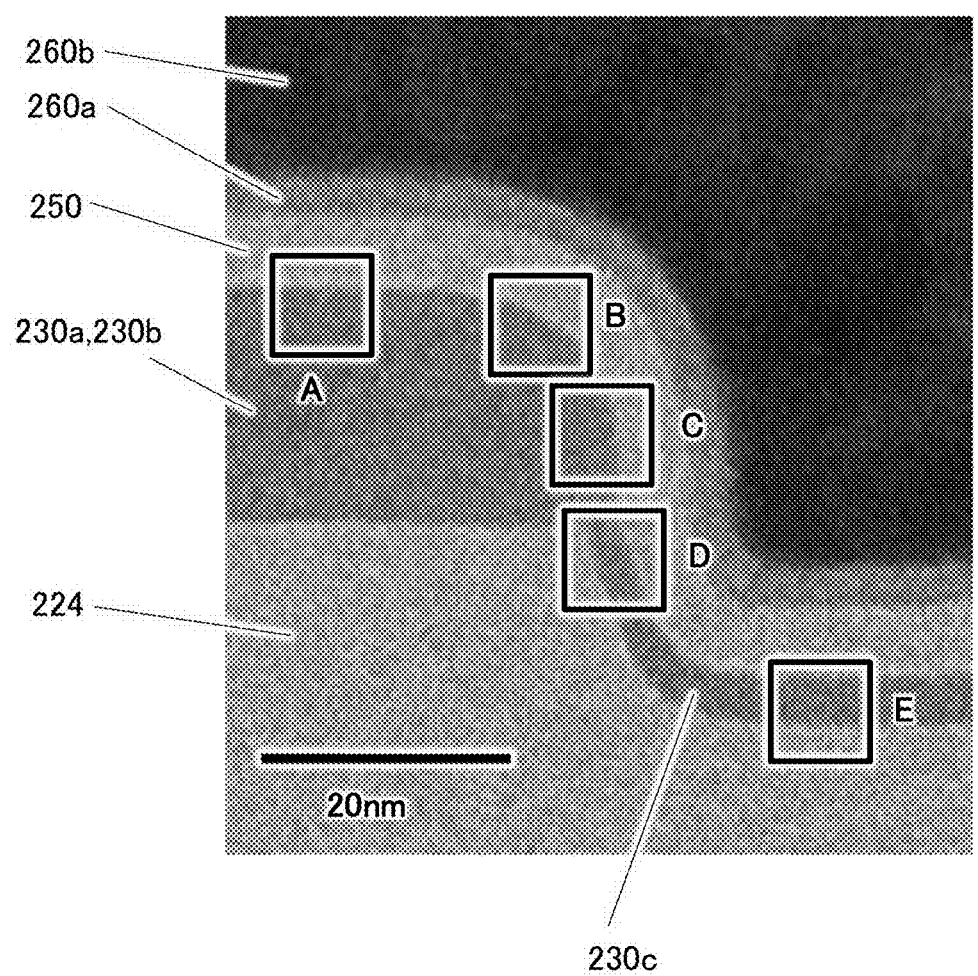
FIG. 28 A cross-sectional TEM image of Example of the present invention.
Figure 29A:
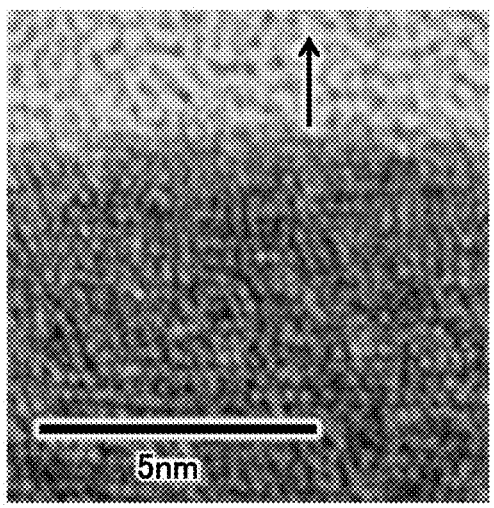
FIGS. 29A to 29E Cross-sectional TEM images of Example of the present invention.
Figure 29B:
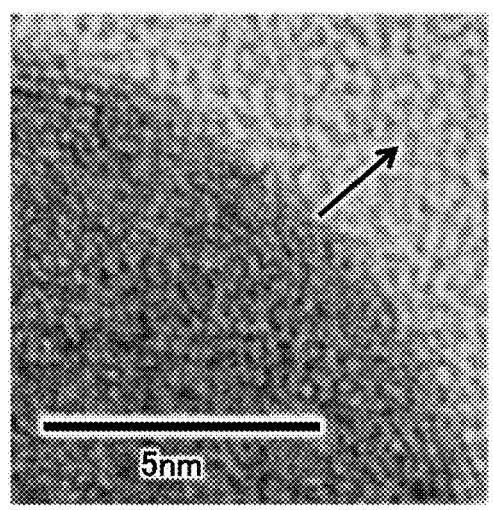
Figure 29C:
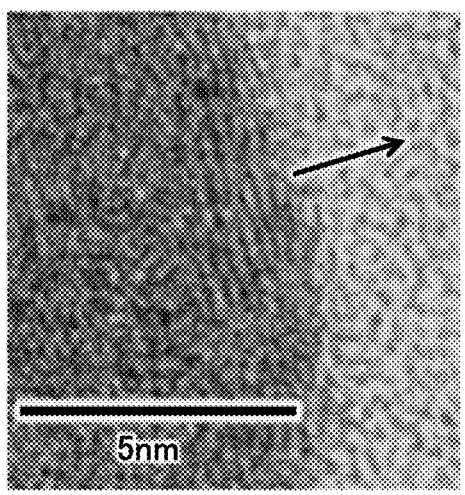
Figure 29D:
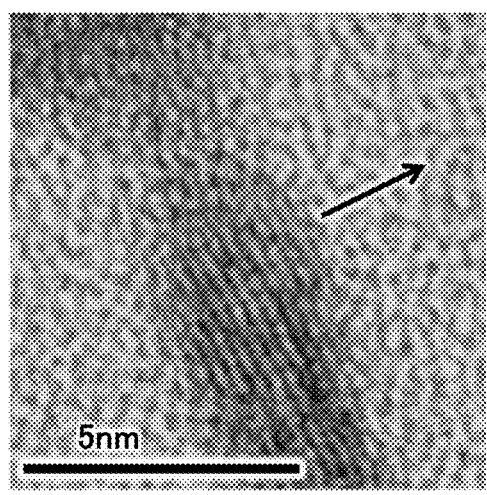
Figure 29E:
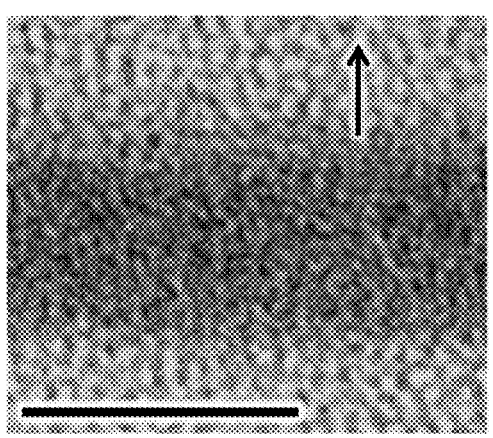

A cross-sectional TEM image of fabricated Sample 1 was taken with "H-9500" manufactured by Hitachi High-Technologies Corporation at an acceleration voltage of 300 kV. FIG. 28 shows results of the cross-sectional TEM image that was taken. FIG. 28 is a cross-sectional TEM image of the channel formation region in the oxide 230 and the vicinity thereof in the channel width direction.

FIG. 29 shows enlarged cross-sectional TEM images of a region A to a region E shown in FIG. 28. Here, the region A includes the oxide 230c in contact with the top surface of the oxide 230b. The region B includes the oxide 230c in contact with the end portion of the top surface of the oxide 230b. The region C includes the oxide 230c in contact with the side surface of the oxide 230b. The region D includes the oxide 230c in contact with the side surface of the insulator 224. The region E includes the oxide 230c in contact with the top surface of the insulator 224.

In the regions shown in FIG. 28 and FIG. 29, the oxide 230c was deposited with an extremely small thickness of approximately 2 nm to 5 nm. However, as shown in FIG. 29(A) to FIG. 29(E), in the oxide 230c in each of the regions, a layered CAAC-OS was formed. Here, arrows illustrated in FIG. 29(A) to FIG. 29(E) indicate a direction substantially perpendicular to the film of the oxide 230c, and the directions of the arrows are substantially the same as the normal direction of layered crystals of the oxide 230c, that is, the c-axis direction of the CAAC-OS. Thus, it is found that the CAAC-OS of the oxide 230c is arranged along unevenness of the formation surface of the oxide 230c.

Figure 30:
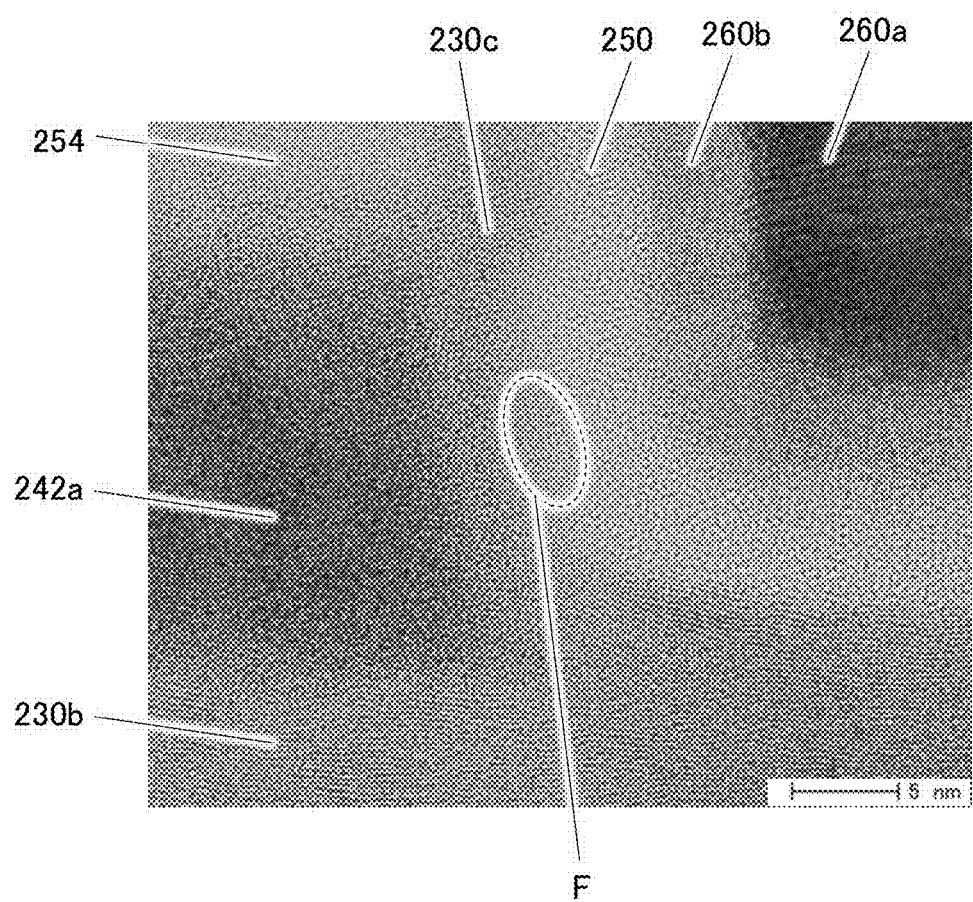
FIG. 30 A cross-sectional TEM image of Example of the present invention.

Moreover, Sample 2 having a structure similar to that of Sample 1 was fabricated, and a cross-sectional TEM image of Sample 2 in the channel length direction was taken. FIG. 30 shows results of the cross-sectional TEM image that was taken. FIG. 30 is a cross-sectional TEM image of the channel formation region in the oxide 230 and the vicinity thereof in the channel length direction, and is an enlarged view corresponding to the vicinity of the interface between the conductor 242a and the oxide 230c illustrated in FIG. 3.

As shown in FIG. 30, a layered CAAC-OS is formed in a region F of the oxide 230c in Sample 2. Furthermore, the layer of the CAAC-OS in the region F is aligned in substantially parallel to the side surface of the conductor 242a. In other words, the c-axis of the CAAC-OS in the region F is aligned substantially perpendicularly to the side surface of the conductor 242a. In a portion of the oxide 230c parallel to the oxide 230b, the layer of the CAAC-OS is substantially parallel to the layer of the CAAC-OS of the oxide 230b.

In addition, Sample 3 including the oxide 12 provided over the substrate; the conductor 14a and the conductor 14b provided over the oxide 12 to be separated from each other; and the oxide 13 provided over the oxide 12 and between the conductor 14a and the conductor 14b was fabricated, as in FIG. 1(B). Note that a silicon wafer provided with 100-nm-thick thermal oxidation film is used as the substrate. Each of the oxide 12 and the oxide 13 is a stacked film of an In—Ga—Zn oxide.

As a lower film of the oxide 12, 5-nm-thick In—Ga—Zn oxide deposited by a DC sputtering method was used. In the deposition of the lower film of the oxide 12, a target with In:Ga:Zn=1:3:4 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As an upper film of the oxide 12, 15-nm-thick In—Ga—Zn oxide deposited by a DC sputtering method was used. In the deposition of the upper film of the oxide 12, a target with In:Ga:Zn=4:2:4.1 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As each of the conductor 14a and the conductor 14b, 25-nm-thick tantalum nitride was used. Over the conductor 14a and the conductor 14b, a stacked film of 5-nm-thick aluminum oxide deposited by a sputtering method and 3-nm-thick aluminum oxide deposited by an ALD method thereover was provided. In addition, a silicon oxynitride film was provided over the stacked film of the aluminum oxide.

As a lower film of the oxide 13, 8-nm-thick In—Ga—Zn oxide deposited by a DC sputtering method was used. Note that in the deposition of the lower film of the oxide 13, a target with In:Ga:Zn=4:2:4.1 [atomic ratio] was used, and the other deposition conditions were similar to those for the upper film of the oxide 12.

As an upper film of the oxide 13, 8-nm-thick In—Ga—Zn oxide deposited by a DC sputtering method was used. Note that in the deposition of the upper film of the oxide 13, a target with In:Ga:Zn=1:3:4 [atomic ratio] was used, and the other deposition conditions were similar to those for the lower film of the oxide 12.

Figure 31A:
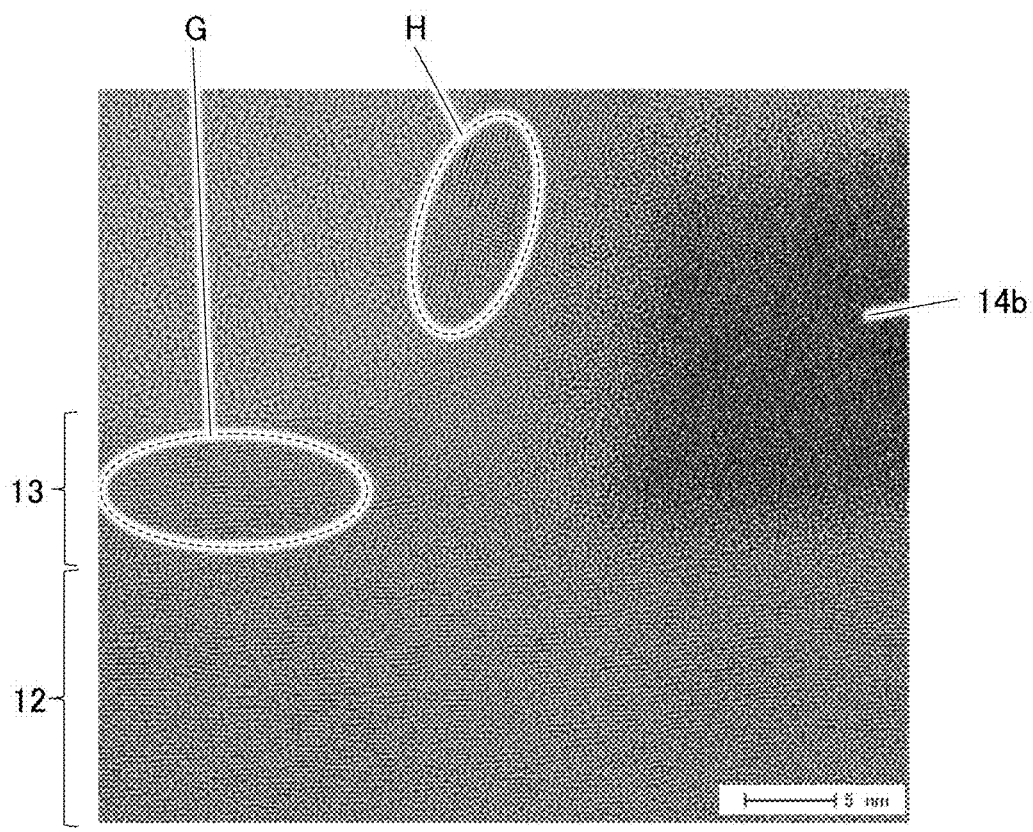
FIGS. 31A and 31B A cross-sectional TEM image and a crystal orientation map of Example of the present invention.

A cross-sectional TEM image of fabricated Sample 3 was taken. FIG. 31(A) shows results of the cross-sectional TEM image that was taken. FIG. 31(A) is a cross-sectional TEM image of the channel formation region in the oxide 12 and the vicinity of thereof in the channel length direction, and is an enlarged view corresponding to the vicinity of the interface between the conductor 14b and the oxide 13 illustrated in FIG. 1.

As shown in FIG. 31(A), a layered CAAC-OS was formed in a region G and a region H of the oxide 13 in Sample 3. In the region G of the oxide 13 parallel to the oxide 12, the layer of the CAAC-OS was aligned substantially parallel to the layer of the CAAC-OS in the oxide 12. In contrast, the layer of the CAAC-OS in the region H was aligned substantially parallel to the side surface of the conductor 14b. In other words, the c-axis of the CAAC-OS in the region H was aligned substantially perpendicularly to the side surface of the conductor 14b. Note that in part of the region H, there was a region where the layer of the CAAC-OS was not substantially parallel to the side surface of the conductor 14b.

Figure 31B:
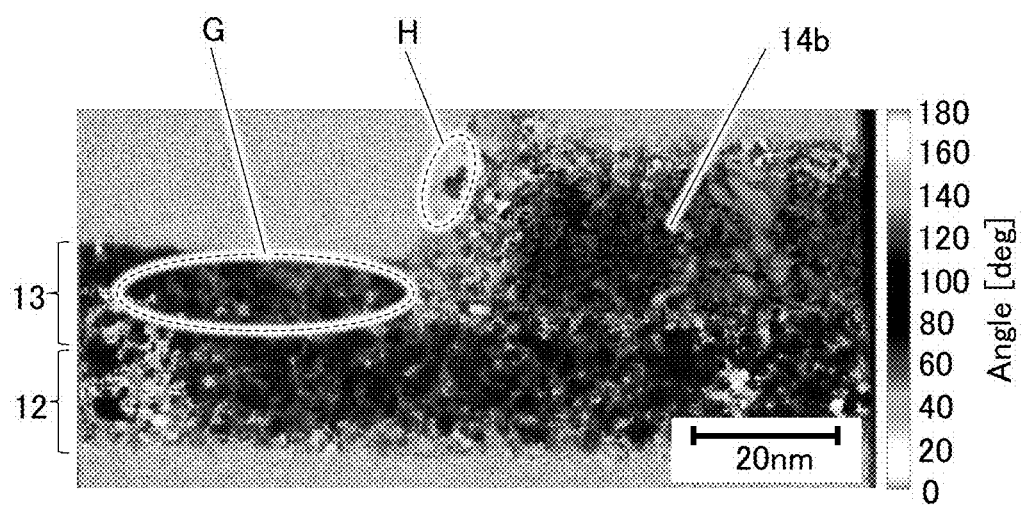

Moreover, FIG. 31(B) shows a crystal orientation map made using the cross-sectional TEM image of Sample 3. The crystal orientation map shown in FIG. 31(B) was made in such a manner that FFT analysis was performed for each FFT window with a diameter of 15 nm, and the degree of crystallinity and the slope of the c-axis in each pixel in the cross-sectional TEM image of Sample 3 were calculated. In the crystalline region in FIG. 31(B), as the color is darker, the slope of the c-axis with respect to the substrate surface is closer to 90°, and as the color is brighter, the slope of the c-axis with respect to the substrate surface is closer to 0° or 180°. In other words, in the crystalline region in FIG. 31(B), as the color is darker, the c-axis becomes more substantially perpendicular with respect to the substrate surface, and as the color is brighter, the c-axis becomes more substantially parallel to the substrate surface.

In FIG. 31(B), the c-axis of the CAAC-OS was aligned substantially perpendicularly to the substrate surface in the region G of the oxide 13 parallel to the oxide 12, as in FIG. 31(A). Similarly, the c-axis of the CAAC-OS in the region H was sloped with respect to the substrate surface by approximately 200 to 400 and was aligned substantially perpendicularly to the side surface of the conductor 14b. Note that in part of the region H, there was a region where the c-axis of the CAAC-OS was not sloped by approximately 200 to 400 with respect to the substrate surface.

At least part of the structure, the method, and the like described in this example can be implemented in appropriate combination with the embodiments described in this specification.

REFERENCE NUMERALS

10a: transistor, 10b: transistor, 10c: transistor, 12: oxide, 12a: layer, 12b: c-axis, 13: oxide, 13a: layer, 13b: c-axis, 14a: conductor, 14b: conductor, 100: capacitor, 110: conductor, 112: conductor, 120: conductor, 130: insulator, 150: insulator, 200: transistor, 205: conductor, 210: insulator, 212: insulator, 214: insulator, 216: insulator, 218: conductor, 222: insulator, 224: insulator, 230: oxide, 230a: oxide, 230A: oxide film, 230b: oxide, 230B: oxide film, 230c: oxide, 230C: oxide film, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 243: conductor, 243a: conductor, 243A: conductor layer, 243b: conductor, 244: insulator, 244A: insulating film, 246: conductor, 250: insulator, 250A: insulating film, 254: insulator, 254A: insulating film, 260: conductor, 260a: conductor, 260Aa: conductive film, 260Ab: conductive film, 260b: conductor, 262: dummy gate, 262A: dummy gate layer, 263: opening, 264: opening, 264a: opening, 264b: opening, 265: dummy film, 274: insulator, 276: insulator, 280: insulator, 281: insulator, 300: transistor, 311: substrate, 313: semiconductor region, 314a: low-resistance region, 314*b*: low-resistance region, 315: insulator, 316: conductor, 320: insulator, 322: insulator, 324: insulator, 326: insulator, 328: conductor, 330: conductor, 350: insulator, 352 insulator, 354: insulator, 356: conductor, 400: transistor, 405: conductor, 405*a*: conductor, 405*b*: conductor, 430*c*: oxide, 431*a*: oxide, 431*b*: oxide, 432*a*: oxide, 432*b*: oxide, 440: conductor, 440*a*: conductor, 440*b*: conductor, 442: conductor, 442*a*: conductor, 442*b*: conductor, 450: insulator, 460: conductor, 460*a*: conductor, 460*b*: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: a refrigerator door, 5803: a freezer door

The invention claimed is:

1. A semiconductor device comprising:
a first gate electrode over a substrate;
a first gate insulating film over the first gate electrode;
a first oxide semiconductor layer over the first gate insulating film;
a second oxide semiconductor layer over and in contact with the first oxide semiconductor layer;
a source electrode and a drain electrode over the first oxide semiconductor layer;
an interlayer insulating film over the source electrode and the drain electrode;
a second gate insulating film in an opening of the interlayer insulating film; and
a second gate electrode over the second gate insulating film and in the opening of the interlayer insulating film,
wherein each of the first oxide semiconductor layer and the second oxide semiconductor layer comprises In, Ga, and Zn,
wherein the first oxide semiconductor layer has crystallinity,
wherein the second oxide semiconductor layer has crystallinity and c-axis alignment,
wherein the second oxide semiconductor layer comprises a first region in contact with a surface of the first oxide semiconductor layer and a second region in contact with a surface of the one of the source electrode and the drain electrode, and
wherein a direction of a c-axis of the first region is different from a direction of a c-axis of the second region.

2. The semiconductor device according to claim 1,
wherein the first region is a region where the c-axis is aligned substantially perpendicularly to the surface of the first oxide semiconductor layer, and
wherein the second region is a region where the c-axis is aligned substantially perpendicularly to the surface of the one of the source electrode and the drain electrode.

3. The semiconductor device according to claim 1,
wherein an atomic ratio of Zn is higher than an atomic ratio of In and an atomic ratio of Ga in the second oxide semiconductor layer, and
wherein the atomic ratio of Ga is higher than the atomic ratio of In in the second oxide semiconductor layer.

4. A semiconductor device comprising:
a first oxide semiconductor layer over a substrate;
a second oxide semiconductor layer over and in contact with the first oxide semiconductor layer;
a source electrode and a drain electrode over the first oxide semiconductor layer;
an interlayer insulating film over the source electrode and the drain electrode;
a first gate insulating film in an opening of the interlayer insulating film; and
a first gate electrode over the first gate insulating film and in the opening of the interlayer insulating film,
wherein each of the first oxide semiconductor layer and the second oxide semiconductor layer comprises In, Ga, and Zn,
wherein the first oxide semiconductor layer has crystallinity,
wherein the second oxide semiconductor layer has crystallinity and c-axis alignment,
wherein the second oxide semiconductor layer comprises a first region in contact with a surface of the first oxide semiconductor layer and a second region in contact with a surface of the one of the source electrode and the drain electrode, and
wherein a direction of a c-axis of the first region is different from a direction of a c-axis of the second region.

5. The semiconductor device according to claim 4,
wherein the first region is a region where the c-axis is aligned substantially perpendicularly to the surface of the first oxide semiconductor layer, and
wherein the second region is a region where the c-axis is aligned substantially perpendicularly to the surface of the one of the source electrode and the drain electrode.

6. The semiconductor device according to claim 4,
wherein an atomic ratio of Zn is higher than an atomic ratio of In and an atomic ratio of Ga in the second oxide semiconductor layer, and
wherein the atomic ratio of Ga is higher than the atomic ratio of In in the second oxide semiconductor layer.

7. A semiconductor device comprising:
a first oxide semiconductor layer over a substrate;
a second oxide semiconductor layer over and in contact with the first oxide semiconductor layer;
a source electrode and a drain electrode over the first oxide semiconductor layer;
an interlayer insulating film over the source electrode and the drain electrode;

a first gate insulating film in an opening of the interlayer insulating film; and
a first gate electrode over the first gate insulating film and in the opening of the interlayer insulating film,
wherein each of the first oxide semiconductor layer and the second oxide semiconductor layer comprises In,
wherein the first oxide semiconductor layer has crystallinity,
wherein the second oxide semiconductor layer has crystallinity and c-axis alignment,
wherein the second oxide semiconductor layer comprises a first region in contact with a surface of the first oxide semiconductor layer and a second region in contact with a surface of the one of the source electrode and the drain electrode, and
wherein a direction of a c-axis of the first region is different from a direction of a c-axis of the second region.

8. The semiconductor device according to claim 7,
wherein the first region is a region where the c-axis is aligned substantially perpendicularly to the surface of the first oxide semiconductor layer, and
wherein the second region is a region where the c-axis is aligned substantially perpendicularly to the surface of the one of the source electrode and the drain electrode.

* * * * *